United States Patent
Westerman et al.

(10) Patent No.: US 8,576,177 B2
(45) Date of Patent: Nov. 5, 2013

(54) TYPING WITH A TOUCH SENSOR

(75) Inventors: Wayne Westerman, Wellington, MO (US); John G. Elias, Townsend, DE (US)

(73) Assignee: Apple Inc., Cupertino, CA (US)

( * ) Notice: Subject to any disclaimer, the term of this patent is extended or adjusted under 35 U.S.C. 154(b) by 499 days.

(21) Appl. No.: 11/830,801

(22) Filed: Jul. 30, 2007

(65) Prior Publication Data

US 2008/0042989 A1 Feb. 21, 2008

Related U.S. Application Data

(60) Continuation of application No. 11/015,434, filed on Dec. 17, 2004, now Pat. No. 7,339,580, which is a continuation of application No. 09/919,266, filed on Jul. 31, 2001, now Pat. No. 6,888,536, which is a division of application No. 09/236,513, filed on Jan. 25, 1999, now Pat. No. 6,323,846.

(60) Provisional application No. 60/072,509, filed on Jan. 26, 1998.

(51) Int. Cl.
    *G06F 3/041* (2006.01)

(52) U.S. Cl.
    USPC ........ 345/173; 345/156; 345/174; 178/18.01; 178/18.03; 178/18.05; 178/18.06

(58) Field of Classification Search
    USPC .................... 345/156–184; 178/18.01–18.07
    See application file for complete search history.

(56) References Cited

U.S. PATENT DOCUMENTS

| | | |
|---|---|---|
| 3,333,160 A | 7/1967 | Gorski |
| 3,541,541 A | 11/1970 | Engelhart |
| 3,662,105 A | 5/1972 | Hurst et al. |
| 3,798,370 A | 3/1974 | Hurst |
| 4,056,754 A | 11/1977 | Bailey et al. |
| 4,219,847 A | 8/1980 | Pinkney et al. |
| 4,220,815 A | 9/1980 | Gibson et al. |
| 4,237,421 A | 12/1980 | Waldron |
| 4,246,452 A | 1/1981 | Chandler |
| 4,266,144 A | 5/1981 | Bristol |
| 4,290,061 A | 9/1981 | Serrano |
| 4,291,303 A | 9/1981 | Cutler et al. |
| 4,340,911 A | 7/1982 | Kato et al. |

(Continued)

FOREIGN PATENT DOCUMENTS

| | | |
|---|---|---|
| AU | 2007286532 A1 | 4/2008 |
| CA | 1243096 | 10/1988 |

(Continued)

OTHER PUBLICATIONS

European Search Report mailed Feb. 17, 2010, for EP Application No. 06016857.2, six pages.

(Continued)

*Primary Examiner* — Lun-Yi Lao
*Assistant Examiner* — Sosina Abebe
(74) *Attorney, Agent, or Firm* — Morrison & Foerster LLP

(57) ABSTRACT

Apparatus and methods are disclosed for simultaneously tracking multiple finger and palm contacts as hands approach, touch, and slide across a proximity-sensing, multi-touch surface. Identification and classification of intuitive hand configurations and motions enables unprecedented integration of typing, resting, pointing, scrolling, 3D manipulation, and handwriting into a versatile, ergonomic computer input device.

20 Claims, 45 Drawing Sheets

(56) References Cited

U.S. PATENT DOCUMENTS

| | | |
|---|---|---|
| 4,526,043 A | 7/1985 | Boie et al. |
| 4,550,221 A | 10/1985 | Mabusth |
| 4,561,002 A | 12/1985 | Chiu |
| 4,598,420 A | 7/1986 | Harvey |
| 4,617,563 A | 10/1986 | Fujiwara et al. |
| 4,618,989 A | 10/1986 | Tsukune et al. |
| 4,658,428 A | 4/1987 | Bedros et al. |
| 4,672,364 A | 6/1987 | Lucas |
| 4,672,558 A | 6/1987 | Beckes et al. |
| 4,686,332 A | 8/1987 | Greanias et al. |
| 4,692,809 A | 9/1987 | Beining et al. |
| 4,695,827 A | 9/1987 | Beining et al. |
| 4,720,607 A | 1/1988 | de Moncuit |
| 4,733,222 A | 3/1988 | Evans |
| 4,734,685 A | 3/1988 | Watanabe |
| 4,736,191 A | 4/1988 | Matzke et al. |
| 4,743,895 A | 5/1988 | Alexander |
| 4,746,770 A | 5/1988 | McAvinney |
| 4,758,830 A | 7/1988 | Levien et al. |
| 4,771,276 A | 9/1988 | Parks |
| 4,775,765 A | 10/1988 | Kimura et al. |
| 4,788,384 A | 11/1988 | Bruere-Dawson et al. |
| 4,798,919 A | 1/1989 | Miessler et al. |
| 4,806,846 A | 2/1989 | Kerber |
| 4,812,833 A * | 3/1989 | Shimauchi .................. 345/175 |
| 4,850,677 A | 7/1989 | Okumura |
| 4,896,363 A | 1/1990 | Taylor et al. |
| 4,898,555 A | 2/1990 | Sampson |
| 4,906,983 A | 3/1990 | Parker |
| 4,914,624 A | 4/1990 | Dunthorn |
| 4,952,932 A | 8/1990 | Sugino et al. |
| 4,962,463 A | 10/1990 | Crossno et al. |
| 4,963,702 A | 10/1990 | Yaniger et al. |
| 4,968,877 A | 11/1990 | McAvinney et al. |
| 4,988,982 A | 1/1991 | Rayner et al. |
| 5,003,519 A | 3/1991 | Noirjean |
| 5,012,524 A | 4/1991 | LeBeau |
| 5,016,008 A | 5/1991 | Gruaz et al. |
| 5,017,030 A | 5/1991 | Crews |
| 5,053,757 A | 10/1991 | Meadows |
| 5,072,384 A | 12/1991 | Doi et al. |
| 5,073,950 A | 12/1991 | Colbert et al. |
| 5,113,041 A | 5/1992 | Blonder et al. |
| 5,150,105 A | 9/1992 | Perbet et al. |
| 5,155,813 A | 10/1992 | Donoghue et al. |
| 5,168,531 A | 12/1992 | Sigel |
| 5,178,477 A | 1/1993 | Gambaro |
| 5,189,403 A | 2/1993 | Franz et al. |
| 5,189,711 A | 2/1993 | Weiss et al. |
| 5,194,862 A | 3/1993 | Edwards |
| 5,214,414 A | 5/1993 | Levine et al. |
| 5,224,861 A | 7/1993 | Glass et al. |
| 5,231,381 A | 7/1993 | Duwaer |
| 5,241,139 A | 8/1993 | Gungl et al. |
| 5,241,308 A | 8/1993 | Young |
| 5,252,951 A | 10/1993 | Tannenbaum et al. |
| 5,270,711 A | 12/1993 | Knapp |
| 5,276,787 A | 1/1994 | Searby |
| 5,281,966 A | 1/1994 | Walsh |
| 5,293,430 A | 3/1994 | Shiau et al. |
| 5,305,017 A | 4/1994 | Gerpheide |
| 5,309,374 A | 5/1994 | Misra et al. |
| 5,311,175 A | 5/1994 | Waldman |
| 5,327,161 A | 7/1994 | Logan et al. |
| 5,335,557 A | 8/1994 | Yasutake |
| 5,341,133 A | 8/1994 | Savoy et al. |
| 5,345,543 A | 9/1994 | Capps et al. |
| 5,347,295 A | 9/1994 | Agulnick et al. |
| 5,369,228 A | 11/1994 | Faust |
| 5,374,787 A | 12/1994 | Miller et al. |
| 5,376,948 A | 12/1994 | Roberts |
| 5,379,057 A | 1/1995 | Clough et al. |
| 5,389,951 A | 2/1995 | Baker |
| 5,398,310 A | 3/1995 | Tchao et al. |
| 5,402,151 A | 3/1995 | Duwaer |
| 5,414,227 A | 5/1995 | Schubert et al. |
| 5,420,607 A | 5/1995 | Miller et al. |
| 5,420,936 A | 5/1995 | Fitzpatrick et al. |
| 5,422,831 A | 6/1995 | Misra et al. |
| 5,436,639 A * | 7/1995 | Arai et al. .................. 345/156 |
| 5,442,742 A | 8/1995 | Greyson et al. |
| 5,459,463 A | 10/1995 | Gruaz et al. |
| 5,463,388 A | 10/1995 | Boie et al. |
| 5,463,696 A | 10/1995 | Beernink et al. |
| 5,469,194 A | 11/1995 | Clark et al. |
| 5,471,578 A | 11/1995 | Moran et al. |
| 5,473,742 A | 12/1995 | Polyakov et al. |
| 5,479,528 A | 12/1995 | Speeter |
| 5,483,261 A * | 1/1996 | Yasutake .................. 345/173 |
| 5,488,204 A | 1/1996 | Mead et al. |
| 5,495,077 A | 2/1996 | Miller et al. |
| 5,505,072 A | 4/1996 | Oreper |
| 5,513,309 A | 4/1996 | Meier et al. |
| 5,515,738 A | 5/1996 | Tamori |
| 5,521,986 A | 5/1996 | Curtin, II et al. |
| 5,523,775 A | 6/1996 | Capps |
| 5,530,455 A | 6/1996 | Gillick et al. |
| 5,537,608 A | 7/1996 | Beatty et al. |
| 5,541,372 A | 7/1996 | Baller et al. |
| 5,543,588 A | 8/1996 | Bisset et al. |
| 5,543,590 A | 8/1996 | Gillespie et al. |
| 5,543,591 A | 8/1996 | Gillespie et al. |
| 5,546,475 A | 8/1996 | Bolle et al. |
| 5,548,667 A | 8/1996 | Tu |
| 5,552,787 A | 9/1996 | Schuler et al. |
| 5,563,632 A | 10/1996 | Roberts |
| 5,563,996 A | 10/1996 | Tchao |
| 5,565,658 A | 10/1996 | Gerpheide et al. |
| 5,572,717 A | 11/1996 | Pedersen |
| 5,579,036 A | 11/1996 | Yates, IV |
| 5,581,276 A | 12/1996 | Cipolla et al. |
| 5,581,484 A | 12/1996 | Prince |
| 5,581,681 A | 12/1996 | Tchao et al. |
| 5,583,946 A | 12/1996 | Gourdol |
| 5,588,098 A | 12/1996 | Chen et al. |
| 5,589,856 A | 12/1996 | Stein et al. |
| 5,590,219 A | 12/1996 | Gourdol |
| 5,592,566 A | 1/1997 | Pagallo et al. |
| 5,594,469 A | 1/1997 | Freeman et al. |
| 5,594,806 A | 1/1997 | Colbert |
| 5,594,810 A | 1/1997 | Gourdol |
| 5,596,694 A | 1/1997 | Capps |
| 5,600,735 A | 2/1997 | Seybold |
| 5,600,781 A | 2/1997 | Root et al. |
| 5,612,719 A | 3/1997 | Beernink et al. |
| 5,625,715 A | 4/1997 | Trew et al. |
| 5,627,567 A | 5/1997 | Davidson |
| 5,631,805 A | 5/1997 | Bonsall |
| 5,631,976 A | 5/1997 | Bolle et al. |
| 5,633,955 A | 5/1997 | Bozinovic et al. |
| 5,634,102 A | 5/1997 | Capps |
| 5,636,101 A | 6/1997 | Bonsall et al. |
| 5,638,093 A | 6/1997 | Takahashi et al. |
| 5,642,108 A | 6/1997 | Gopher et al. |
| 5,644,653 A | 7/1997 | Sunakawa et al. |
| 5,644,657 A | 7/1997 | Capps et al. |
| 5,648,642 A | 7/1997 | Miller et al. |
| 5,649,070 A | 7/1997 | Connell et al. |
| 5,666,113 A | 9/1997 | Logan |
| 5,666,502 A | 9/1997 | Capps |
| 5,666,552 A | 9/1997 | Greyson et al. |
| 5,675,361 A | 10/1997 | Santilli |
| 5,675,362 A | 10/1997 | Clough et al. |
| 5,677,710 A | 10/1997 | Thompson-Rohrlich |
| 5,680,160 A | 10/1997 | LaPointe |
| 5,686,705 A | 11/1997 | Conroy et al. |
| 5,689,253 A | 11/1997 | Hargreaves et al. |
| 5,710,844 A | 1/1998 | Capps et al. |
| 5,717,777 A | 2/1998 | Wong et al. |
| 5,729,249 A | 3/1998 | Yasutake |
| 5,729,250 A | 3/1998 | Bishop et al. |
| 5,730,165 A | 3/1998 | Philipp |
| 5,732,227 A | 3/1998 | Kuzunuki et al. |
| 5,732,230 A | 3/1998 | Cullen et al. |

(56) References Cited

U.S. PATENT DOCUMENTS

| | | |
|---|---|---|
| 5,734,742 A | 3/1998 | Asaeda et al. |
| 5,734,751 A | 3/1998 | Saito |
| 5,736,976 A | 4/1998 | Cheung |
| 5,741,990 A | 4/1998 | Davies |
| 5,745,116 A | 4/1998 | Pisutha-Arnond |
| 5,745,591 A | 4/1998 | Feldman |
| 5,745,716 A | 4/1998 | Tchao et al. |
| 5,746,818 A | 5/1998 | Yatake |
| 5,748,184 A | 5/1998 | Shieh |
| 5,748,269 A | 5/1998 | Harris et al. |
| 5,751,851 A | 5/1998 | Guzik et al. |
| 5,757,478 A | 5/1998 | Ma |
| 5,764,218 A | 6/1998 | Bona et al. |
| 5,764,222 A | 6/1998 | Shieh |
| 5,767,457 A | 6/1998 | Gerpheide et al. |
| 5,767,842 A * | 6/1998 | Korth ............... 345/168 |
| 5,771,342 A | 6/1998 | Todd |
| 5,790,104 A | 8/1998 | Shieh |
| 5,790,107 A | 8/1998 | Kasser et al. |
| 5,796,389 A | 8/1998 | Bertram et al. |
| 5,797,396 A | 8/1998 | Geiser et al. |
| 5,801,681 A | 9/1998 | Sayag |
| 5,802,516 A | 9/1998 | Shwarts et al. |
| 5,805,137 A | 9/1998 | Yasutake |
| 5,805,144 A | 9/1998 | Scholder et al. |
| 5,805,157 A | 9/1998 | Bertram et al. |
| 5,808,567 A | 9/1998 | McCloud |
| 5,808,605 A | 9/1998 | Shieh |
| 5,809,166 A | 9/1998 | Huang et al. |
| 5,809,267 A | 9/1998 | Moran et al. |
| 5,812,118 A | 9/1998 | Shieh |
| 5,812,698 A | 9/1998 | Platt et al. |
| 5,821,597 A | 10/1998 | Nakajima et al. |
| 5,821,690 A | 10/1998 | Martens et al. |
| 5,821,922 A | 10/1998 | Sellers |
| 5,821,930 A | 10/1998 | Hansen |
| 5,823,782 A | 10/1998 | Marcus et al. |
| 5,825,351 A | 10/1998 | Tam |
| 5,825,352 A * | 10/1998 | Bisset et al. ............... 345/173 |
| 5,825,675 A | 10/1998 | Want et al. |
| 5,831,602 A | 11/1998 | Sato et al. |
| 5,835,079 A | 11/1998 | Shieh |
| 5,837,947 A | 11/1998 | Teterwak |
| 5,838,302 A | 11/1998 | Kuriyama et al. |
| 5,852,434 A | 12/1998 | Sekendur |
| 5,852,669 A | 12/1998 | Eleftheriadis et al. |
| 5,854,450 A | 12/1998 | Kent |
| 5,854,625 A | 12/1998 | Frisch et al. |
| 5,856,822 A | 1/1999 | Du et al. |
| 5,856,824 A | 1/1999 | Shieh |
| 5,862,256 A | 1/1999 | Zetts et al. |
| 5,870,083 A | 2/1999 | Shieh |
| 5,870,771 A | 2/1999 | Oberg |
| 5,872,559 A | 2/1999 | Shieh |
| 5,874,948 A | 2/1999 | Shieh |
| 5,877,748 A | 3/1999 | Redlich |
| 5,880,411 A * | 3/1999 | Gillespie et al. ........... 178/18.01 |
| 5,883,619 A | 3/1999 | Ho et al. |
| 5,886,697 A | 3/1999 | Naughton et al. |
| 5,887,080 A | 3/1999 | Tsubusaki et al. |
| 5,896,126 A | 4/1999 | Shieh |
| 5,898,422 A | 4/1999 | Zetts |
| 5,898,434 A | 4/1999 | Small et al. |
| 5,905,476 A | 5/1999 | McLaughlin et al. |
| 5,917,476 A | 6/1999 | Czerniecki |
| 5,920,309 A | 7/1999 | Bisset et al. |
| 5,923,319 A | 7/1999 | Bishop et al. |
| 5,933,134 A | 8/1999 | Shieh |
| 5,936,615 A | 8/1999 | Waters |
| 5,940,065 A | 8/1999 | Babb et al. |
| 5,942,733 A | 8/1999 | Allen et al. |
| 5,943,043 A * | 8/1999 | Furuhata et al. ............. 345/173 |
| 5,943,044 A | 8/1999 | Martinelli et al. |
| 5,945,980 A | 8/1999 | Moissev et al. |
| 5,956,019 A | 9/1999 | Bang et al. |
| 5,956,020 A | 9/1999 | D'Amico et al. |
| 5,956,682 A | 9/1999 | Loudermilk et al. |
| 5,963,190 A | 10/1999 | Tsuboyama et al. |
| 5,973,676 A | 10/1999 | Kawakura |
| 5,982,302 A * | 11/1999 | Ure ............... 341/22 |
| 5,982,352 A | 11/1999 | Pryor |
| 5,987,162 A | 11/1999 | Nakata |
| 5,990,804 A | 11/1999 | Koyama |
| 5,990,893 A | 11/1999 | Numazaki |
| 5,995,081 A | 11/1999 | Kato |
| 5,995,106 A | 11/1999 | Naughton et al. |
| 5,995,663 A | 11/1999 | Itsuzaki et al. |
| 6,002,389 A | 12/1999 | Kasser |
| 6,002,808 A | 12/1999 | Freeman |
| 6,005,959 A | 12/1999 | Mohan et al. |
| 6,005,963 A | 12/1999 | Bolle et al. |
| 6,008,800 A | 12/1999 | Pryor |
| 6,016,355 A | 1/2000 | Dickinson et al. |
| 6,020,881 A | 2/2000 | Naughton et al. |
| 6,023,313 A | 2/2000 | Hazama |
| 6,029,214 A | 2/2000 | Dorfman et al. |
| 6,031,524 A | 2/2000 | Kunert |
| 6,037,882 A | 3/2000 | Levy |
| 6,040,824 A * | 3/2000 | Maekawa et al. ............. 345/173 |
| 6,049,329 A | 4/2000 | Zetts et al. |
| 6,050,825 A | 4/2000 | Nichol et al. |
| 6,052,339 A | 4/2000 | Frenkel et al. |
| 6,061,177 A | 5/2000 | Fujimoto |
| 6,067,079 A | 5/2000 | Shieh |
| 6,072,494 A | 6/2000 | Nguyen |
| 6,075,520 A | 6/2000 | Inoue et al. |
| 6,084,576 A | 7/2000 | Leu et al. |
| 6,088,023 A | 7/2000 | Louis et al. |
| 6,097,371 A | 8/2000 | Siddiqui et al. |
| 6,107,997 A | 8/2000 | Ure |
| 6,124,845 A * | 9/2000 | Toda et al. ............... 345/157 |
| 6,128,003 A | 10/2000 | Smith et al. |
| 6,131,299 A | 10/2000 | Raab et al. |
| 6,135,958 A | 10/2000 | Mikula-Curtis et al. |
| 6,141,463 A | 10/2000 | Covell et al. |
| 6,144,380 A | 11/2000 | Shwarts et al. |
| 6,147,680 A | 11/2000 | Tareev |
| 6,154,209 A | 11/2000 | Naughton et al. |
| 6,160,551 A | 12/2000 | Naughton et al. |
| 6,175,644 B1 | 1/2001 | Scola |
| 6,184,926 B1 | 2/2001 | Khosravi et al. |
| 6,188,391 B1 | 2/2001 | Seely et al. |
| 6,198,515 B1 | 3/2001 | Cole |
| 6,204,839 B1 | 3/2001 | Mato, Jr. |
| 6,208,329 B1 * | 3/2001 | Ballare ............... 345/173 |
| 6,222,465 B1 | 4/2001 | Kumar et al. |
| 6,222,508 B1 | 4/2001 | Alvelda et al. |
| 6,239,389 B1 | 5/2001 | Allen et al. |
| 6,239,790 B1 | 5/2001 | Martinelli et al. |
| 6,243,071 B1 | 6/2001 | Shwarts et al. |
| 6,246,862 B1 | 6/2001 | Grivas et al. |
| 6,249,606 B1 | 6/2001 | Kiraly et al. |
| 6,255,604 B1 | 7/2001 | Tokioka et al. |
| 6,271,860 B1 | 8/2001 | Gross |
| 6,278,443 B1 | 8/2001 | Amro et al. |
| 6,279,170 B1 | 8/2001 | Chu |
| 6,283,858 B1 | 9/2001 | Hayes et al. |
| 6,288,707 B1 | 9/2001 | Philipp |
| 6,289,326 B1 | 9/2001 | LaFleur |
| 6,292,178 B1 | 9/2001 | Bernstein et al. |
| 6,295,052 B1 * | 9/2001 | Kato et al. ............... 345/179 |
| 6,310,610 B1 | 10/2001 | Beaton et al. |
| 6,310,964 B1 | 10/2001 | Mohan et al. |
| 6,323,846 B1 | 11/2001 | Westerman et al. |
| 6,323,849 B1 | 11/2001 | He et al. |
| 6,337,681 B1 | 1/2002 | Martin |
| 6,340,979 B1 | 1/2002 | Beaton et al. |
| 6,344,861 B1 | 2/2002 | Naughton et al. |
| 6,347,290 B1 | 2/2002 | Bartlett |
| 6,377,009 B1 | 4/2002 | Philipp |
| 6,380,929 B1 | 4/2002 | Platt |
| 6,380,931 B1 | 4/2002 | Gillespie et al. |
| 6,392,636 B1 | 5/2002 | Ferrari et al. |
| 6,411,287 B1 | 6/2002 | Scharff et al. |

(56) References Cited

U.S. PATENT DOCUMENTS

| | | |
|---|---|---|
| 6,414,671 B1 | 7/2002 | Gillespie et al. |
| 6,421,234 B1 | 7/2002 | Ricks et al. |
| 6,445,384 B1 | 9/2002 | Atwood et al. |
| 6,452,514 B1 | 9/2002 | Philipp |
| 6,457,355 B1 | 10/2002 | Philipp |
| 6,466,036 B1 | 10/2002 | Philipp |
| 6,515,669 B1 | 2/2003 | Mohri |
| 6,525,749 B1 | 2/2003 | Moran et al. |
| 6,535,200 B2 | 3/2003 | Philipp |
| 6,543,684 B1 | 4/2003 | White et al. |
| 6,543,947 B2 | 4/2003 | Lee |
| 6,567,549 B1 | 5/2003 | Marianetti et al. |
| 6,570,557 B1 | 5/2003 | Westerman et al. |
| 6,593,916 B1 | 7/2003 | Aroyan |
| 6,610,936 B2 | 8/2003 | Gillespie et al. |
| 6,624,833 B1 | 9/2003 | Kumar et al. |
| 6,639,577 B2 | 10/2003 | Eberhard |
| 6,650,319 B1 | 11/2003 | Hurst et al. |
| 6,658,994 B1 | 12/2003 | McMillan |
| 6,670,894 B2 | 12/2003 | Mehring |
| 6,677,932 B1 | 1/2004 | Westerman |
| 6,677,934 B1 | 1/2004 | Blanchard |
| 6,690,387 B2 | 2/2004 | Zimmerman et al. |
| 6,724,366 B2 | 4/2004 | Crawford |
| 6,738,154 B1 | 5/2004 | Venable |
| 6,757,002 B1 | 6/2004 | Oross et al. |
| 6,803,906 B1 | 10/2004 | Morrison et al. |
| 6,842,672 B1 | 1/2005 | Straub et al. |
| 6,856,259 B1 | 2/2005 | Sharp |
| 6,888,536 B2 | 5/2005 | Westerman et al. |
| 6,900,795 B1 | 5/2005 | Knight, III et al. |
| 6,927,761 B2 | 8/2005 | Badaye et al. |
| 6,942,571 B1 | 9/2005 | McAllister et al. |
| 6,965,375 B1 | 11/2005 | Gettemy et al. |
| 6,972,401 B2 | 12/2005 | Akitt et al. |
| 6,977,666 B1 | 12/2005 | Hedrick |
| 6,985,801 B1 | 1/2006 | Straub et al. |
| 6,992,659 B2 | 1/2006 | Gettemy |
| 7,015,894 B2 | 3/2006 | Morohoshi |
| 7,031,228 B2 | 4/2006 | Born et al. |
| 7,038,659 B2 | 5/2006 | Rajkowski |
| 7,084,859 B1 | 8/2006 | Pryor |
| 7,129,416 B1 | 10/2006 | Steinfeld et al. |
| 7,138,983 B2 | 11/2006 | Wakai et al. |
| 7,184,064 B2 | 2/2007 | Zimmerman et al. |
| 7,240,289 B2 | 7/2007 | Naughton et al. |
| RE40,153 E | 3/2008 | Westerman et al. |
| 7,339,580 B2 | 3/2008 | Westerman et al. |
| 7,663,607 B2 | 2/2010 | Hotelling et al. |
| 7,764,274 B2 | 7/2010 | Westerman et al. |
| 7,920,129 B2 | 4/2011 | Hotelling et al. |
| 8,314,775 B2 | 11/2012 | Westerman et al. |
| 8,330,727 B2 | 12/2012 | Westerman et al. |
| 8,334,846 B2 | 12/2012 | Westerman et al. |
| 2001/0030637 A1 | 10/2001 | Geisow et al. |
| 2002/0008711 A1 | 1/2002 | Karjalainen |
| 2002/0036618 A1 | 3/2002 | Wakai et al. |
| 2002/0118848 A1 | 8/2002 | Karpenstein |
| 2002/0140668 A1 | 10/2002 | Crawford |
| 2003/0006974 A1 | 1/2003 | Clough et al. |
| 2003/0067451 A1 | 4/2003 | Tagg et al. |
| 2003/0076301 A1 | 4/2003 | Tsuk et al. |
| 2003/0076303 A1 | 4/2003 | Huppi |
| 2003/0076306 A1 | 4/2003 | Zadesky et al. |
| 2003/0095095 A1 | 5/2003 | Pihlaja |
| 2003/0095096 A1 | 5/2003 | Robbin et al. |
| 2003/0098858 A1 | 5/2003 | Perski et al. |
| 2003/0132950 A1 | 7/2003 | Surucu et al. |
| 2003/0164820 A1 | 9/2003 | Kent |
| 2003/0206202 A1 | 11/2003 | Moriya |
| 2003/0234768 A1 | 12/2003 | Rekimoto et al. |
| 2004/0146688 A1 | 7/2004 | Treat |
| 2004/0263484 A1 | 12/2004 | Mantysalo et al. |
| 2005/0012723 A1 | 1/2005 | Pallakoff |
| 2005/0052425 A1 | 3/2005 | Zadesky et al. |
| 2005/0104867 A1 | 5/2005 | Westerman et al. |
| 2005/0110768 A1 | 5/2005 | Marriott et al. |
| 2006/0022955 A1 | 2/2006 | Kennedy |
| 2006/0022956 A1 | 2/2006 | Lengeling et al. |
| 2006/0026521 A1 | 2/2006 | Hotelling et al. |
| 2006/0026535 A1 | 2/2006 | Hotelling et al. |
| 2006/0026536 A1 | 2/2006 | Hotelling et al. |
| 2006/0032680 A1 | 2/2006 | Elias et al. |
| 2006/0033724 A1 | 2/2006 | Chaudhri et al. |
| 2006/0053387 A1 | 3/2006 | Ording |
| 2006/0066582 A1 | 3/2006 | Lyon et al. |
| 2006/0085757 A1 | 4/2006 | Andre et al. |
| 2006/0097991 A1 | 5/2006 | Hotelling et al. |
| 2006/0197753 A1 | 9/2006 | Hotelling |
| 2006/0232567 A1 | 10/2006 | Westerman et al. |
| 2006/0238517 A1 | 10/2006 | King et al. |
| 2006/0238518 A1 | 10/2006 | Westerman et al. |
| 2006/0238519 A1 | 10/2006 | Westerman et al. |
| 2006/0238520 A1 | 10/2006 | Westerman et al. |
| 2006/0238521 A1 | 10/2006 | Westerman et al. |
| 2006/0238522 A1 | 10/2006 | Westerman et al. |
| 2007/0070050 A1 | 3/2007 | Westerman et al. |
| 2007/0070051 A1 | 3/2007 | Westerman et al. |
| 2007/0070052 A1 | 3/2007 | Westerman et al. |
| 2007/0078919 A1 | 4/2007 | Westerman et al. |
| 2007/0081726 A1 | 4/2007 | Westerman et al. |
| 2007/0139395 A1 | 6/2007 | Westerman et al. |
| 2007/0229464 A1 | 10/2007 | Hotelling et al. |
| 2007/0236466 A1 | 10/2007 | Hotelling |
| 2007/0247429 A1 | 10/2007 | Westerman |
| 2007/0257890 A1 | 11/2007 | Hotelling et al. |
| 2007/0268273 A1 | 11/2007 | Westerman et al. |
| 2007/0268274 A1 | 11/2007 | Westerman et al. |
| 2007/0268275 A1 | 11/2007 | Westerman et al. |
| 2008/0041639 A1 | 2/2008 | Westerman et al. |
| 2008/0042986 A1 | 2/2008 | Westerman et al. |
| 2008/0042987 A1 | 2/2008 | Westerman et al. |
| 2008/0042988 A1 | 2/2008 | Westerman et al. |
| 2008/0128182 A1 | 6/2008 | Westerman et al. |
| 2009/0021489 A1 | 1/2009 | Westerman et al. |
| 2009/0160816 A1 | 6/2009 | Westerman et al. |
| 2009/0244031 A1 | 10/2009 | Westerman et al. |
| 2009/0244032 A1 | 10/2009 | Westerman et al. |
| 2009/0244033 A1 | 10/2009 | Westerman et al. |
| 2009/0249236 A1 | 10/2009 | Westerman et al. |
| 2009/0251435 A1 | 10/2009 | Westerman et al. |
| 2009/0251438 A1 | 10/2009 | Westerman et al. |
| 2009/0251439 A1 | 10/2009 | Westerman et al. |
| 2010/0149092 A1 | 6/2010 | Westerman et al. |
| 2010/0149134 A1 | 6/2010 | Westerman et al. |
| 2012/0293442 A1 | 11/2012 | Westerman et al. |

FOREIGN PATENT DOCUMENTS

| | | |
|---|---|---|
| DE | 19612949 C1 | 8/1997 |
| DE | 10251296 A1 | 5/2004 |
| EP | 0 397 428 A2 | 11/1990 |
| EP | 0 495 595 A2 | 7/1992 |
| EP | 0 546 704 A2 | 6/1993 |
| EP | 0 546 704 A3 | 6/1993 |
| EP | 0288692 | 7/1993 |
| EP | 0 622 722 A2 | 11/1994 |
| EP | 0 622 722 A3 | 11/1994 |
| EP | 0 622 722 B1 | 11/1994 |
| EP | 0664504 | 1/1995 |
| EP | 0464908 | 9/1996 |
| EP | 0 770 971 A2 | 5/1997 |
| EP | 0 770 971 A3 | 5/1997 |
| EP | 0 773 496 A1 | 5/1997 |
| EP | 0 782 090 A2 | 7/1997 |
| EP | 0 782 090 A3 | 7/1997 |
| EP | 0 817 000 A1 | 1/1998 |
| EP | 0 817 000 B1 | 1/1998 |
| EP | 1014295 | 1/2002 |
| GB | 2330670 A | 4/1999 |
| JP | 59-149537 A | 8/1984 |
| JP | 64-009488 A | 1/1989 |
| JP | 01-100622 A | 4/1989 |
| JP | 02-056017 A | 2/1990 |

(56) References Cited

FOREIGN PATENT DOCUMENTS

| JP | 02-304613 A | 12/1990 |
|---|---|---|
| JP | 03-071219 A | 3/1991 |
| JP | 03-269717 A | 12/1991 |
| JP | 04-233619 A | 8/1992 |
| JP | 06-083523 A | 3/1994 |
| JP | 06-161661 A | 6/1994 |
| JP | 06-332620 A | 12/1994 |
| JP | 07-057103 A | 3/1995 |
| JP | 07-110741 A | 4/1995 |
| JP | 07-129312 A | 5/1995 |
| JP | 07-160428 A | 6/1995 |
| JP | 07-182101 A | 7/1995 |
| JP | 7-230352 A | 8/1995 |
| JP | 07-325655 A | 12/1995 |
| JP | 08-137608 A | 5/1996 |
| JP | 08-286830 A | 11/1996 |
| JP | 09-237175 A | 9/1997 |
| JP | 2000-163031 A | 6/2000 |
| JP | 2002-342033 A | 11/2002 |
| WO | WO-92/02000 | 2/1992 |
| WO | WO-94/18664 A1 | 8/1994 |
| WO | WO-96/07981 A1 | 3/1996 |
| WO | WO-96/15464 A1 | 5/1996 |
| WO | WO-97/18547 | 5/1997 |
| WO | WO-97/23738 | 7/1997 |
| WO | WO-97/34273 A1 | 9/1997 |
| WO | WO-97/36225 | 10/1997 |
| WO | WO-97/40744 | 11/1997 |
| WO | WO-98/14863 | 4/1998 |
| WO | WO-99/38149 A1 | 7/1999 |
| WO | WO-03/088176 | 10/2003 |
| WO | WO2006/023569 | 3/2006 |

OTHER PUBLICATIONS

European Search Report mailed Feb. 24, 2010, for EP Application No. 06016833.3, nine pages.
Sun Microsystems. (1992). "The Star7 PDA Prototype," located at <http://www.youtube.com/watch?v=Ahg80BYixL0, last visited Jan. 15, 2010, seven pages.
Tomita, A. Jr. et al. (Nov. 9, 1997). "An Image Processing Method for Use in a GUI for the Visually Impaired," *Proceedings of the IECON '97: 23rd International Conference on Industrial Electronics, Control and Instrumentation*, New Orleans, LA, Nov. 9-14, 1997, pp. 264-268.
Cui, Y. et al. (1996). "Hand Segmentation Using Learning-Based Prediction and Verification for Hand Sign Recognition," *Proceedings of the 1996 IEEE Computer Society Conference on Computer Vision and Pattern Recognition*, pp. 88-93.
Final Office Action mailed Nov. 19, 2009, for U.S. Appl. No. 11/428,515, filed Jul. 3, 2006, 14 pages.
Non-Final Office Action mailed Aug. 25, 2009, for U.S. Appl. No. 11/428,522, filed Jul. 3, 2006, six pages.
Non-Final Office Action mailed Sep. 2, 2009, for U.S. Appl. No. 11/559,736, filed Nov. 14, 2006, 12 pages.
Non-Final Office Action mailed Oct. 5, 2009, for U.S. Appl. No. 11/559,799, filed Nov. 14, 2006, 14 pages.
Non-Final Office Action mailed Oct. 6, 2009, for U.S. Appl. No. 11/559,763, filed Nov. 14, 2006, 24 pages.
Non-Final Office Action mailed Oct. 14, 2009, for U.S. Appl. No. 11/428,501, filed Jul. 3, 2006, six pages.
Non-Final Office Action mailed Oct. 29, 2009, for U.S. Appl. No. 11/559,822, filed Nov. 14, 2006, 11 pages.
Non-Final Office Action mailed Oct. 30, 2009, for U.S. Appl. No. 11/428,503, filed Jul. 3, 2006, nine pages.
Non-Final Office Action mailed Dec. 22, 2009, for U.S. Appl. No. 11/559,833, filed Nov. 14, 2006, six pages.
Non-Final Office Action mailed Dec. 24, 2009, for U.S. Appl. No. 11/677,958, filed Feb. 22, 2007, six pages.
Non-Final Office Action mailed Jan. 27, 2010, for U.S. Appl. No. 11/428,522, filed Jul. 3, 2006, five pages.

Notice of Allowability mailed Sep. 2, 2009, for U.S. Appl. No. 11/428,506, filed Jul. 3, 2006, five pages.
Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.
Final Office Action mailed Mar. 19, 2009, for U.S. Appl. No. 11/428,506, filed Jul. 3, 2006, seven pages.
Non-Final Office Action mailed Mar. 18, 2009, for U.S. Appl. No. 11/428,515, filed Jul. 3, 2006, 12 pages.
Non-Final Office Action mailed Apr. 2, 2009, for U.S. Appl. No. 11/428,501, filed Jul. 3, 2006, 11 pages.
Non-Final Office Action mailed Apr. 2, 2009, for U.S. Appl. No. 11/428,503, filed Jul. 3, 2006, 12 pages.
Notice of Allowability mailed Jul. 10, 2009, for U.S. Appl. No. 11/428,521, filed Jul. 3, 2006, four pages.
Rubine, D. (May 1992). "Combining Gestures and Direct Manipulation," *Chi '92*, pp. 659-660.
U.S. Appl. No. 12/342,027, filed Dec. 22, 2008, by Westerman et al.
U.S. Appl. No. 12/422,197, filed Apr. 10, 2009, by Westerman et al.
U.S. Appl. No. 12/422,205, filed Apr. 10, 2009, by Westerman et al.
U.S. Appl. No. 12/422,212, filed Apr. 10, 2009, by Westerman et al.
U.S. Appl. No. 12/422,222, filed Apr. 10, 2009, by Westerman et al.
U.S. Appl. No. 12/422,225, filed Apr. 10, 2009, by Westerman et al.
U.S. Appl. No. 12/434,439, filed May 1, 2009, by Westerman et al.
U.S. Appl. No. 12/479,573, filed Jun. 5, 2009, by Westerman et al.
U.S. Appl. No. 12/479,617, filed Jun. 5, 2009, by Westerman et al.
U.S. Appl. No. 12/479,678, filed Jun. 5, 2009, by Westerman et al.
Chang, C-C. et al. (Aug. 1, 1993). "A Hashing-Oriented Nearest Neighbor Searching Scheme," *Pattern Recognition Letters*, 14(8):625-630.
Crowley, J.L. (Mar. 1, 1997). "Vision for Man-Machine Interaction," *Robotics and Autonomous Systems*, 19(3-4):347-358.
Davis, J. et al. (May 2, 1994). "Recognizing Hand Gestures," *European Conference on Computer Vision*, Stockholm, SE, 1:331-340.
European Search Report mailed Dec. 12, 2008, for EP Application No. 06016855.6 filed Jan. 25, 1999, six pages.
European Search Report mailed Dec. 23, 2008, for EP Application No. 06016831.7 filed Jan. 25, 1999, seven pages.
European Search Report mailed Jan. 9, 2009, for EP Application No. 06016832.5 filed Jan. 25, 1999, four pages.
Heap, T. et al. (Oct. 14, 1996). "Towards 3D Hand Tracking Using a Deformable Model," *Proceedings of the 2nd International Conference*, Killington, VT, USA, Oct. 14-16, 1996, *Automatic Face and Gesture Recognition, IEEE Comput. Soc.*, pp. 140-145.
International Search Report mailed Dec. 28, 2005, for PCT Application No. PCT/US05/03325, filed Feb. 3, 2005, two pages.
Nirei, K. et al. (Aug. 5, 1996). "Human Hand Tracking from Binocular Image Sequences," *Proceedings of the 1996 IEEE IECON 22nd International Conference*, Taipei, Taiwan, Aug. 5-10, 1996, *Industrial Electronics, Control, and Instrumentation* 1(5):297-302.
Non-Final Office Action mailed Sep. 21, 2007, for U.S. Appl. No. 11/428,515, filed Jul. 3, 2006, seven pages.
Non-Final Office Action mailed Sep. 24, 2007, for U.S. Appl. No. 11/428,506, filed Jul. 3, 2006, six pages.
Non-Final Office Action mailed Sep. 24, 2007, for U.S. Appl. No. 11/428,521, filed Jul. 3, 2006, six pages.
Non-Final Office Action mailed Jan. 28, 2008, for U.S. Appl. No. 11/428,522, filed Jul. 3, 2006, seven pages.
Non-Final Office Action mailed Feb. 4, 2008, for U.S. Appl. No. 11/428,515, filed Jul. 3, 2006, six pages.
Non-Final Office Action mailed Jul. 9, 2008, for U.S. Appl. No. 11/428,521, filed Jul. 3, 2006, 11 pages.
Non-Final Office Action mailed Sep. 2, 2008, for U.S. Appl. No. 11/428,522, filed Jul. 3, 2006, six pages.
Non-Final Office Action mailed Sep. 15, 2008, for U.S. Appl. No. 11/428,506, filed Jul. 3, 2006, eight pages.
Non-Final Office Action mailed Oct. 31, 2008, for U.S. Appl. No. 11/428,515, filed Jul. 3, 2006, seven pages.
Non-Final Office Action mailed Feb. 17, 2009, for U.S. Appl. No. 11/428,522, filed Jul. 3, 2006, six pages.
Notice of Allowability mailed Feb. 11, 2009, for U.S. Appl. No. 11/428,521, filed Jul. 3, 2006, five pages.

(56) References Cited

OTHER PUBLICATIONS

U.S. Appl. No. 11/332,861, filed Jan. 13, 2006 which is a Reissue of 6,677,932.
Westerman, W. (Jan. 1, 1999). "Hand Tracking, Finger Identification, and Chordic Manipulation on a Multi-Touch Surface," Dissertation, University of Delaware, pp. 1-333.
Final Office Action mailed Apr. 14, 2010, for U.S. Appl. No. 11/559,736, filed Nov. 14, 2006, 11 pages.
Final Office Action mailed May 12, 2010, for U.S. Appl. No. 11/428,503, filed Jul. 3, 2006, 12 pages.
Final Office Action mailed Jun. 11, 2010, for U.S. Appl. No. 11/559,833, filed Nov. 14, 2006, eight pages.
Final Office Action mailed Jul. 19, 2010, for U.S. Appl. No. 11/428,522, filed Jul. 3, 2006, six pages.
"Gesture Recognition," (2006). Located at <http://www.fingerworks.com/gesture_recognition.html>, last visited Jul. 25, 2006, two pages.
"iGesture Products for Everyone (learn in minutes) Product Overview," (2005). Located at <http://www.fingerworks.com/>, last visited Aug. 30, 2005, six pages.
Non-Final Office Action mailed May 11, 2010, for U.S. Appl. No. 11/830,788, filed Jul. 30, 2007, eight pages.
Non-Final Office Action mailed Jun. 8, 2010, for U.S. Appl. No. 11/830,808, filed Jul. 30, 2007, 13 pages.
Non-Final Office Action mailed Jun. 9, 2010, for U.S. Appl. No. 11/830,793, filed Jul. 30, 2007, eight pages.
Non-Final Office Action mailed Jun. 22, 2010, for U.S. Appl. No. 11/830,815, filed Jul. 30, 2007, 12 pages.
Notice of Allowance mailed Mar. 23, 2010, for U.S. Appl. No. 11/428,501, filed Jul. 3, 2006, eight pages.
Notice of Allowance mailed Apr. 26, 2010, for U.S. Appl. No. 11/559,822, filed Nov. 14, 2006, nine pages.
Notice of Allowability (Supplemental) mailed May 12, 2010, for U.S. Appl. No. 11/559,822, filed Nov. 14, 2006, two pages.
Notice of Allowance mailed Jun. 21, 2010, for U.S. Appl. No. 11/677,958, filed Feb. 22, 2007, eight pages.
Final Office Action mailed Oct. 19, 2010, for U.S. Appl. No. 11/559,799, filed Nov. 14, 2006, eight pages.
Final Office Action mailed Oct. 29, 2010, for U.S. Appl. No. 11/559,763, filed Nov. 14, 2006, 15 pages.
Final Office Action mailed Nov. 26, 2010, for U.S. Appl. No. 11/830,793, filed Jul. 30, 2007, nine pages.
Final Office Action mailed Dec. 2, 2010, for U.S. Appl. No. 11/830,815, filed Jul. 30, 2007, nine pages.
Final Office Action mailed Dec. 3, 2010, for U.S. Appl. No. 11/830,788, filed Jul. 30, 2007, 15 pages.
Non-Final Office Action mailed Nov. 23, 2010, for U.S. Appl. No. 11/830,808, filed Jul. 30, 2007, 11 pages.
Non-Final Office Action mailed Jan. 20, 2011, for U.S. Appl. No. 11/830,757, filed Jul. 30, 2007, 21 pages.
Non-Final Office Action mailed Feb. 17, 2011, for U.S. Appl. No. 11/830,766, filed Jul. 30, 2007, 20 pages.
Adams, H.G. et al. (Jul. 1985). "Automated Radiographic Report Generation Using Barcode Technology," *American Journal of Roentgenology* 145(1):177-180.
Agrawal, R. et al. (Jul. 1986). "An Overview of Tactile Sensing," Center for Research on Integrated Manufacturing: Robot Systems Division, The University of Michigan, 47 pages.
Anonymous. (1989). "Concorde Version 3.0: Turns a PC into a Graphics Workstation," *News and Views: Tektronix, Inc. Bioinformatics*, 5(1):63-75.
Anonymous. (May 8, 1992). "The Sensor Frame Graphic Manipulator," *NASA Phase II Final Report*, 28 pages.
Bolle, R.M. et al. (1996) "Veggie Vision: A Produce Recognition System," *IEEE*, pp. 244-251.
Brown, E. et al. (1990). "Windows on Tablets As A Means of Achieving Vitrual Input Devices," *Interact '90*, pp. 675-681.
Buxton, W. (1986). "There's More to Interaction Than Meets the Eye: Some Issues in Manual Input," *User Centered System Design, New Perspectives on Human-Computer Interaction*, pp. 319-337.

Buxton, W. et al. (1986). "A Study in Two-Handed Input," *Proceedings of CHI '86*, pp. 321-326.
Buxton, W.A.S. (Mar./Apr. 1994). "Two-Handed Document Navigation," *Xerox Disclosure Journal* 19(2):103-108.
Charlebois, M. et al. (1996). "Curvature Based Shape Estimation Using Tactile Sensing," *Proceedings 1996 IEEE International Conference on Robotics and Automation*, six pages.
Charlebois, M.A. (Dec. 1996). "Exploring the Shape of Objects with Curved Surfaces Using Tactile Sensing," A Thesis Submitted in Partial Fulfillment of the Requirements for the Degree of Master of Applied Science, Simon Fraser University, Burnaby, British Columbia, Canada, 108 pages.
Colosi, J. ed. (Dec. 15, 1984). Computer News, *Hewlett-Packard* 10(4):1-27.
Dario, P. et al. (1986). "A Sensorised Scenario for Basic Investigation on Active Touch," *in International Trends in Manufacturing Technology: Robot Sensors vol. 2-Tactile and Non-Vision*, Pugh, A. ed., IFS Publications: UK, pp. 237-245.
Davies, E.R. (Aug. 1987). "Lateral Histograms for Efficient Object Location: Speed versus Ambiguity," *Pattern Recognition Letters* 6(3):189-198.
Davies, E.R. (1990). *Machine Vision: Theory, Algorithms, Practicalities*, Academic Press,.Inc.: San Diego, CA, pp. xi-xxi (Table of Contents Only.).
Davies, E.R. (1997). "Boundary Pattern Analysis," Chapter 7 *in Machine Vision: Theory.Algorithms Practicalities*, 2nd Edition, Academic Press, Inc.: San Diego, CA, pp. 171-191.
Davies, E.R. (1997). "Ellipse Detection," Chapter 11 *in Machine Vision: Theory Algorithms Practicalities*, 2nd Edition, Academic Press, Inc.: San Diego, CA, pp. 271-290.
Davies, E.R. (1997). "Image Acquisition," Chapter 23 *in Machine Vision: Theory Algorithms Practicalities*, 2nd Edition, Academic Press, Inc.: San Diego, CA, pp. 583-601.
Desai, A. et al. (1994). "On the Localization of Objects Using an FSR Pressure Pad Transducer," *IEEE* pp. 953-957.
Desai, A.M. (Nov. 1994). "Interpretation of Tactile Data From an FSR Pressure Pad Transducer Using Image Processing Techniques," A Thesis Submitted in Partial Fulfillment of the Requirements for the Degree of Master of Applied Science, Simon Fraser University, Burnaby, British Columbia, Canada, 157 pages.
Everett, H.R. (1995). *Sensors for Mobile Robots: Theory and Application*, AK Peters, Ltd.:.Wellesley, MA, pp. v-x (Table of Contents Only.).
Fearing, R.S. (Dec. 1987). "Tactile Sensing, Perception and Shape Interpretation," Thesis (Ph.D.) Stanford University, Department of Electrical Engineering.
Fearing, R.S. (Jun. 1990). "Tactile Sensing Mechanisms," *The International Journal of Robotics Research* 9(3):3-23.
Geman, S. et al. (Nov. 1984). "Stochastic Relaxation, Gibbs Distributions, and The Bayesian Restoration of Images," *IEEE Transactions on Pattern Analysis and Machine Intelligence* 6(6):721-741.
Ghani, N. (Oct. 1988). "Visual and Tactile Senses in Collaboration," *Sensor Review: The International Journal of Sensing for Industry* 8(4):210-215.
Golub, G. et al. (1983). "Measuring Vectors, Matrices, Subspaces, and Linear System Sensitivty," Chapter 2 in *Matrix Computations*, Johns Hopkins University Press: Baltimore, MD, pp. 10-30.
Goodisman, A. (May 10, 1991). "A Stylus-Based User Interface for Text: Entry and Editing," Thesis (B.S./M.S.) MIT Department of Electrical Engineering and Computer Science, pp. 1-100.
Hackwood, S. et al. (1986). "Torque-Sensitive Tactile Array for Robotics," *in International Trends in Manufacturing Technology: Robot Sensors vol. 2- Tactile and Non-Vision*, Pugh, A. ed., IFS Publications: UK, pp. 123-131.
Harmon, L.D. (Summer 1982). "Automated Tactile Sensing," *The International Journal of Robotics Research* 1(2):3-32.
Holland, S. (Jul. 1989). "Artificial Intelligence, Education and Music: The Use of Artificial Intelligence to Encourage and Facilitate Music Composition by Novices," CITE Report No. 88, *Centre for Information Technology in Education*, 309 pages.
Hurst, M.P. (Jul. 1995). "Configurator: A Configuration Program for Satellite Dish Hardware," Thesis (M.S.) MIT Department of Electrical Engineering and Computer Science, pp. 1-74.

(56) References Cited

OTHER PUBLICATIONS

Jayawant, B.V. et al. (1986). "Robot Tactile Sensing: a New Array Sensor," in *International Trends in Manufacturing Technology: Robot Sensors vol. 2- Tactile and Non-Vision*, Pugh, A. ed., IFS Publications: UK, pp. 199-205.

Kahn, R.E. et al. (Mar. 1988). "An Open Architecture for a Digital Library System and a Plan for Its Development," in *The Digital Library Project: The World of Knowbots*, Corporation.For National Research Initiatives, 1:1-48.

Kirk, D.E. (1970). "Numerical Determination of Optimal Trajectories," Chapter 6 in *Optimal.Control Theory: An Introduction*, Prentice Hall, Inc.: Englewood Cliffs, NY. pp. 329-413, with Table of Contents, pp. vii-ix. (90 pages total).

Kjeldsen, F.C.M. (1997). "Visual Interpretation of Hand Gestures as a Practical Interface Modality," Thesis (Ph.D.) Columbia University, Graduate School of Arts, pp. 1-198.

Konrad, J. (Jun. 1989). "Bayesian Estimation of Motion Fields from Image Sequences," Thesis, McGill University, Department of Electrical Engineering, pp. 1-237.

Krueger, M. et al. (Jun. 10, 1988). "Videoplace, Responsive Environment, 1972-1990," located at http://www.youtube.com/watch?v=dmmxVA5xhuo, last visited Aug. 5, 2011, two pages.

Kurtenbach, G.P. (1983). "The Design and Evaluation of Marking Menus," A Thesis Submitted in Conformity with the Requirements of the Degree of Doctor of Philosophy, University of Toronto, Toronto, Canada, 201 pages.

Leonard, J.J. et al. (Jun. 1991). "Mobile Robot Localization by Tracking Geometric Beacons," *IEEE Transaction on Robotics and Automation* 7(3):376-382.

Leung, A. et al. (1994). "Application of Adaptive Neural Network to Localization of Objects Using Pressure Array Transducer," *IEEE* pp. 2114-2119.

Liu, H. et al. (Jun. 1993). "Development of a New Kind of Robot Slipping Sensor," *Proceedings of the 1993 American Control Conference*, Jun. 2-4, 1993, San Francisco, CA, pp. 756-757.

Mehta, N. (Oct. 1982). "A Flexible Human Macine Interface," A Thesis Submitted in Conformity with the Requirements for the Degree of Master of Applied Science in the University of Toronto, 81 pages.

Miller, D. et al. (Feb./Mar. 1994). "Combined Source-Channel Vector Quantization Using Deterministic Annealing," *IEEE Transactions on Communications* 42(2/3/4):347-356.

Moroney, D.T. (Mar. 1992). "Use of an Optical Multichannel Analyzer for Reflectivity Measurements," Submitted in Partial Fulfillment of the Requirements for the Degree of Master of Science in Astronautical Engineering, Naval Postgraduate School, Monterrey, CA, 187 pages.

Mui, L. (Aug. 22, 1995). "A Statistical Multi-Experts Approach to Image Classification and Segmentation," Thesis (B.S./M.Eng.) MIT Department of Electrical Engineering and Computer Science, pp. 1-177 (submitted in two parts).

Nicholls, H.R. et al. (Jun. 1989). "A Survey of Robot Tactile Sensing Technology," *The International Journal of Robotics Research* 8(3):3-30.

Nowlin, W.C. (Apr. 1991). "Experimental Results on Bayesian Algorithms for Interpreting Compliant Tactile Sensing Data," *Proceedings of the 1991 IEEE International Conference on Robotics and Automation*, Sacramento, CA, pp. 378-383.

Ogawa, H. et al. (1979). "Preprocssing for Chinese Character Recognition and Global Clsssification of Handwritten Chinese Characters," *Pattern Recognition* 11:1-7.

Poggio, T. et al. (1990). "The MIT Vision Machine," Chapter 42 in *Artificial Intelligence*, MIT Press: Cambridge, MA, pp. 493-529. (located information in Google).

Pugh, A. ed. (1986). *International Trends in Manufacturing Technology: Robot Sensors. Volume 2-Tactile and Non-Vision*, 3 pages (Table of Contents Only).

Quantum Research Group Ltd.(1997). QT9701B2 Datasheet, 30 pages. (located via Google).

Rebman, J. et al. (1986). "A Tactile Sensor with Electrooptical Transduction," in *International.Trends in Manufacturing Technology: Robot Sensors vol. 2-Tactile and Non-Vision*, Pugh, A. ed., IFS Publications: UK, pp. 145-155.

Robertson, B.E. et al. (1986). "Tactile Sensor System for Robotics," in *International Trends in Manufacturing Technology: Robot Sensors vol. 2-Tactile and Non-Vision*, Pugh, A. ed., IFS Publications: UK, pp. 89-97.

Rubine, D. (Jul. 1991). "Specifying Gestures by Example," *ACM SIGGRAPH Computer Graphics* 25(4):329-337.

Rubine, D. et al. (1988). "The VideoHarp," *Proceedings of the 14th International Computer Music Conference*, Cologne, W. Germany, Sep. 20-25, 1988, pp. 49-55.

Rusaw, S. et al. (May 1998). "Determining Polygon Orientation Using Model Based Force Interpretation," *Proceedings of the 1998 IEEE International Conference on Robotics and Automation*, Leuven, Belgium, pp. 544-549.

Sato, N. et al. (1986). "A Method for Three-Dimensional Part Identification by Tactile Transducer," in *International Trends in Manufacturing Technology: Robot Sensors vol. 2-Tactile and Non-Vision*, Pugh, A. ed., Ifs Publications: UK, pp. 133-143.

Sears, A. et al. (Jan. 23, 1989). "High Precision Touchscreens: Design Strategies and Comparisons With a Mouse," *Human-Computer Interaction Laboratory*, University of MD, pp. 1-23.

Sethi, M. (1997). "Generating Clouds in Computer Graphics," A Thesis Submitted in Partial Fulfillment of the Requirements for the Degree of M.Sc. In Computer Science, 154 pgs.

Siegel, D.M. et al. (1987). "Performance Analysis of a Tactile Sensor," *IEEE*, pp. 1493-1499.

Son, J.S. et al. (1996). "Comparison of Contact Sensor Localization Abilities During Manipulation," *Robotics and Autonomous System* 17 pp. 217-233.

Speeter, T.H. (Nov. 1988). "Flexible, Piezoresitive Touch Sensing Array," Optics Illumination and Imaging Sensing for Machine Vision III, *SPIE* 1005:31-43.

Stansfield, S.A. (Mar. 1990). "Haptic Perception With an Articulated, Sensate Robot Hand," *SANDIA Report*: SAND90-0085-UC-406, 37 pages.

Stap, J.W. (Jun. 29, 1992). "Automatic 3-D Measurement of Workpieces on a Ship Repair Yard," M.Sc. Thesis, 132 pages.

Stauffer, R.N. ed. (Jun. 1983). "Progress in Tactile Sensor Development," *Robotics Today* pp. 43-49.

Sugiyama, S. et al. (Mar. 1990). "Tactile Image Detection Using a 1k-element Silicon Pressure Sensor Array," *Sensors and Actuators* A21-A23(1-3):397-400.

Van Brussel, H. et al. (Jun. 1986). "A High Resolution Tactile Sensor for Part Recognition," *Proceedings of the 6th International Conference on Robot Vision and Sensory Controls*, Paris, France, Jun. 3-5, 1986, pp. 49-59.

Velasco, V.B. Jr. (Aug. 1997). "A Methodology for Computer-Assisted Gripper Customization Using Rapid Prototyping Technology," Thesis Submitted in Partial Fulfillment of the Requirements for the Degree of Ph.D., 199 pages.

Want, R. et al. (Mar. 1995). "The ParcTab Ubiquitous Computing Experiment," Technical Report CSL-95-1, Xerox, 44 pages.

Wolfeld, J.A. (Aug. 1981). "Real Time Control of a Robot Tactile Sensor," Thesis Presented in Partial Fulfillment of the Requirements for the Degree of Master of Science in Engineering for Graduate Work in Computer and Information Science, 68 pages.

Yaniger, S.L. (Apr. 1991). "Force Sensing Resisotrs: A Review of the Technology," *Elector International Conference Record*, Apr. 16-18, 1991, New York, NY pp. 666-668.

Final Office Action mailed Apr. 21, 2011, for U.S. Appl. No. 11/830,808, filed Jul. 30, 2007, 10 pages.

Non-Final Office Action mailed Mar. 18, 2011, for U.S. Appl. No. 11/830,774, filed Jul. 30, 2007, 18 pages.

Non-Final Office Action mailed Mar. 31, 2011, for U.S. Appl. No. 12/479,573, filed Jun. 5, 2009, 17 pages.

Non-Final Office Action mailed Mar. 31, 2011, for U.S. Appl. No. 12/479,617, filed Jun. 5, 2009, 20 pages.

Non-Final Office Action mailed Mar. 31, 2011, for U.S. Appl. No. 12/479,678, filed Jun. 5, 2009, 18 pages.

(56) References Cited

OTHER PUBLICATIONS

Non-Final Office Action mailed Apr. 21, 2011, for U.S. Appl. No. 11/559,763, filed Nov. 14, 2006, seven pages.
Non-Final Office Action mailed Apr. 28, 2011, for U.S. Appl. No. 11/830,781, filed Jul. 30, 2007, 16 pages.
Non-Final Office Action mailed Jun. 28, 2011, for U.S. Appl. No. 12/422,197, filed Apr. 10, 2009, 18 pages.
Non-Final Office Action mailed Jun. 28, 2011, for U.S. Appl. No. 12/422,205, filed Apr. 10, 2009, 13 pages.
Non-Final Office Action mailed Jun. 28, 2011, for U.S. Appl. No. 12/422,212, filed Apr. 10, 2009, 16 pages.
Non-Final Office Action mailed Jun. 29, 2011, for U.S. Appl. No. 12/342,027, filed Dec. 22, 2008, 32 pages.
Non-Final Office Action mailed Jul. 20, 2011, for U.S. Appl. No. 11/830,788, filed Jul. 30, 2007, 12 pages.
Non-Final Office Action mailed Aug. 4, 2011, for U.S. Appl. No. 11/830,793, filed Jul. 30, 2007, 13 pages.
Non-Final Office Action mailed Aug. 5, 2011, for U.S. Appl. No. 12/422,222, filed Apr. 10, 2009, 15 pages.
Non-Final Office Action mailed Aug. 5, 2011, for U.S. Appl. No. 12/422,225, filed Apr. 10, 2009, 17 pages.
Notice of Allowance mailed Aug. 16, 2011, for U.S. Appl. No. 11/559,763, filed Nov. 14, 2006, nine pages.
Final Office Action mailed Sep. 27, 2011, for U.S. Appl. No. 11/830,774, filed Jul. 30, 2007, 15 pages.
Final Office Action mailed Sep. 28, 2011, for U.S. Appl. No. 12/479,678, filed Jun. 5, 2009, 13 pages.
Non-Final Office Action mailed Sep. 1, 2011, for U.S. Appl. No. 11/830,766, filed Jul. 30, 2007, 29 pages.
Non-Final Office Action mailed Sep. 16, 2011, for U.S. Appl. No. 11/830,757, filed Jul. 30, 2007, 26 pages.
European Search Report mailed Nov. 15, 2011, for EP Patent Application No. 10010057.7, filed Jan. 25, 1999, six pages.
European Search Report mailed Nov. 15, 2011, for EP Patent Application No. 10010058.5, filed Jan. 25, 1999, six pages.
European Search Report mailed Dec. 5, 2011, for EP Patent Application No. 10010056.9, filed Jan. 25, 1999, eight pages.
Final Office Action mailed Feb. 3, 2012, for U.S. Appl. No. 12/422,205, filed Apr. 10, 2009, 16 pages.
Non-Final Office Action mailed Jan. 19, 2012, for U.S. Appl. No. 11/830,808, filed Jul. 30, 2007, eight pages.
Non-Final Office Action mailed Jan. 30, 2012, for U.S. Appl. No. 11/428,503, filed Jul. 3, 2006, 15 pages.
Final Office Action mailed Jul. 6, 2012, for U.S. Appl. No. 11/830,815, filed Jul. 30, 2007, 15 pages.
Non-Final Office Action mailed Jun. 22, 2012, for U.S. Appl. No. 11/830,774, filed Jul. 30, 2007, 17 pages.
Non-Final Office Action mailed Jun. 25, 2012, for U.S. Appl. No. 11/830,781, filed Jul. 30, 2007, 19 pages.
Non-Final Office Action mailed Jun. 25, 2012, for U.S. Appl. No. 12/479,573, filed Jun. 5, 2009, 11 pages.
Notice of Allowance mailed Jun. 27, 2012, for U.S. Appl. No. 11/559,736, filed Nov. 14, 2006, 11 pages.
Davies, E.R. (1997). Machine Vision: Theory, Algorithms, Practicalities, Second Edition, Academic Press, Inc.: San Diego, Ca, pp. vii - xx (Table of Contents Only).
Helander, M. ed. (1988). Handbook of Human-Computer Interaction, pp. i-xxxiii. (Table of Contents Only.).
Ho, C-T., et al. (1995). "A Fast Ellipse/Circle Detector Using Geometric Symmetry," Pattern Recognition 28(1):117-124.
Krein, P. et al. (May/Jun. 1990). "The Electroquasistatics of the Capacitive Touch Panel," IEEE Transactions on Industry Applications 26(3):529-534.
Moghaddam, B. et al. (Jul. 1997). "Probabilistic Visual Learning for Object Representation," IEEE Transactions on Pattern Analysis and Machine Intelligence 19(7):696-710.
Potter, R.L. (1993). "Improving the Accuracy of Touchscreens: An Experimental Evaluation of Three Strategies," Chapter 4.1 in Sparks of Innovation in Human-Computer Interaction, Shneiderman, B., Ed., Ablex Publications: Norwood, N.J., pp. 157-167.

Simigian, S. et al. (1989). "Image: Modified for Use on a Microcomputer-Based System," Computers & Geosciences 15(3):237-254.
Final Office Action mailed May 24, 2012, for U.S. Appl. No. 11/830,757, filed Jul. 30, 2007, 19 pages.
Final Office Action mailed Jun. 8, 2012, for U.S. Appl. No. 12/422,225, filed Apr. 10, 2009, 12 pages.
Non-Final Office Action mailed May 23, 2012, for U.S. Appl. No. 11/428,515, filed Jul. 3, 2006, 15 pages.
Non-Final Office Action mailed Jun. 7, 2012, for U.S. Appl. No. 11/830,766, filed Jul. 30,,2007, 14 pages.
Final Office Action mailed Oct. 19, 2011, for U.S. Appl. No. 12/479,573, filed Jun. 5, 2009, 13 pages.
Final Office Action mailed Nov. 17, 2011, for U.S. Appl. No. 11/830,781, filed Jul. 30, 2007, 16 pages.
Final Office Action mailed Nov. 17, 2011, for U.S. Appl. No. 12/479,617, filed Jun. 5, 2009, 18 pages.
Final Office Action mailed Dec. 16, 2011, 2011, for U.S. Appl. No. 12/422,212, filed Apr. 10, 2009, 20 pages.
Final Office Action mailed Mar. 1, 2012, for U.S. Appl. No. 11/830,793, filed Jul. 30, 2007, 14 pages.
Final Office Action mailed Apr. 16, 2012, for U.S. Appl. No. 12/422,222, filed Apr. 10, 2009, 14 pages.
Final Office Action mailed Apr. 25, 2012, for U.S. Appl. No. 12/422,197, filed Apr. 10, 2009, 12 pages.
Final Office Action mailed Apr. 27, 2012, for U.S. Appl. No. 11/830,788, filed Jul. 30, 2007, 13 pages.
Final Office Action mailed May 1, 2012, for U.S. Appl. No. 12/434,439, filed May 1, 2009, 14 pages.
Final Office Action mailed May 8, 2012, for U.S. Appl. No. 12/139,411, filed Jun. 13, 2008, seven pages.
Non-Final Office Action mailed Oct. 14, 2011, for U.S. Appl. No. 12/434,439, filed May 1, 2009, nine pages.
Non-Final Office Action mailed Oct. 27, 2011, for U.S. Appl. No. 12/139,411, filed Jun. 13, 2008, six pages.
Non-Final Office Action mailed Nov. 10, 2011, for U.S. Appl. No.11/830,815, filed Jul. 30, 2007, 15 pages.
Non-Final Office Action mailed Nov. 23, 2011, for U.S. Appl. No.11/428,515, filed Jul. 3, 2006, eight pages.
Non-Final Office Action mailed Apr. 5, 2012, for U.S. Appl. No. 12/479,678, filed Jun. 5, 2009, 13 pages.
Non-Final Office Action mailed Apr. 16, 2012, 2011, for U.S. Appl. No. 12/422,212, filed Apr. 10, 2009, 20 pages.
Notice of Allowance mailed Oct. 26, 2011, for U.S. Appl. No. 11/559,763, filed Nov. 14, 2006, nine pages.
Notice of Allowance mailed Apr. 13, 2012, for U.S. Appl. No. 12/342,027, filed Dec. 22, 2008, 10 pages.
U.S. Appl. No. 10/654,108, filed Sep. 2, 2003 entitled "Ambidextrous Mouse".
U.S. Appl. No. 10/789,676, filed Feb. 27, 2004 entitled "Shape Detecting Input Device".
"4-Wire Resistive Touchscreens" obtained from http://www.touchscreens.com/intro-touchtypes-4resistive.html generated Aug. 5, 2005.
"5-Wire Resistive Touchscreens" obtained from http://www.touchscreens.com/intro-touchtypes-resistive.html generated Aug. 5, 2005.
"A Brief Overview of Gesture Recognition" obtained from http://www.dai.ed.ac.uk/Cvonline/LOCA__COPIES/COHEN/gesture__overview.html, generated Apr. 20, 2004.
"Capacitive Touchscreens" obtained from http://www.touchscreens.com/intro-touchtypes-capacitive.html generated Aug. 5, 2005.
"Capacitive Position Sensing" obtained from http://www.synaptics.comitechnology/cps.cfm generated Aug. 5, 2005.
"Comparing Touch Technologies" obtained from http://www.touchscreens.com/intro-touchtypes.html generated Oct. 10, 2004.
"Gesture Recognition" http://www.fingerworks.com/gesture_recognition.html.
"GlidePoint®" obtained from http://www.cirque.com/technology/technology_gp.html generated Aug. 5, 2005.
"How do touchscreen monitors know where you're touching?" obtained from http://www.electronics.howstuffworks.com/question716.html generated Aug. 5, 2005.

(56) References Cited

OTHER PUBLICATIONS

"How does a touchscreen work?" obtained from http://www.touchscreens.com/intro-anatomy.html generated Aug. 5, 2005.
"iGesture Products for Everyone (learn in minutes) Product Overview" FingerWorks.com.
"Infrared Touchscreens" obtained from http://www.touchscreens.com/intro-touchtypes-infrared.html generated Aug. 5, 2005.
"Mouse Emulation" FingerWorks obtained from http://www.fingerworks.com/gesture_guide_mouse.html generated Aug. 30, 2005.
"Mouse Gestures in Opera" obtained from http://www.opera.com/products/desktop/mouse/index.dml generated Aug. 30, 2005.
"Mouse Gestures," Optim oz, May 21, 2004.
"MultiTouch Overview" FingerWorks obtained from http://www.fingerworks.com/multoverview.html generated Aug. 30, 2005.
"Near Field Imaging Touchscreens" obtained from http://www.touchscreens.com/intro-touchtypes-nfi.htm/generated Aug. 5, 2005.
"PenTouch Capacitive Touchscreens" obtained from http://www.touchscreens.com/intro-touchtypes-pentouch.html generated Aug. 5, 2005.
"Surface Acoustic Wave Touchscreens" obtained from http://www.touchscreens.com/intro-touchtypes-saw.html generated Aug. 5, 2005.
"Symbol Commander" obtained from http://www.sensiva.com/symbolcomander/, generated Aug. 30, 2005.
"Tips for Typing" FingerWorks http://www.fingerworks.com/mini_typing.html generated Aug. 30, 2005.
"Touch Technologies Overview" 2001, 3M Touch Systems, Massachusetts.
"Wacom Components—Technology" obtained from http://www.wacom-components.com/english/tech.asp generated on Oct. 10, 2004.
"Watershed Algorithm" http://rsb.info.nih.gov/ij/plugins/watershed.html generated Aug. 5, 2005.
"FingerWorks—Gesture Guide—Application Switching," obtained from http://www.fingerworks.com/gesture_guide_apps.html, generated on Aug. 27, 2004, 1-pg.
"FingerWorks—Gesture Guide—Editing," obtained from http://www.fingerworks.com/gesure_guide_editing.html, generated on Aug. 27, 2004, 1-pg.
"FingerWorks—Gesture Guide—File Operations," obtained from http://www.fingerworks.com/gesture_guide_files.html, generated on Aug. 27, 2004, 1-pg.
"FingerWorks—Gesture Guide—Text Manipulation," obtained from http://www.fingerworks.com/gesture_guide_text_manip.html, generated on Aug. 27, 2004, 2-pg.
"FingerWorks—Gesture Guide—Tips and Tricks," obtained from http://www.fingerworks.com/gesture_guide_tips.html, generated Aug. 27, 2004, 2-pgs.
"FingerWorks—Gesture Guide—Web," obtained from http://www.fingerworks.corn/gesture_guide_web.html, generated on Aug. 27, 2004, 1-pg.
"FingerWorks—Guide to Hand Gestures for USB Touchpads," obtained from http://www.fingerworks.com/igesture_userguide.html, generated Aug. 27, 2004, 1-pg.
"FingerWorks—iGesture—Technical Details," obtained from http://www.fingerworks.com/igesture_tech.html, generated Aug. 27, 2004, 1-pg.
"FingerWorks—The Only Touchpads with Ergonomic Full-Hand Resting and Relaxation!" obtained from http://www.fingerworks.com/resting.html, Copyright 2001, 1-pg.
"FingerWorks—Tips for Typing on the Mini," obtained from http://www.fingerworks.com/mini_typing.html, generated on Aug. 27, 2004, 2-pgs.
"iGesture Pad—the MultiFinger USB TouchPad with Whole-Hand Gestures," obtained from http://www.fingerworks.com/igesture.html, generated Aug. 27, 2004, 2-pgs.
Bier, et al., "Toolglass and Magic Lenses: The see-through interface" In James Kijiya, editor, Computer Graphics (SIGGRAPH '93 Proceedings), vol. 27, pp. 73-80, Aug. 1993.
Buxton, W. et al. (Jul. 22, 1985). "Issues and Techniques in Touch-Sensitive Tablet Input," *Proceedings ACM Siggraph*, pp. 215-224.
Cutler, L.D. et al. (Apr. 27, 1997). "Two-Handed Direct Manipulation on the Responsive Workbench," *Proceedings of the 1997 Symposium on Interactive 3D Graphics*, Providence, RI, Apr. 27-30, 1997, pp. 107-114.
Davis, J. et al. (Oct. 31, 1994). "Determining 3-D Hand Motion," *Signals, Systems and Computers, 1994 Conference Record of the 28th Asilomar Conference on Pacific Grove, CA*, Oct. 31-Nov. 2, 1994, Los Alamitos, CA, pp. 1262-1266.
Douglas et al., The Ergonomics of Computer Pointing Devices (1997).
European Search Report received in EP 1 621 989 (@ *Beyer Weaver & Thomas, LLP*) dated Mar. 27, 2006.
EVB Elektronik "TSOP6238 IR Receiver Modules for Infrared Remote Control Systems" dated Jan. 2004 1-pg.
Fisher et al., "Repetitive Motion Disorders: The Design of Optimal Rate-Rest Profiles," Human Factors, 35(2):283-304 (Jun. 1993).
Fukumoto, et al., "ActiveClick: Tactile Feedback for Touch Panels," In CHI 2001 Summary, pp. 121-122, 2001.
Fukumoto and Yoshinobu Tonomura, "Body Coupled Fingering: Wireless Wearable Keyboard," *CHI 97*, pp. 147-154 (Mar. 1997).
Hardy, "Fingerworks" Mar. 7, 2002; BBC World on Line.
Hillier and Gerald J. Lieberman, *Introduction to Operations Research* (1986).
Jacob et al., "Integrality and Separability of Input Devices," *ACM Transactions on Computer-Human Interaction*, 1:3-26 (Mar. 1994).
Kinkley et al., "Touch-Sensing Input Devices," in CHI '99 Proceedings, pp. 223-230, 1999.
Kionx "KXP84 Series Summary Data Sheet" copyright 2005,dated Oct. 21, 2005, 4-pgs.
Lee et al., "A Multi-Touch Three Dimensional Touch-Sensitive Tablet," in CHI '85 Proceedings, pp. 121-128, 2000.
Lee, "A Fast Multiple-Touch-Sensitive Input Device," Master's Thesis, University of Toronto (1984).
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Matsushita et al., "HoloWall: Designing a Finger, Hand, Body and Object Sensitive Wall," In Proceedings of UIST '97, Oct. 1997.
Pavlovic, V.I. et al. (Jul. 1997). "Visual Interpretation of Hand Gestures for Human-Computer Interaction: A Review," *IEEE Transactions on Pattern Analysis and Machine Intelligence* 19(7):677-695.
Quantum Research Group "QT510 / QWheel™ Touch Slider IC" copyright 2004-2005, 14-pgs.
Quek, "Unencumbered Gestural Interaction," *IEEE Multimedia*, 3:36-47 (Winter 1996).
Radwin, "Activation Force and Travel Effects on Overexertion in Repetitive Key Tapping," *Human Factors*, 39(1):130-140 (Mar. 1997).
Rekimoto "SmartSkin: An Infrastructure for Freehand Manipulation on Interactive Surfaces" CHI 2002, Apr. 20-25, 2002.
Rekimoto et al., "ToolStone: Effective Use of the Physical Manipulation Vocabularies of Input Devices," In Proc. Of UIST 2000, 2000.
Rubine et al., "Programmable Finger-Tracking Instrument Controllers," *Computer Music Journal*, vol. 14, No. 1 (Spring 1990).
Rutledge et al., "Force-To-Motion Functions for Pointing," Human-Computer Interaction-Interact (1990).
Subatai Ahmad, "A Usable Real-Time 3D Hand Tracker," Proceedings of the 28th Asilomar Conference on Signals, Systems and Computers—Part 2 (of2), vol. 2 (Oct. 1994).
Texas Instruments "TSC2003 / I2C Touch Screen Controller" Data Sheet SBAS 162, dated Oct. 2001, 20-pgs.
Wellner, "The Digital Desk Calculators: Tangible Manipulation on a Desk Top Display" In ACM UIST '91 Proceedings, pp. 27-34, Nov. 1991.
Williams, "Applications for a Switched-Capacitor Instrumentation Building Block" Linear Technology Application Note 3, Jul. 1985, pp. 1-16.
Yamada et al., "A Switched-Capacitor Interface for Capacitive Pressure Sensors" IEEE Transactions on Instrumentation and Measurement, vol. 41, No. 1, Feb. 1992, pp. 81-86.

(56) References Cited

OTHER PUBLICATIONS

Yeh et al., "Switched Capacitor Interface Circuit for Capacitive Transducers" 1985 IEEE.
Zhai et al., "Dual Stream Input for Pointing and Scrolling," *Proceedings of CHI '97 Extended Abstracts* (1997).
Zimmerman et al., "Applying Electric Field Sensing to Human-Computer Interfaces," In CHI '85 Proceedings, pp. 280-287, 1995.
International Search Report received in corresponding PCT application No. PCT/US2006/008349 dated Oct. 6, 2006.
International search report for PCT/US99/01454, mailed May 14, 1999.
European supplementary search report for European Patent Application No. 99904228.6, mailed Feb. 16, 2005.
Supplementary European search report for U.S. pantent Application No. 99904228.6, mailed Jul. 8, 2005.
European examination report for European patent Application No. 99904228.6, mailed Apr. 20, 2006.
European examination report for European Patent Application No. 99904228.6, mailed Mar. 23, 2007.
Extended European search report for European Patent Application No. 06016858.0, mailed Dec. 21, 2007.
Extended European search report for European Patent Application No. 06016856.4, mailed Mar. 14, 2008.
European examination report for European Patent Application No. 06016830.9, mailed Aug. 6, 2008.
European search report for European Patent Application No. 06016830.9 mailed Dec. 3, 2007.
European examination report for European Patent Application No. 06016856.4 mailed Sep. 16, 2008.
Non-Final Office Action mailed Jan. 4, 2013, for U.S. Appl. No. 12/139,411, filed Jun. 13, 2008, six pages.
Notice of Allowance mailed Jan. 15, 2013, for U.S. Appl. No. 12/479,617, filed Jun. 5, 2009, 10 pages.
Final Office Action mailed Aug. 3, 2012, for U.S. Appl. No. 11/830,808, filed Jul. 30, 2007, seven pages.
Notice of Allowance mailed Jul. 26, 2012, for U.S. Appl. No. 11/428,503, filed Jul. 3, 2006, nine pages.
Non-Final Office Action mailed Aug. 21, 2012, for U.S. Appl. No. 12/434,439, filed May 1, 2009, 12 pages.
Non-Final Office Action mailed Sep. 4, 2012, for U.S. Appl. No. 11/830,788, filed Jul. 30, 2007, 13 pages.
Non-Final Office Action mailed Sep. 6, 2012, for U.S. Appl. No. 11/830,793, filed Jul. 30, 2007, 14 pages.
Non-Final Office Action mailed Sep. 13, 2012, for U.S. Appl. No. 12/422,205, filed Apr. 10, 2009, 16 pages.
Non-Final Office Action mailed Sep. 25, 2012, for U.S. Appl. No. 11/428,515, filed Jul. 3, 2006, 15 pages.
Non-Final Office Action mailed Oct. 12, 2012, for U.S. Appl. No. 12/422,212, filed Apr. 10, 2009, five pages.
Non-Final Office Action mailed Nov. 8, 2012, for U.S. Appl. No. 12/479,678, filed Jun. 5, 2009, five pages.
Non-Final Office Action mailed Nov. 16, 2012, for U.S. Appl. No. 13/569,065, filed Aug. 7, 2012, eight pages.
Notice of Allowance mailed Aug. 22, 2012, for U.S. Appl. No. 11/559,763, filed Nov. 14, 2006, 10 pages.
Non-Final Office Action mailed Nov. 29, 2012, for U.S. Appl. No. 11/559,833, filed Nov. 14, 2006, 10 pages.
Final Office Action mailed Jan. 29, 2013, for U.S. Appl. No. 11/830,766, filed Jul. 30, 2007, 16 pages.
Final Office Action mailed Jan. 29, 2013, for U.S. Appl. No. 11/830,774, filed Jul. 30, 2007, 19 pages.
Final Office Action mailed Feb. 15, 2013, for U.S. Appl. No. 12/422,205, filed Apr. 10, 2009, 16 pages.
Non-Final Office Action mailed Feb. 21, 2013, for U.S. Appl. No. 12/422,197, filed Apr. 10, 2009, 12 pages.
Notice of Allowance mailed Feb. 15, 2013, for U.S. Appl. No. 11/559,799, filed Nov. 14, 2006, 12 pages.
Notice of Allowance mailed Feb. 19, 2013, for U.S. Appl. No. 12/422,212, filed Apr. 10, 2009, nine pages.
Notice of Allowance mailed Feb. 21, 2013, for U.S. Appl. No. 12/342,027, filed Dec. 22, 2008, 10 pages.
Final Office Action mailed Mar. 21, 2013, for U.S. Appl. No. 11/830,788, filed Jul. 30, 2007, 12 pages.
Non-Final Office Action mailed Mar. 18, 2013, for U.S. Appl. No. 12/422,222, filed Apr. 10, 2009, 15 pages.
Non-Final Office Action mailed Mar. 26, 2013, for U.S. Appl. No. 13/757,726, filed Feb. 1, 2013, eight pages.
Notice of Allowance mailed Mar. 5, 2013, for U.S. Appl. No. 12/434,439, filed May 1, 2009, nine pages.
Notice of Allowance mailed Apr. 2, 2013, for U.S. Appl. No. 12/479,678, filed Jun. 5, 2009, 11 pages.
Final Office Action mailed Apr. 12, 2013, for U.S. Appl. No. 11/830,793, filed Jul. 30, 2007, 15 pages.
Final Office Action mailed Apr. 30, 2013, for U.S. Appl. No. 11/559,833, filed Nov. 14, 2006, 10 pages.

* cited by examiner

TYPING WITH A TOUCH SENSOR

CROSS-REFERENCE TO RELATED APPLICATIONS

This application is a continuation of Ser. No. 11/015,434, entitled "Method and Apparatus for Integrating Manual Input," filed Dec. 17, 2004, which is a continuation of Ser. No. 09/919,266 (now U.S. Pat. No. 6,888,536), entitled "Method And Apparatus For Integrating Manual Input" filed Jul. 31, 2001, which is a division of application Ser. No. 09/236,513 (now U.S. Pat. No. 6,323,846) filed Jan. 25, 1999, which claims the benefit of provisional application 60/072,509, filed Jan. 26, 1998, each of which is hereby incorporated by reference in its entirety.

BACKGROUND OF THE INVENTION

A. Field of the Invention

The present invention relates generally to methods and apparatus for data input, and, more particularly, to a method and apparatus for integrating manual input.

B. Description of the Related Art

Many methods for manual input of data and commands to computers are in use today, but each is most efficient and easy to use for particular types of data input. For example, drawing tablets with pens or pucks excel at drafting, sketching, and quick command gestures. Handwriting with a stylus is convenient for filling out forms which require signatures, special symbols, or small amounts of text, but handwriting is slow compared to typing and voice input for long documents. Mice, finger-sticks and touchpads excel at cursor pointing and graphical object manipulations such as drag and drop. Rollers, thumbwheels and trackballs excel at panning and scrolling. The diversity of tasks that many computer users encounter in a single day call for all of these techniques, but few users will pay for a multitude of input devices, and the separate devices are often incompatible in a usability and an ergonomic sense. For instance, drawing tablets are a must for graphics professionals, but switching between drawing and typing is inconvenient because the pen must be put down or held awkwardly between the fingers while typing. Thus, there is a long-felt need in the art for a manual input device which is cheap yet offers convenient integration of common manual input techniques.

Speech recognition is an exciting new technology which promises to relieve some of the input burden on user hands. However, voice is not appropriate for inputting all types of data either. Currently, voice input is best-suited for dictation of long text documents. Until natural language recognition matures sufficiently that very high level voice commands can be understood by the computer, voice will have little advantage over keyboard hot-keys and mouse menus for command and control. Furthermore, precise pointing, drawing, and manipulation of graphical objects is difficult with voice commands, no matter how well speech is understood. Thus, there will always be a need in the art for multi-function manual input devices which supplement voice input.

A generic manual input device which combines the typing, pointing, scrolling, and handwriting capabilities of the standard input device collection must have ergonomic, economic, and productivity advantages which outweigh the unavoidable sacrifices of abandoning device specialization. The generic device must tightly integrate yet clearly distinguish the different types of input. It should therefore appear modeless to the user in the sense that the user should not need to provide explicit mode switch signals such as buttonpresses, arm relocations, or stylus pickups before switching from one input activity to another. Epidemiological studies suggest that repetition and force multiply in causing repetitive strain injuries. Awkward postures, device activation force, wasted motion, and repetition should be minimized to improve ergonomics. Furthermore, the workload should be spread evenly over all available muscle groups to avoid repetitive strain.

Repetition can be minimized by allocating to several graphical manipulation channels those tasks which require complex mouse pointer motion sequences. Common graphical user interface operations such as finding and manipulating a scroll bar or slider control are much less efficient than specialized finger motions which cause scrolling directly, without the step of repositioning the cursor over an on-screen control. Preferably the graphical manipulation channels should be distributed amongst many finger and hand motion combinations to spread the workload. Touchpads and mice with auxilliary scrolling controls such as the Cirque®™ Smartcat touchpad with edge scrolling, the IBM®™ ScrollPoint™ mouse with embedded pointing stick, and the Roller Mouse described in U.S. Pat. No. 5,530,455 to Gillick et al. represent small improvements in this area, but still do not provide enough direct manipulation channels to eliminate many often-used cursor motion sequences. Furthermore, as S. Zhai et al. found in "Dual Stream Input for Pointing and Scrolling," Proceedings of CHI '97 Extended Abstracts (1997), manipulation of more than two degrees of freedom at a time is very difficult with these devices, preventing simultaneous panning, zooming and rotating.

Another common method for reducing excess motion and repetition is to automatically continue pointing or scrolling movement signals once the user has stopped moving or lifts the finger. Related art methods can be distinguished by the conditions under which such motion continuation is enabled. In U.S. Pat. No. 4,734,685, Watanabe continues image panning when the distance and velocity of pointing device movement exceed thresholds. Automatic panning is, stopped by moving the pointing device back in the opposite direction, so stopping requires additional precise movements. In U.S. Pat. No. 5,543,591 to Gillespie et al., motion continuation occurs when the finger enters an edge border region around a small touchpad. Continued motion speed is fixed and the direction corresponds to the direction from the center of the touchpad to the finger at the edge. Continuation mode ends when the finger leaves the border region or lifts off the pad. Disadvantageously, users sometimes pause at the edge of the pad without intending for cursor motion to continue, and the unexpected motion continuation becomes annoying. U.S. Pat. No. 5,327,161 to Logan et al. describes motion continuation when the finger enters a border area as well, but in an alternative trackball emulation mode, motion continuation can be a function solely of lateral finger velocity and direction at liftoff. Motion continuation decays due to a friction factor or can be stopped by a subsequent touchdown on the surface. Disadvantageously, touch velocity at liftoff is not a reliable indicator of the user's desire for motion continuation since when approaching a large target on a display at high speeds the user may not stop the pointer completely before liftoff. Thus it would be an advance in the art to provide a motion continuation method which does not become activated unexpectedly when the user really intended to stop pointer movement at a target but happens to be on a border or happens to be moving at significant speed during liftoff.

Many attempts have been made to embed pointing devices in a keyboard so the hands do not have to leave typing position to access the pointing device. These include the integrated pointing key described in U.S. Pat. No. 5,189,403 to Franz et al., the integrated pointing stick disclosed by J. Rutledge and T. Selker in "Force-to-Motion Functions for Pointing," Human-Computer Interaction—INTERACT '90, pp. 701-06 (1990), and the position sensing keys described in U.S. Pat. No. 5,675,361 to Santilli. Nevertheless, the limited movement range and resolution of these devices, leads to poorer pointing speed and accuracy than a mouse, and they add mechanical complexity to keyboard construction. Thus there exists a need in the art for pointing methods with higher resolution, larger movement range, and more degrees of freedom yet which are easily accessible from typing hand positions.

Touch screens and touchpads often distinguish pointing motions from emulated button clicks or keypresses by assuming very little lateral fingertip motion will occur during taps on the touch surface which are intended as clicks. Inherent in these methods is the assumption that tapping will usually be straight down from the suspended finger position, minimizing those components of finger motion tangential to the surface. This is a valid assumption if the surface is not finely divided into distinct key areas or if the user does a slow, "hunt and peck" visual search for each key before striking. For example, in U.S. Pat. No. 5,543,591 to Gillespie et al., a touchpad sends all lateral motions to the host computer as cursor movements. However, if the finger is lifted soon enough after touchdown to count as a tap and if the accumulated lateral motions are not excessive, any sent motions are undone and a mouse button click is sent instead. This method only works for mouse commands such as pointing which can safely be undone, not for dragging or other manipulations. In U.S. Pat. No. 5,666, 113 to Logan, taps with less than about 1/16" lateral motion activate keys on a small keypad while lateral motion in excess of 1/16" activates cursor control mode. In both patents cursor mode is invoked by default when a finger stays on the surface a long time.

However, fast touch typing on a surface divided into a large array of key regions tends to produce more tangential motions along the surface than related art filtering techniques can tolerate. Such an array contains keys in multiple rows and columns which may not be directly under the fingers, so the user must reach with the hand or flex or extend fingers to touch many of the key regions. Quick reaching and extending imparts significant lateral finger motion while the finger is in the air which may still be present when the finger contacts the surface. Glancing taps with as much as 1/4" lateral motion measured at the surface can easily result. Attempting to filter or suppress this much motion would make the cursor seem sluggish and unresponsive. Furthermore, it may be desirable to enter a typematic or automatic key repeat mode instead of pointing mode when the finger is held in one place on the surface. Any lateral shifting by the fingertip during a prolonged finger press would also be picked up as cursor jitter without heavy filtering. Thus, there is a need in the art for a method to distinguish keying from pointing on the same surface via more robust hand configuration cues than lateral motion of a single finger.

An ergonomic typing system should require minimal key tapping force, easily distinguish finger taps from resting hands, and cushion the fingers from the jarring force of surface impact. Mechanical and membrane keyboards rely on the spring force in the keyswitches to prevent activation when the hands are resting on the keys. This causes an irreconcilable tradeoff between the ergonomic desires to reduce the fatigue from key activating force and to relax the full weight of the hands onto the keys during rest periods. Force minimization on touch surfaces is possible with capacitive or active optical sensing, which do not rely on finger pressure, rather than resistive-membrane or surface-acoustic-wave sensing techniques. The related art touch devices discussed below will become confused if a whole hand including its four fingertips a thumb and possibly palm heels, rests on the surface. Thus, there exists a long felt need in the art for a multi-touch surface typing system based on zero-force capacitive sensing which can tolerate resting hands and a surface cushion.

An ergonomic typing system should also adapt to individual hand sizes tolerate variations in typing style, and support a range of healthy hand postures. Though many ergonomic keyboards have been proposed, mechanical keyswitches can only be repositioned at great cost. For example, the keyboard with concave keywells described by Hargreaves et al. in U.S. Pat. No. 5,689,253 fits most hands well but also tends to lock the arms in a single position. A touch surface key layout could easily be morphed, translated, or arbitrarily reconfigured as long as the changes did not confuse the user. However, touch surfaces may not provide as much laterally orienting tactile feedback as the edges of mechanical keyswitches. Thus, there exists a need in the art for a surface typing recognizer which can adapt a key layout to fit individual hand postures and which can sustain typing accuracy if the hands drift due to limited tactile feedback.

Handwriting on smooth touch surfaces using a stylus is well-known in the art, but it typically does not integrate well with typing and pointing because the stylus must be put down somewhere or held awkwardly during other input activities. Also, it may be difficult to distinguish the handwriting activity of the stylus from pointing motions of a fingertip. Thus there exists a need in the art for a method to capture coarse handwriting gestures without a stylus and without confusing them with pointing motions.

Many of the input differentiation needs cited above could be met with a touch sensing technology which distinguishes a variety of hand configurations and motions such as sliding finger chords and grips. Many mechanical chord keyboards have been designed to detect simultaneous downward activity from multiple fingers, but they do not detect lateral finger motion over a large range. Related art shows several examples of capacitive touchpads which emulate a mouse or keyboard by tracking a single finger. These typically measure the capacitance of or between elongated wires which are laid out in rows and columns. A thin dielectric is interposed between the row and column layers. Presence of a finger perturbs the self or mutual capacitance for nearby electrodes. Since most of these technologies use projective row and column sensors which integrate on one electrode the proximity of all objects in a particular row or column, they cannot uniquely determine the positions of two or more objects as discussed in S. Lee, "A Fast Multiple-Touch-Sensitive Input Device," University of Toronto Masters Thesis (1984). The best they can do is count fingertips which happen to lie in a straight row, and even that will fail if a thumb or palm is introduced in the same column as a fingertip.

In U.S. Pat. Nos. 5,565,658 and 5,305,017, Gerpheide et al. measure the mutual capacitance between row and column electrodes by driving one set of electrodes at some clock frequency and sensing how much of that frequency is coupled onto a second electrode set. Such synchronous measurements are very prone to noise at the driving frequency, so to increase signal-to-noise ratio they form virtual electrodes comprised of multiple rows or multiple columns, instead of a single row and column, and scan through electrode combinations until the various mutual capacitances are nulled or balanced. The coupled signal increases with the product of the rows and columns in each virtual electrodes, but the noise only increases with the sum, giving a net gain in signal-to-noise ratio for virtual electrodes consisting of more than two rows and two columns. However, to uniquely distinguish multiple objects, virtual electrode sizes would have to be reduced so the intersection of the row and column virtual electrodes would be no larger than a finger tip, i.e., about two rows and two columns, which will degrade the signal-to-noise ratio. Also, the signal-to-noise ratio drops as row and column lengths increase to cover a large area.

In U.S. Pat. Nos. 5,543,591, 5,543,590, and 5,495,077, Gillespie et al measure the electrode-finger self-capacitance for row and column electrodes independently. Total electrode capacitance is estimated by measuring the electrode voltage change caused by injecting or removing a known amount of charge in a known time. All electrodes can be measured simultaneously if each electrode has its own drive/sense circuit. The centroid calculated from all row and column electrode signals establishes an interpolated vertical and horizontal position for a single object. This method may in general have higher signal-to-noise ratio than synchronous methods, but the signal-to-noise ratio is still degraded as row and column lengths increase. Signal-to-noise ratio is especially important for accurately locating objects which are floating a few millimeters above the pad. Though this method can detect such objects, it tends to report their position as being near the middle of the pad, or simply does not detect floating objects near the edges.

Thus there exists a need in the art for a capacitance-sensing apparatus which does not suffer from poor signal-to-noise ratio and the multiple finger indistinguishability problems of touchpads with long row and column electrodes.

U.S. Pat. No. 5,463,388 to Boie et al. has a capacitive sensing system applicable to either keyboard or mouse input, but does not consider the problem of integrating both types of input simultaneously. Though they mention independent detection of arrayed unit-cell electrodes, their capacitance transduction circuitry appears too complex to be economically reproduced at each electrode. Thus the long lead wires connecting electrodes to remote signal conditioning circuitry can pickup noise and will have significant capacitance compared to the finger-electrode self-capacitance, again limiting signal-to-noise ratio. Also, they do not recognize the importance of independent electrodes for multiple finger tracking, or mention how to track multiple fingers on an independent electrode array.

Lee built an early multi-touch electrode array, with 7 mm by 4 mm metal electrodes arranged in 32 rows and 64 columns. The "Fast Multiple-Touch-Sensitive Input Device (FMTSID)" total active area measured 12" by 16", with a 0.075 mm Mylar dielectric to insulate fingers from electrodes. Each electrode had one diode connected to a row charging line and a second diode connected to a column discharging line. Electrode capacitance changes were measured singly or in rectangular groups by raising the voltage on one or more row lines, selectively charging the electrodes in those rows, and then timing the discharge of selected columns to ground through a discharge resistor. Lee's design required only two diodes per electrode, but the principal disadvantage of Lee's design is that the column diode reverse bias capacitances allowed interference between electrodes in the same column.

All of the related capacitance sensing art cited above utilize interpolation between electrodes to achieve high pointing resolution with economical electrode density. Both Boie et al. and Gillespie et al. discuss compultattion of a centroid from all row and column electrode readings. However, for multiple finger detection, centroid calculation must be carefully limited around local maxima to include only one finger at a time. Lee utilizes a bisective search technique to find local maxima and then interpolates only on the eight nearest neighbor electrodes of each local maximum electrode. This may work fine for small fingertips, but thumb and palm contacts may cover more than nine electrodes. Thus there exists a need in the art for improved means to group exactly those electrodes which are covered by each distinguishable hand contact and to compute a centroid from such potentially irregular groups.

To take maximum advantage of multi-touch surface sensing, complex proximity image processing is necessary to track and identify the parts of the hand contacting the surface at any one time. Compared to passive optical, images, proximity images provide clear indications of where the body contacts the surface, uncluttered by luminosity variation and extraneous objects in the background. Thus proximity image filtering and segmentation stages can be simpler and more reliable than in computer vision approaches to free-space hand tracking such as S. Alimad, "A Usable Real-Time 3D Hand Tracker," Proceedings of the $28^{th}$ Asilomar Conference on Signals, Systems, and Computers—Part 2, vol. 2, IEEE (1994) or Y. Cui and J. Wang, "Hand Segmentation Using Learning-Based Prediction and Verification for Hand Sign Recognition," Proceedings of the 1996 IEEE Computer Society Conference on Computer Vision and Pattern Recognition, pp. 88-93 (1996). However, parts of the hand such as intermediate finger joints and the center of the palms do not show up in capacitive proximity images at all if the hand is not flattened on the surface. Without these intermediate linkages between fingertips and palms the overall hand structure can only be guessed at, making hand contact identification very difficult. Hence the optical flow and contour tracking techniques which have been applied to free-space hand sign language recognition as in F. Quek, "Unencumbered Gestural Interaction," IEEE Multimedia, vol. 3, pp. 36-47 (1996), do not address the special challenges of proximity image tracking.

Synaptics Corp. has successfully fabricated their electrode array on flexible mylar film rather than stiff circuit board. This is suitable for conforming to the contours of special products, but does not provide significant finger cushioning for large surfaces. Even if a cushion was placed under the film, the lack of stretchability in the film, leads, and electrodes would limit the compliance afforded by the compressible material. Boie et al suggests that placing cornnressihle insulators on top of the electrode array cushions finger impact. However, an insulator more than about one millimeter thick would seriously attenuate the measured finger-electrode capacitances. Thus there exists a need in the art for a method to transfer finger capacitance influences through an arbitrarily thick cushion.

SUMMARY OF THE INVENTION

It is a primary object of the present invention to provide a system and method for integrating different types of manual input such as typing, multiple degree-of-freedom manipulation, and handwriting on a multi-touch surface.

It is also an object of the present invention to provide a system and method for distinguishing different types of manual input such as typing, multiple degree-of-freedom manipulation, and handwriting on a multi-touch surface, via different hand configurations which are easy for the user to learn and easy for the system to recognize.

It is a further object of the present invention to provide an improved capacitance-transducing apparatus that is cheaply implemented near each electrode so that two-dimensional sensor arrays of arbitrary size and resolution can be built without degradation in signal to noise.

It is a further object of the present invention to provide an electronic system which minimizes the number of sensing electrodes necessary to obtain proximity images with such resolution that a variety of hand configurations can be distinguished.

Yet another object of the present invention is to provide a multi-touch surface apparatus which is compliant and contoured to be comfortable and ergonomic under extended use.

Yet another object of the present invention is to provide tactile key or hand position feedback without impeding hand resting on the surface or smooth, accurate sliding across the surface.

It is a further object of the present invention to provide an electronic system which can provide images of flesh proximity to an array of sensors with such resolution that a variety of hand configurations can be distinguished.

It is another object of the present invention to provide an improved method for invoking cursor motion continuation only when the user wants it by not invoking it when significant deceleration is detected.

Another object of the present invention is to identify different hand parts as they contact the surface so that a variety of hand configurations can be recognized and used to distinguish different kinds of input activity.

Yet another object of the present invention is to reliably extract rotation and scaling as well as translation degrees of freedom from the motion of two or more hand contacts to aid in navigation and manipulation of two-dimensional electronic documents.

It is a further object of the present invention to reliably extract tilt and roll degrees of freedom from hand pressure differences to aid in navigation and manipulation of three-dimensional environments.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a sensing device that is sensitive to changes in self-capacitance brought about by changes in proximity of a touch device to the sensing device, the sensing device comprising: two electrical switching means connected together in series having a common node, an input node, and an output node; a dielectric-covered sensing electrode connected to the common node between the two switching means; a power supply providing an approximately constant voltage connected to the input node of the series-connected switching means; an integrating capacitor to accumulate charge transferred during multiple consecutive switchings of the series connected switching means; another switching means connected in parallel across the integrating capacitor to deplete its residual charge; and a voltage-to-voltage translation device connected to the output node of the series-connected switching means which produces a voltage representing the magnitude of the self-capacitance of the sensing device. Alternatively, the sensing device comprises: two electrical switching means connected together in series having a common node, an input node, and an output node; a dielectric-covered sensing electrode connected to the common node between the two switching means; a power supply providing an approximately constant voltage connected to the input node of the series-connected switching means; and an integrating current-to-voltage translation device connected to the output node of the series connected switching means, the current-to-voltage translation device producing a voltage representing the magnitude of the self-capacitance of the sensing device.

To further achieve the objects, the present invention comprises a multi-touch surface apparatus for detecting a spatial arrangement of multiple touch devices on or near the surface of the multi-touch apparatus, comprising: one of a rigid or flexible surface; a plurality of two-dimensional arrays of one of the sensing devices (recited in the previous paragraph) arranged on the surface in groups wherein the sensing devices within a group have their output nodes connected together and share the same integrating capacitor, charge depletion switch, and voltage-to-voltage translation circuitry; control circuitry for enabling a single sensor device from each two-dimensional array; means for selecting the sensor voltage data from each two-dimensional array; voltage measurement circuitry to convert sensor voltage data to a digital code; and circuitry for communicating the digital code to another electronic device. The sensor voltage data selecting means comprises one of a multiplexing circuitry and a plurality of voltage measurement circuits.

To still further achieve the objects, the present invention comprises a multi-touch surface apparatus for sensing diverse configurations and activities of touch devices and generating integrated manual input to one of an electronic or electromechanical device, the apparatus comprising: an array of one of the proximity sensing devices described above; a dielectric cover having symbols printed thereon that represent action-to-be-taken when engaged by the touch devices; scanning means for forming digital proximity images from the array of sensing devices; calibrating means for removing background offsets from the proximity images; recognition means for interpreting the configurations and activities of the touch devices that make up the proximity images; processing means for generating input signals in response to particular touch device configurations and motions; and communication means for sending the input signals to the electronic or electromechanical device.

To even further achieve the objects, the present invention comprises a multi-touch surface apparatus for sensing diverse configurations and activities of fingers and palms of one or more hands near the surface and generating integrated manual input to one of an electronic or electromechanical device, the apparatus comprising: an array of proximity sensing means embedded in the surface; scanning means for forming digital proximity images from the proximities measured by the sensing means; image segmentation means for collecting into groups those proximity image pixels intensified by contact of the same distinguishable part of a hand; contact tracking means for parameterizing hand contact features and trajectories as the contacts move across successive proximity images, contact identification means for determining which hand and which part of the hand is causing each surface contact; synchronization detection means for identifying subsets of identified contacts which touchdown or liftoff the surface at approximately the same time, and for generating command signals in response to synchronous taps of multiple fingers on the surface; typing recognition means for generating intended key symbols from asynchronous finger taps; motion component extraction means for compressing multiple degrees of freedom of multiple fingers into degrees of freedom common in two and three dimensional graphical manipulation; chord motion recognition means for generating one of command and cursor manipulation signals in response to motion in one or more extracted degrees of freedom by a selected combination of fingers; pen grip detection means for recognizing contact arrangements which resemble the configuration of the hand when gripping a pen, generating inking signals from motions of the inner fingers, and generating cursor manipulation signals from motions of the palms while the inner fingers are lifted; and communication means for sending the sensed configurations and activities of finger and palms to one of the electronic and electromechanical device.

To further achieve the objects, the present invention comprises a method for tracking and identifying hand contacts in a sequence of proximity images in order to support interpretation of hand configurations and activities related to typing, multiple degree-of-freedom manipulation via chords, and handwriting, the method comprising the steps of: segmenting each proximity image into groups of electrodes which indicate significant proximity, each group representing proximity of a distinguishable hand part or other touch device; extracting total proximity, position, shape, size, and orientation parameters from each group of electrodes; tracking group paths through successive proximity images including detection of path endpoints at contact touchdown and liftoff; computing velocity and filtered position vectors along each path; assigning a hand and finger identity to each contact path by incorporating relative path positions and velocities, individual contact features, and previous estimates of hand and finger positions; and maintaining estimates of hand and finger positions from trajectories of paths currently assigned to the fingers, wherein the estimates provide high level feedback to bias segmentations and identifications in future images.

To still further achieve the objects, the present invention comprises a method for integrally extracting multiple degrees of freedom of hand motion from sliding motions of two or more fingers of a hand across a multi-touch surface, one of the fingers preferably being the opposable thumb, the method comprising the steps of: tracking across successive scans of the proximity sensor array the trajectories of individual hand parts on the surface; finding an innermost and an outermost finger contact from contacts identified as fingers on the given hand; computing a scaling velocity component from a change in a distance between the innermost and outermost finger contacts; computing a rotational velocity component from a change in a vector angle between the innermost and outermost finger contacts; computing a translation weighting for each contacting finger; computing translational velocity components in two dimensions from a translation weighted average of the finger velocities tangential to surface; suppressively filtering components whose speeds are consistently lower than the fastest components; transmitting the filtered velocity components as control signals to an electronic or electromechanical device.

To even further achieve the objects, the present invention comprises a manual input integration method for supporting diverse hand input activities such as resting the hands, typing, multiple degree-of-freedom manipulation, command gesturing and handwriting on a multi-touch surface, the method enabling users to instantaneously switch between the input activities by placing their hands in different configurations comprising distinguishable combinations of relative hand contact timing, proximity, shape, size, position, motion and/or identity across a succession of surface proximity images, the method comprising the steps of: tracking each touching hand part across successive proximity images; measuring the times when each hand part touches down and lifts off the surface; detecting when hand parts touch down or lift off simultaneously; producing discrete key symbols when the user asynchronously taps, holds, or slides a finger on key regions defined on the surface; producing discrete mouse button click commands, key commands, or no signals when the user synchronously taps two or more fingers from the same hand on the surface; producing gesture commands or multiple degree-of-freedom manipulation signals when the user slides two or more fingers across the surface; and sending the produced symbols, commands and manipulation signals as input to an electronic or an electro-mechanical device.

To still even further achieve the objects, the present invention comprises a method for choosing what kinds of input signals will be generated and sent to an electronic or electromechanical device in response to tapping or sliding of fingers on a multi-touch surface, the method comprising the following steps: identifying each contact on the surface as either a thumb, fingertip or palm; measuring the times when each hand part touches down and lifts off the surface; forming a set of those fingers which touch down from the all finger floating state before any one of the fingers lifts back off the surface; choosing the kinds of input signals to be generated by further distinctive motion of the fingers from the combination of finger identities in the set; generating input signals of this kind when further distinctive motions of the fingers occur; forming a subset any two or more fingers which touch down synchronously after at least one finger has lifted back off the surface; choosing a new kinds of input signals to be generated by further distinctive motion of the fingers from the combination of finger identities in the subset; generating input signals of this new kind when further distinctive motions of the fingers occur; and continuing to form new subsets, choose and generate new kinds of input signals in response to liftoff and synchronous touchdowns until all fingers lift off the surface.

To further achieve the objects, the present invention comprises a method for continuing generation of cursor movement or scrolling signals from a tangential motion of a touch device over a touch-sensitive input device surface after touch device liftoff from the surface if the touch device operator indicates that cursor movement continuation is desired by accelerating or failing to decelerate the tangential motion of the touch device before the touch device is lifted, the method comprising the following steps: measuring, storing and transmitting to a computing device two or more representative tangential velocities during touch device manipulation; computing and storing a liftoff velocity from touch device positions immediately prior to the touch device liftoff; comparing the liftoff velocity with the representative tangential velocities, and entering a mode for continuously moving the cursor if a tangential liftoff direction approximately equals the representative tangential directions and a tangential liftoff speed is greater than a predetermined fractional multiple of representative tangential speeds; continuously transmitting cursor movement signals after liftoff to a computing device such that the cursor movement velocity corresponds to one of the representative tangential velocities; and ceasing transmission of the cursor movement signals when the touch device engages the surface again, if comparing means detects significant deceleration before liftoff, or if the computing device replies that the cursor can move no farther or a window can scroll no farther.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible the same reference numbers will be used throughout the drawings to refer to the same or like parts.

Figure 1:
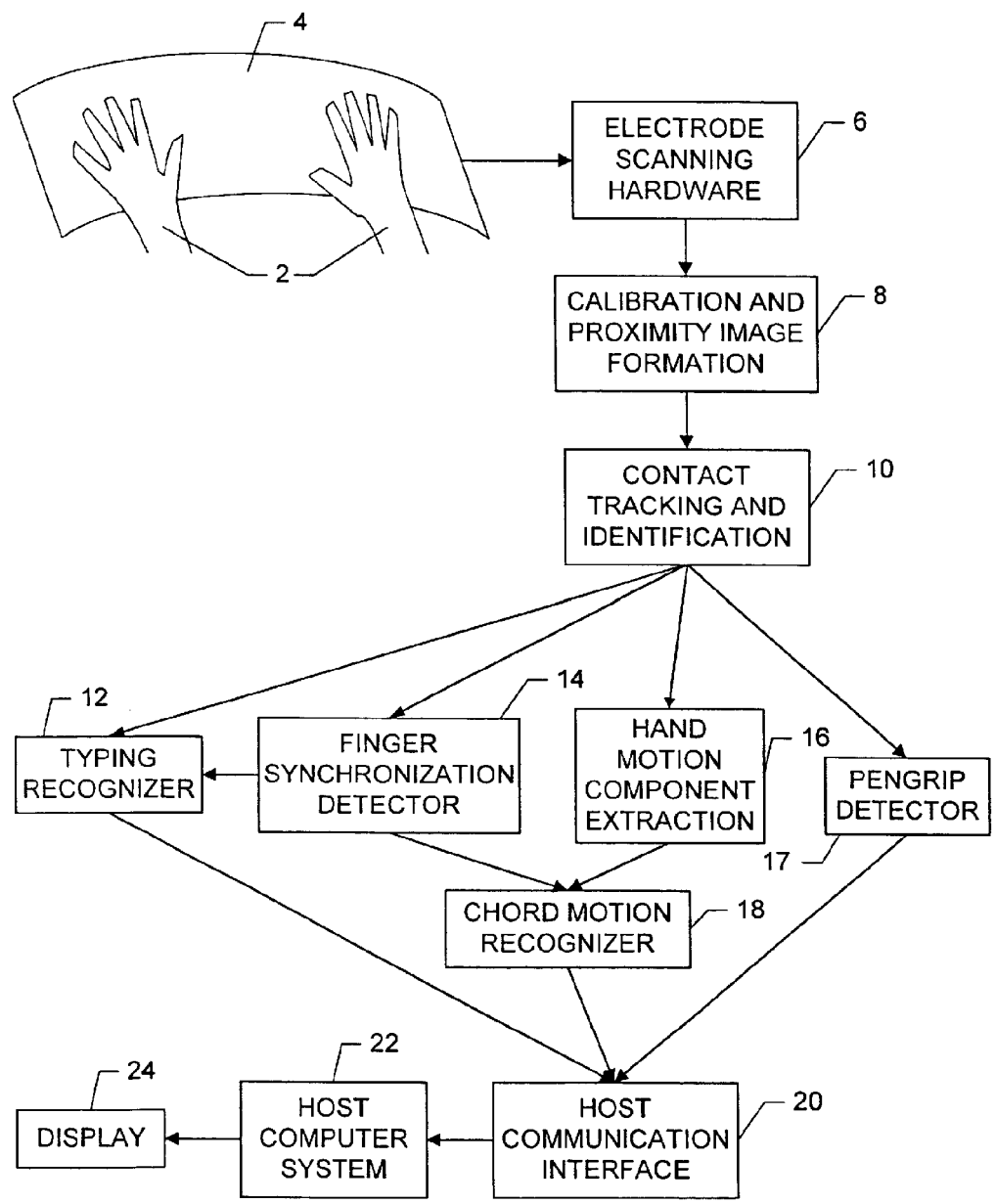
FIG. 1 is a block diagram of the integrated manual input apparatus.

FIG. 1 is a system block diagram of the entire, integrated manual input apparatus. Sensor embedded in the multi-touch surface 2 detect proximity of entire flattened hands 4, fingertips thumbs, palms, and other conductive touch devices to the surface 2. In a preferred embodiment, the surface is large enough to comfortably accommodate both hands 4 and is arched to reduce forearm pronation.

In alternative embodiments the multi-touch surface 2 may be large enough to accommodate motion of one hand, but may be flexible so it can be fitted to an armrest or clothing.

Electronic scanning hardware 6 controls and reads from each proximity sensor of a sensor array. A calibration module 8 constructs a raw proximity image from a complete scan of the sensor array and subtracts off any background sensor offsets. The background sensor offsets can simply be a proximity image taken when nothing is touching the surface.

The offset-corrected proximity image is then passed on to the contact tracking and identification module 10, which segments the image into distinguishable hand-surface contacts, tracks and identifies them as they move through successive images.

The paths of identified contacts are passed on to a typing recognizer module 12, finger synchronization detection module 14, motion component extraction module 16, and pen grip detection module 17, which contain software algorithms to distinguish hand configurations and respond to detected hand motions.

The typing recognizer module 12 responds to quick presses and releases of fingers which are largely asynchronous with respect to the activity of other fingers on the same hand. It attempts to find the key region nearest to the location of each finger tap and forwards the key symbols or commands associated with the nearest key region to the communication interface module 20.

The finger synchronization detector 14 checks the finger activity within a hand for simultaneous presses or releases of a subset of fingers. When such simultaneous activity is detected it signals the typing recognizer to ignore or cancel keystroke processing for fingers contained in the synchronous subset. It also passes on the combination of finger identities in the synchronous subset to the chord motion recognizer 18.

The motion component extraction module 16 computes multiple degrees of freedom of control from individual finger motions during easily performable hand manipulations on the surface 2, such as hand translations, hand rotation about the wrist, hand scaling by grasping with the fingers, and differential hand tilting.

The chord motion recognizer produces chord tap or motion events dependent upon both the synchronized finger subset identified by the synchronization detector 14 and on the direction and speed of motion extracted in 16. These events are then posted to the host communication interface 20.

The pen grip detection module 17 checks for specific arrangements of identified hand contacts which indicate the hand is configured as if gripping a pen. If such an arrangement is, detected, it forwards the movements of the gripping fingers as inking events to the host communication interface 20. These inking events can either lay digital ink on the host computer display for drawing or signature capture purposes, or they can be further interpreted by handwriting recognition software which is well known in the art. The detailed steps within each of the above modules will be further described later.

The host communication interface keeps events from both the typing recognizer 12 and chord motion recognizer 18 in a single temporally ordered queue and dispatches them to the host computer system 22. The method of communication between the interface 20 and host computer system 22 can vary widely depending on the function and processing power of the host computer. In a preferred embodiment, the communication would take place over computer cables via industry standard protocols such as Apple Desktop Bus, PS/2 keyboard and mouse protocol for PCs, or Universal Serial Bus (USB). In alternative embodiments the software processing of modules 10-18 would be performed within the host computer 22. The multi-touch surface apparatus would only contain enough hardware to scan the proximity sensor array 6, form proximity images 8, and compress and send them to the host computer over a wireless network. The host communication interface 20 would then play the role of device driver on the host computer, conveying results of the proximity image recognition process as input to other applications residing on the host computer system 22.

In a preferred embodiment the host computer system outputs to a visual display device 24 so that the hands and fingers 4 can manipulate graphical objects on the display screen. However, in alternative embodiments the host computer might output to an audio display or control a machine such as a robot.

The term "proximity" will only be used in reference to the distance or pressure between a touch device such as a finger and the surface 2, not in reference to the distance between adjacent fingers. "Horizontal" and "vertical" refer to x and y directional axes within the surface plane. Proximity measurements are then interpreted as pressure in a z axis normal to the surface. The direction "inner" means toward the thumb of a given hand, and the direction "outer" means towards the pinky finger of a given hand. For the purposes of this description, the thumb is considered a finger unless otherwise noted, but it does not count as a fingertip. "Contact" is used as a general term for a hand part when it touches the surface and appears in the current proximity image, and for the group and path data structures which represent it.

Figure 2:
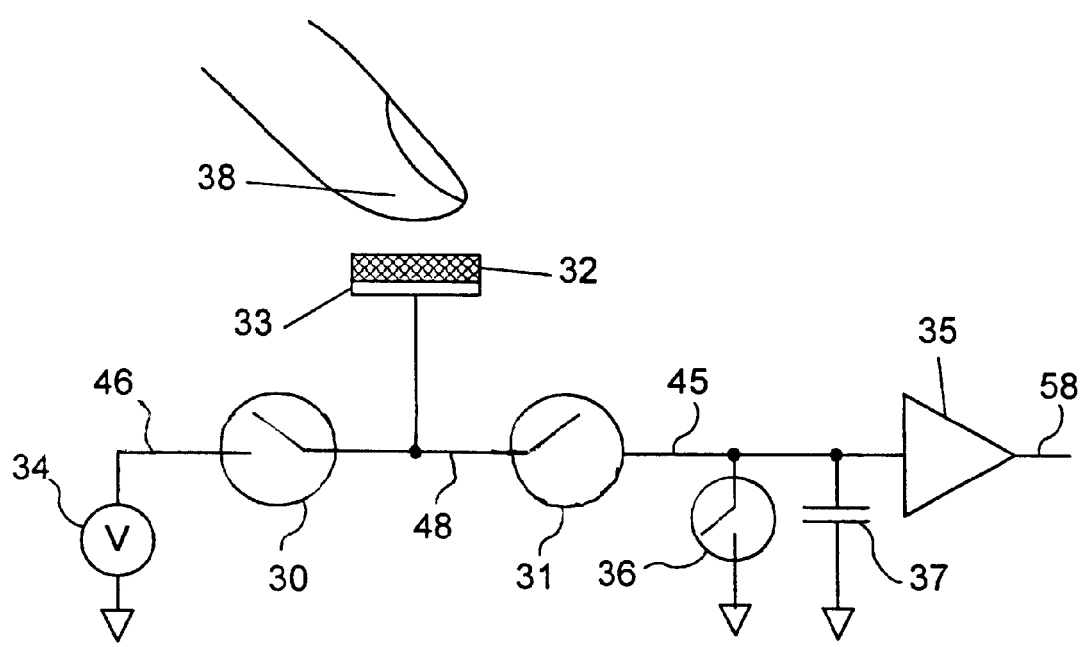
FIG. 2 is a schematic drawing of the proximity sensor with voltage amplifier.

FIG. 2 is a schematic diagram of a device that outputs a voltage 58 dependent on the proximity of a touch device 38 to a conductive sense electrode 33. The proximity sensing device includes two electrical switching means 30 and 31 connected together in series having a common node 48, an input node 46, and an output node 45. A thin dielectric material 32 covers the sensing electrode 33 that is electrically connected to the common node 48. A power supply 34 providing an approximately constant voltage is connected between reference ground and the input node 46. The two electrical switches 30 and 31 gate the flow of charge from the power supply 34 to an integrating capacitor 37. The voltage across the integrating capacitor 37 is translated to another voltage 58 by a high-impedance voltage amplifier 35. The plates of the integrating capacitor 37 can be discharged by closing electrical switch 36 until the voltage across the integrating capacitor 37 is near zero. The electrical switches 30 and 31 are opened and closed in sequence but are never closed at the same time, although they may be opened at the same time as shown in FIG. 2. Electrical switch 30 is referred to as the input switch; electrical switch 31 is referred to as the output switch; and, electrical switch 36 is referred to as the shorting switch.

The proximity sensing device shown in FIG. 2 is operated by closing and opening the electrical switches 30, 31, and 36 in a particular sequence after which the voltage output from the amplifier 58, which is dependent on the proximity of a touch device 38, is recorded. Sensor operation begins with all switches in the open state as shown in FIG. 2. The shorting switch 36 is then closed for a sufficiently long time to reduce the charge residing on the integrating capacitor 37 to a low level. The shorting switch 37 is then opened. The input switch 30 is then closed thus allowing charge to flow between the power supply and the common node 48 until the voltage across the input switch 30 becomes zero. Charge Q will accumulate on the sensing electrode 33 according to $$Q = V(e*A)/D \tag{1}$$

where V is the voltage of the power supply 34, e is the permittivity of the dielectric sensing electrode cover 32 and the air gap between the cover and the touch device 38, D is the thickness of this dielectric region, and A is the overlap area of the touch device 38 and the sensing electrode 33. Therefore the amount of charge accumulating on the sensing electrode 33 will depend, among other things, on the area of overlap of the touch device 38 and the sensing electrode 33 and the distance between the touch device 38 and the sensing electrode 33. The input switch 30 is opened after the voltage across it has become zero, or nearly so. Soon after input switch 30 is opened the output switch 31 is closed until the voltage across it is nearly zero. Closing the output switch 31 allows charge to flow between the sensing electrode 33 and the integrating capacitor 37 resulting in a voltage change across the integrating capacitor 37 according to:

$$\text{delta}V=(V-Vc)/(1+C*D/e*A) \tag{2}$$

where Vc is the voltage across the integrating capacitor 37 before the output switch 31 was closed, C is the capacitance of the integrating capacitor 37, and A and D are equal to their values when input switch 30 was closed as shown in Equation 1. Multiple switchings of the input 30 and output 31 switches as described above produce a voltage on the integrating capacitor 37 that reflects the proximity of a touch device 38 to the sensing electrode 33.

Figure 3A:
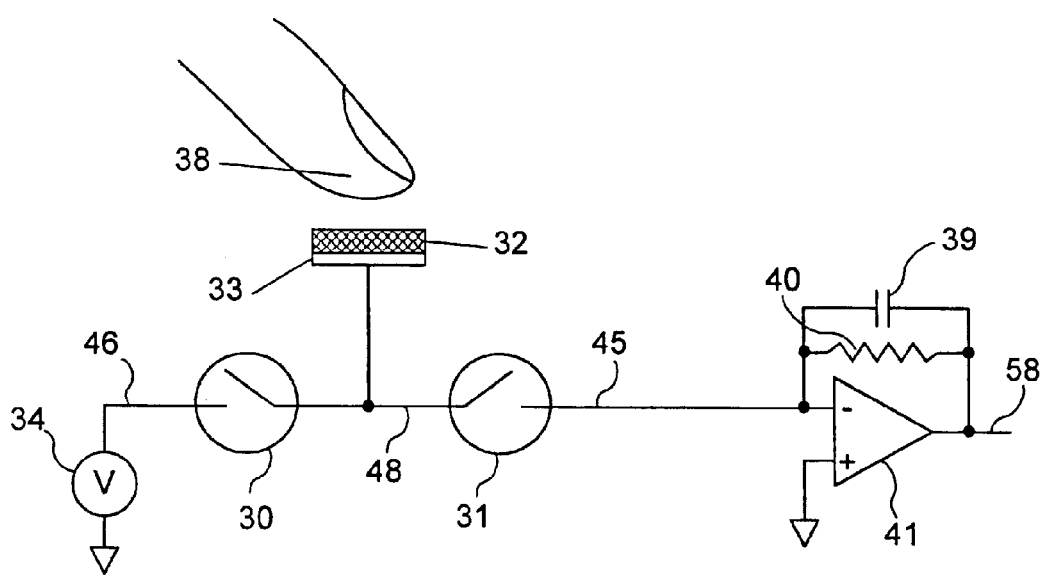
FIG. 3 is a schematic drawing of the proximity sensor with integrating current amplifier.
Figure 3B:
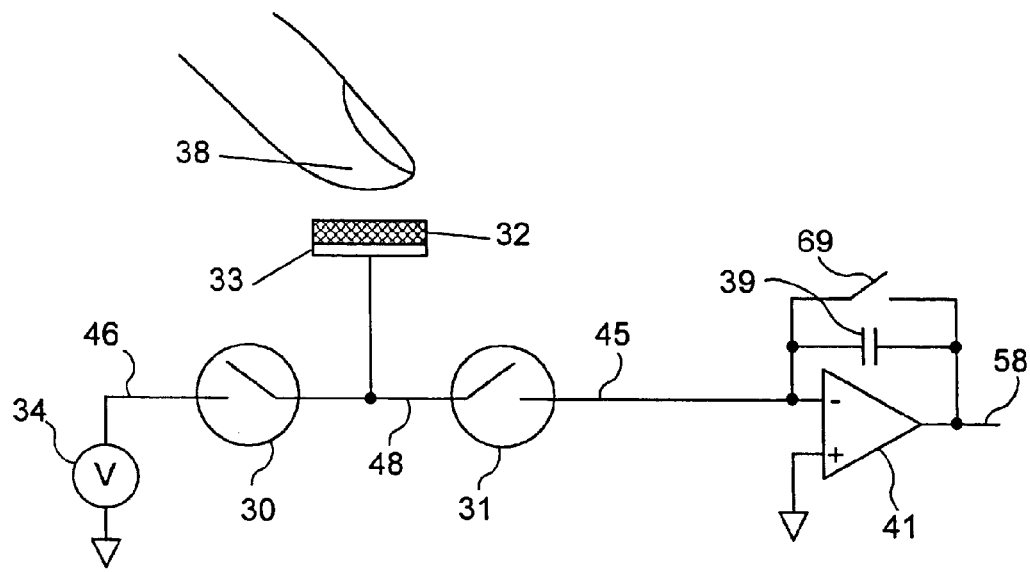

FIG. 3A is a schematic diagram of the proximity sensor in which the shorting transistor 36 and the voltage-to-voltage translation device 35 are replaced by a resistor 40 and a current-to-voltage translation device 41, respectively. The integrating function of capacitor 37 shown in FIG. 2 is, in this variation of the proximity sensor, carried out by the capacitor 39 shown in FIG. 3A. Those skilled in the art will see that this variation of the proximity sensor produces a more linear output 58 from multiple switchings of the input and output switches, depending on the relative value of the resistor 40. Alternatively, the resistor 40 can be replaced by a shorting switch 69 (cf. FIG. 3B) to improve linearity. Although, the circuits shown in FIG. 3 provide a more linear output than the circuit shown in FIG. 2 the circuits of FIG. 3 generally require dual power supplies while the circuit of FIG. 2 requires only one.

Figure 4A:
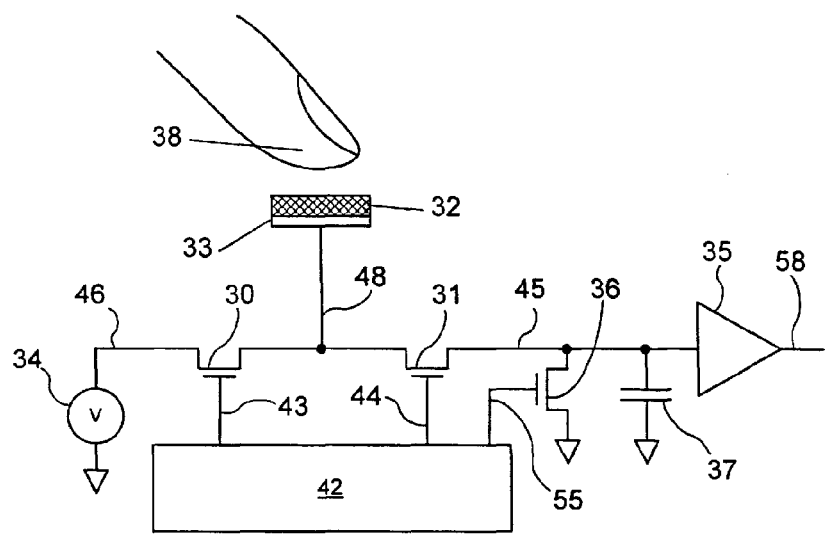
FIG. 4 is a schematic drawing of the proximity sensor implemented with field effect transistors.
Figure 4B:
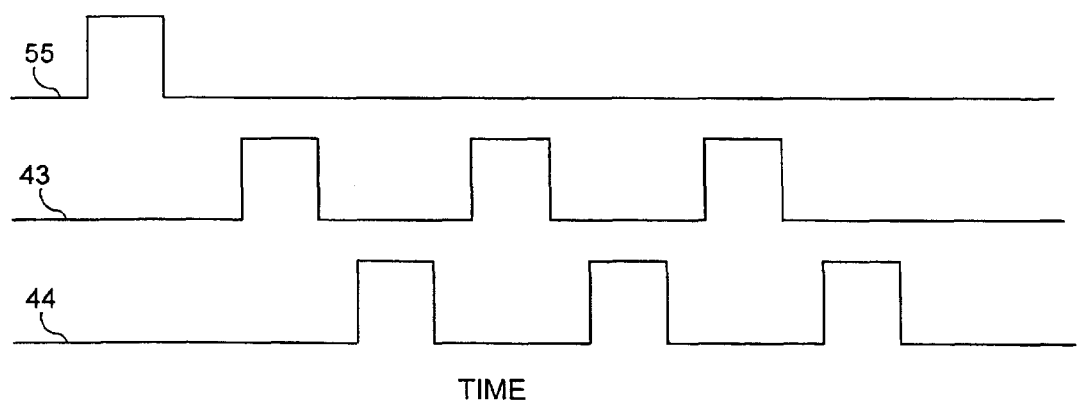

The electrical switches shown in, FIG. 2 can be implemented with various transistor technologies: discrete, integrated, thin film, thick film, polymer, optical, etc. One such implementation is shown in FIG. 4A where field effect transistors (FETs) are used as the input 30, output 31, and shorting 36 switches. The FETs are switched on and off by voltages applied to their gate terminals (43, 44, and 55). For the purpose of this description we will assume the FET is switched on when its gate voltage is logic 1 and switched off when its gate voltage is logic 0. A controller 42 is used to apply gate voltages as a function of time as shown in FIG. 4B. In this example, a sequence of three pairs of pulses (43 and 44) are applied to the input and output transistor gates. Each pair of pulses 43 and 44 produces a voltage change across the integrating capacitor 37 as shown in Equation 2. The number of pulse pairs applied to input 43 and output 44 gates depends on the desired voltage across integrating capacitor 37. In typical applications the number is between one and several hundred pulse-pairs.

Figure 5A:
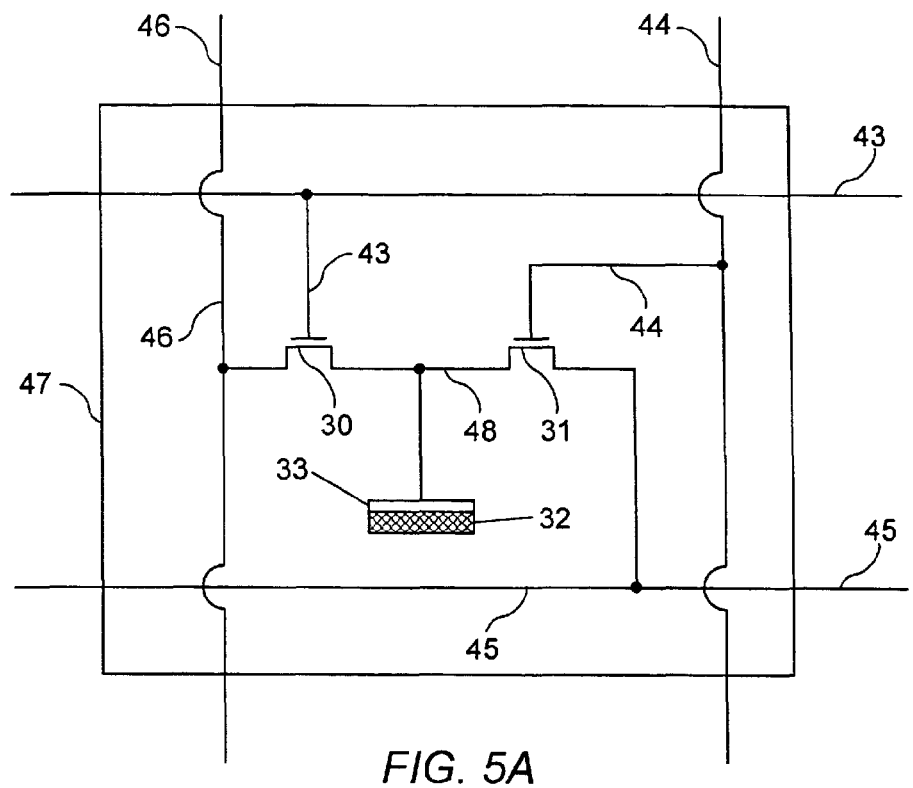
FIG. 5 is a schematic drawing of the proximity sensor as used to implement 2D arrays of proximity sensors.
Figure 5B:
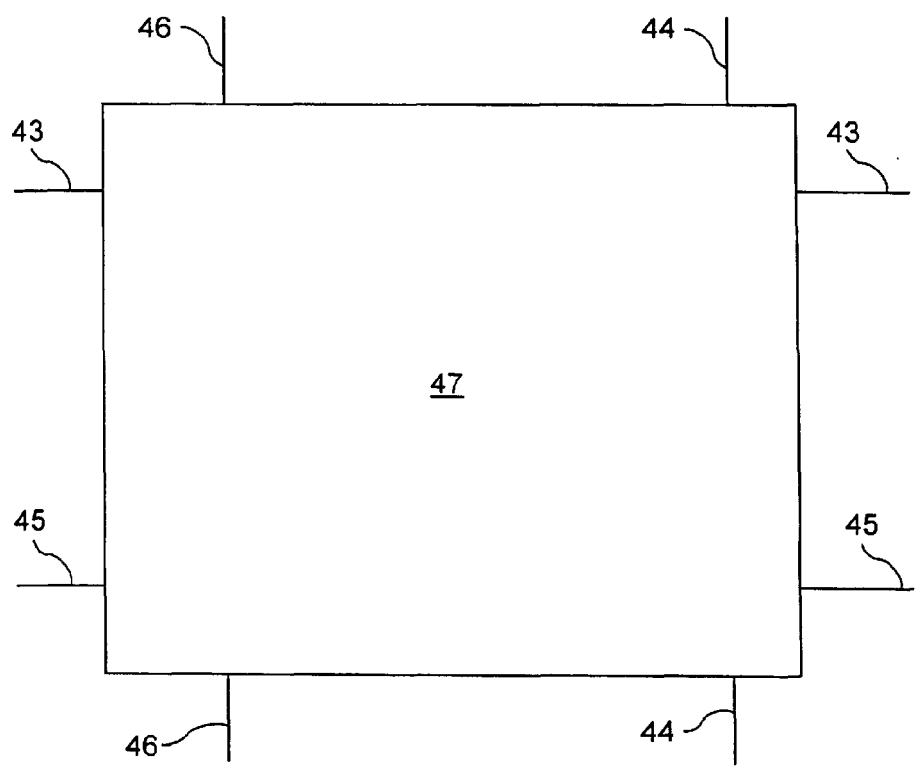
Figure 6:
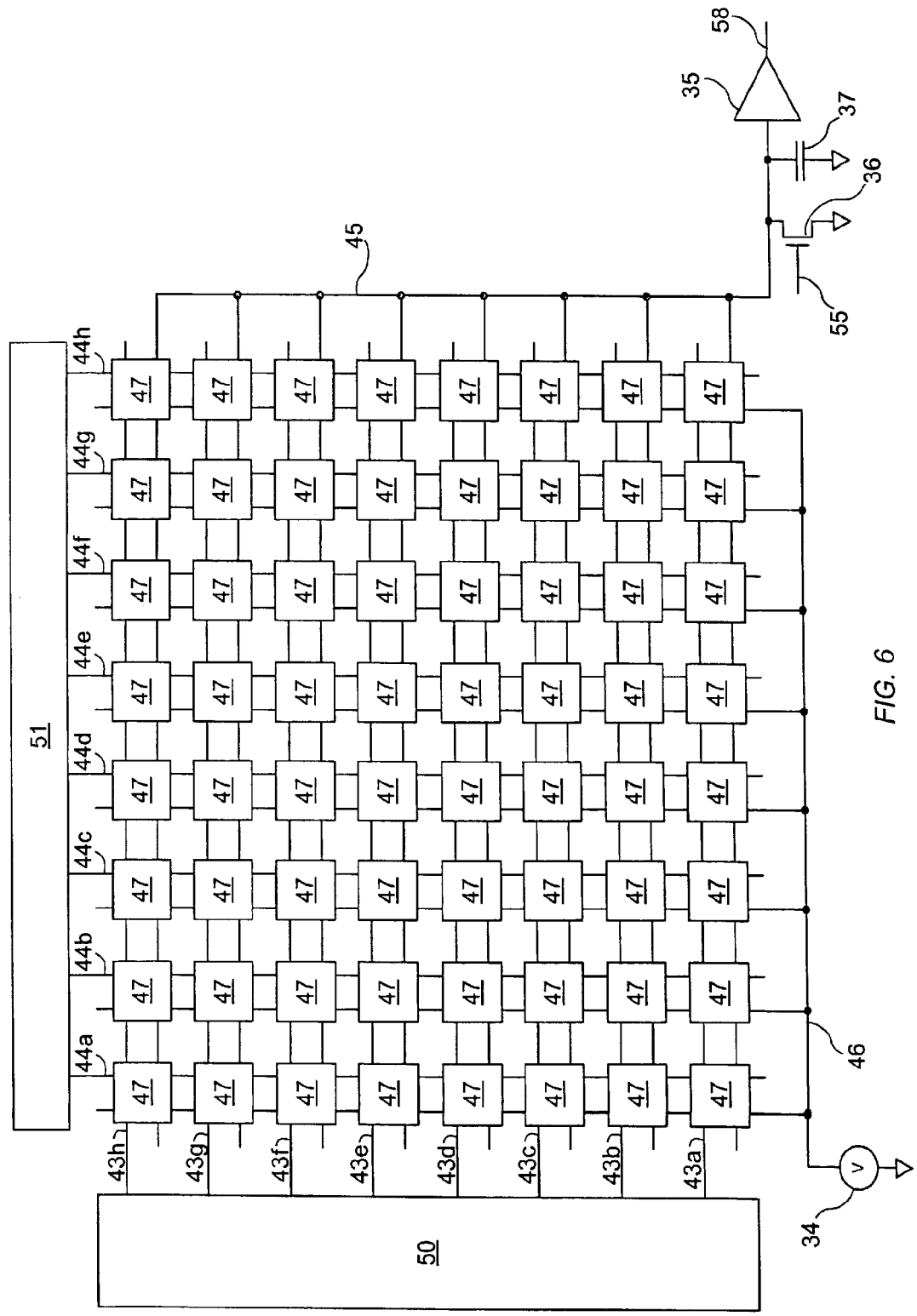
FIG. 6 is a block diagram showing a typical architecture for a 2D array of proximity sensors where all sensors share the same amplifier.

FIG. 5 shows the proximity sensor circuitry appropriate for use in a system comprising an array of proximity sensors 47 as in a multi-touch surface system. The proximity sensor 47 consists of the input transistor 30, the output transistor 31, the sensing electrode 33, the dielectric cover 32 for the sensing electrode 33, and conductive traces 43, 44, 45, and 46. The conductive traces are arranged so as to allow the proximity sensors 47 comprising a 2D array to be closely packed and to share the same conductive traces, thus reducing the number of wires needed in a system. FIG. 6 shows an example of such a system where the input nodes 46 of all proximity sensors are connected together and connected to a power supply 34. The output nodes 45 of all proximity sensors are connected together and connected to a single integrating capacitor 37, a single shorting transistor 36, and a single voltage-to-voltage amplifier 35. In this implementation, a single proximity sensor 47 is enabled at a time by applying a logic 1 signal first to its input gate 43 and then to its output gate 44. This gating of a single proximity sensor 47 one at a time is done by input gate controller 50 and output gate controller 51. For example, to enable the proximity sensor 47 in the lower right corner the input gate controller 50 would output a logic one pulse on conductive trace 43a. This is followed by a logic one pulse on conductive trace 44h produced by output gate controller 51. Repetition of this pulse as shown in FIG. 4B would cause charge to build up on integrating capacitor 37 and a corresponding voltage to appear at the output of the amplifier 58. The entire array of proximity sensors 47 is thus scanned by enabling a single sensor at a time and recording its output.

Figure 7A:
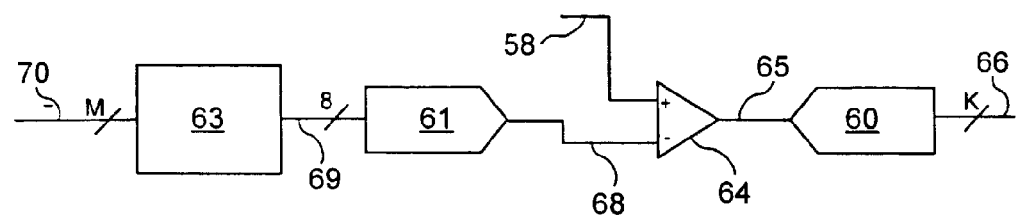
FIG. 7 is a block diagram of circuitry used to convert proximity sensor output to a digital code.

FIG. 7A is a schematic of typical circuitry useful for converting the proximity sensor output 58 to a digital code appropriate for processing by computer. The proximity sensor output 58 is typically non-zero even when there is no touch device (e.g., ref. no. 38 in FIG. 2) nearby. This non-zero signal is due to parasitic or stray capacitance present at the common node 48 of the proximity sensor and is of relatively constant value. It is desirable to remove this non-zero background signal before converting the sensor output 58 to a digital code. This is done by using a differential amplifier 64 to subtract a stored record of the background signal 68 from the sensor output 58. The resulting difference signal 65 is then converted to a digital code by an ADC (analog to digital converter) 60 producing a K-bit code 66. The stored background signal is first recorded by sampling the array of proximity sensors 47 (FIG. 6) with no touch devices nearby and storing a digital code specific for each proximity sensor 47 in a memory device 63. The particular code corresponding to the background signal of each proximity sensor is selected by an M-bit address input 70 to the memory device 63 and applied 69 to a DAC (digital to analog converter) 61.

Figure 7B:
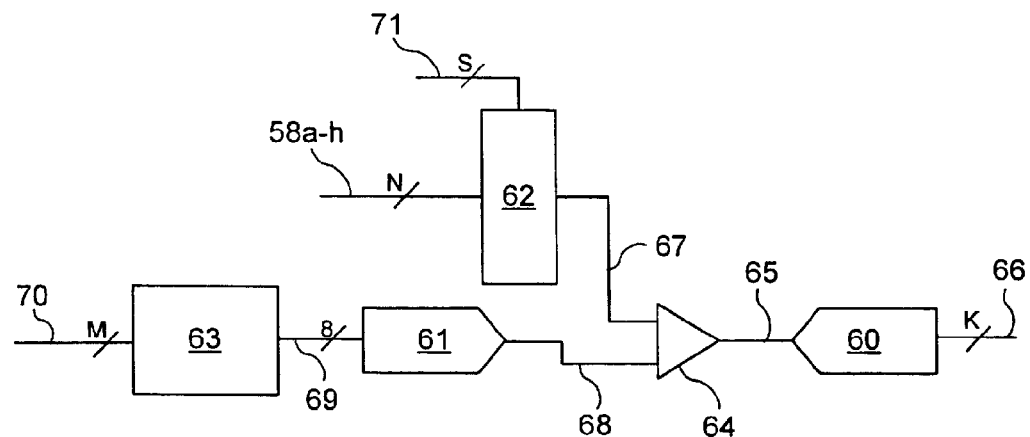
Figure 8:
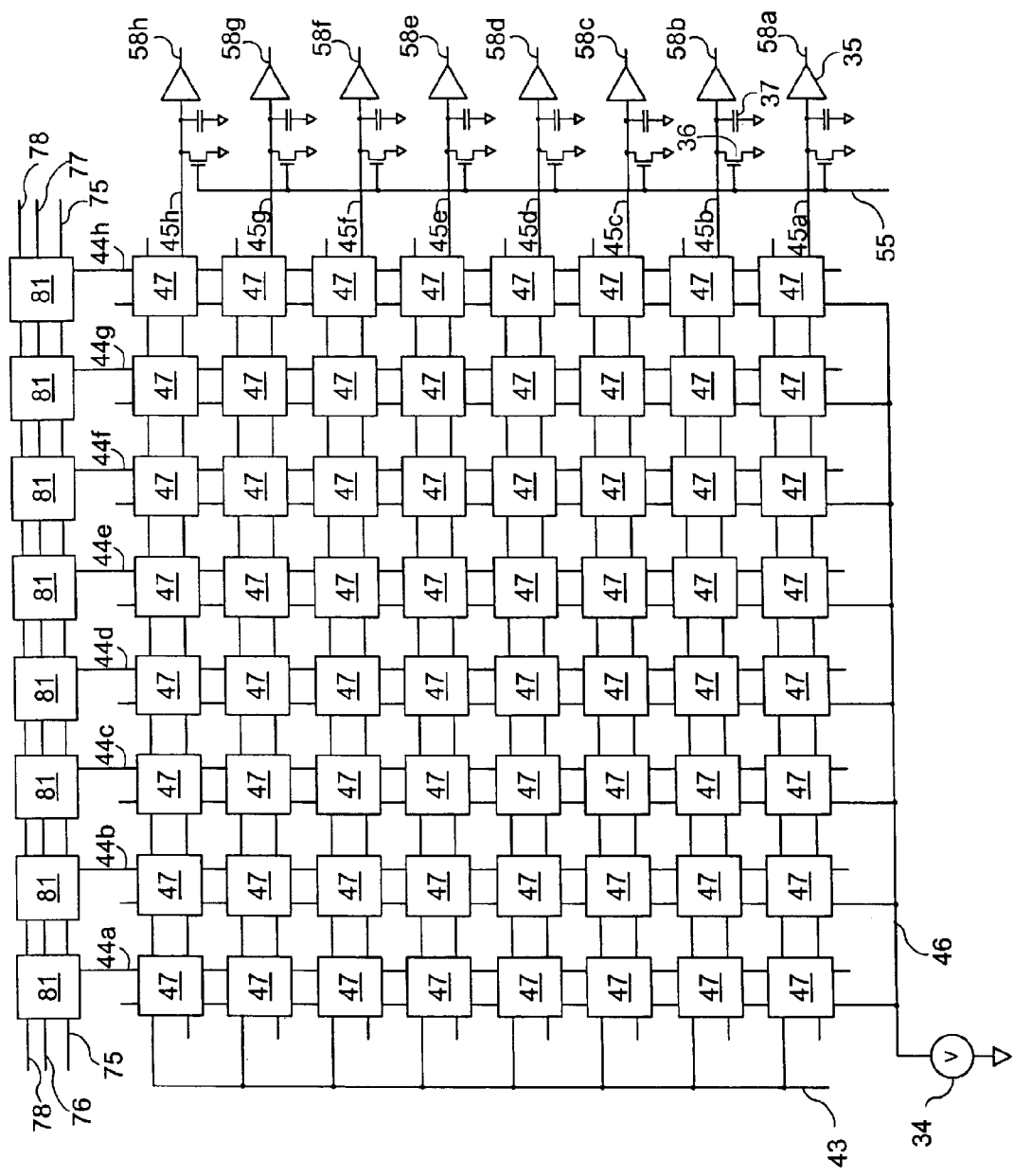
FIG. 8 is a block diagram showing a typical architecture for a 2D array of proximity sensors where sensors within a row share the same amplifier.

The 2D array of proximity sensors 47 shown in FIG. 6 can be connected in groups so as to improve the rate at which the entire array is scanned. This is illustrated in FIG. 8 where the groups are arranged as columns of proximity sensors. In this approach, the input nodes of the proximity sensors are connected together and connected to a power supply 34, as in FIG. 6. The output gates 44 are also connected in the same way. However, the input gates 43 are now all connected together and the output nodes 45 are connected to only those proximity sensors 47 within a row and to a dedicated voltage amplifier 35. With this connection method, all of the proximity sensors in a column are enabled at a time, thus reducing the time to scan the array by a factor N, where N is the number of proximity sensors in a group. The outputs 58a-h could connect to dedicated converter circuitry as shown in FIG. 7A or alternatively each output 58a-h could be converted one at a time using the circuitry shown in FIG. 7B. In this figure, the output signals from each group 58a-h are selected one at a time by multiplexer 62 and applied to the positive input of the differential amplifier 64. With this later approach, it is assumed that the ADC 60 conversion time is much faster than the sensor enable time, thus providing the suggested speed up in sensor array scanning.

Figure 9A:
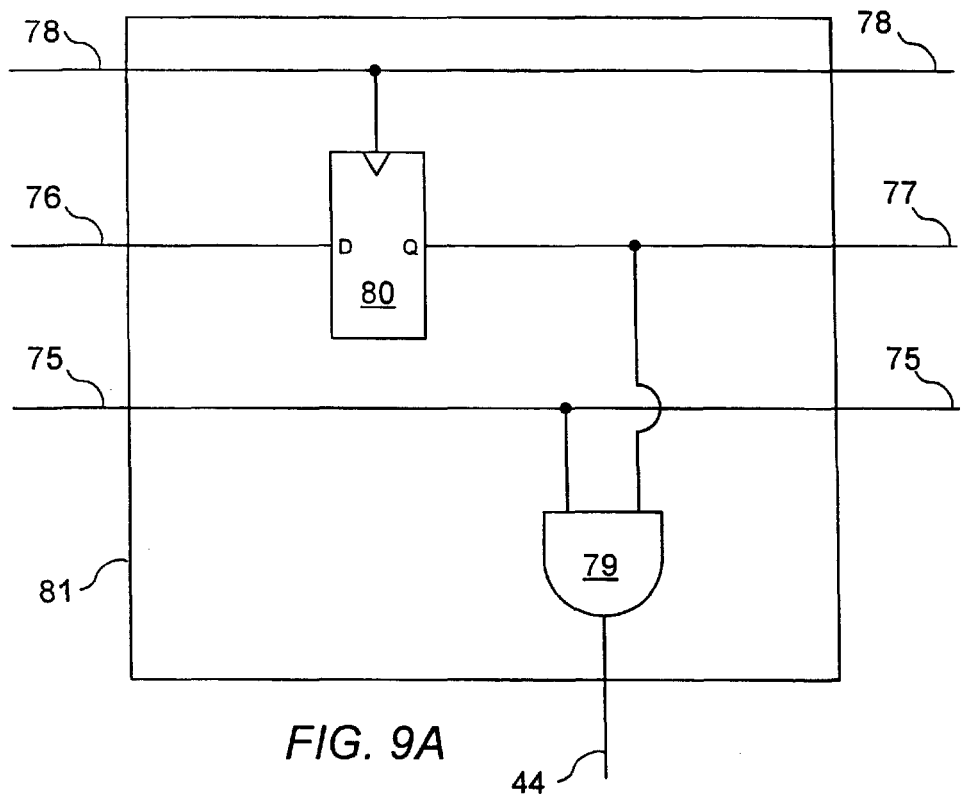
FIG. 9 is a schematic of a circuit useful for enabling the output gates of all proximity sensors within a group (arranged in columns)
Figure 9B:
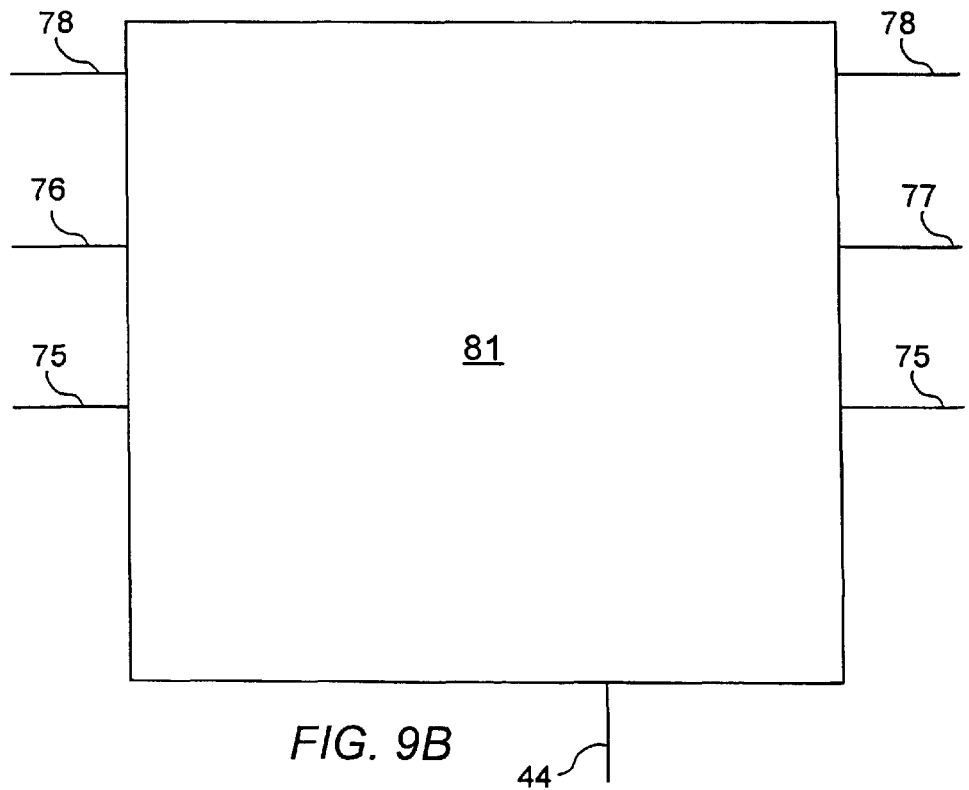

FIG. 9 shows a typical circuit useful for the control of the proximity sensor's output gate 44. It consists of three input signals 75, 76, 78 and two output signals 44, 77. The output gate signal 44 is logic 1 when both inputs to AND gate 79 are logic 1. The AND input signal 77 becomes logic 1 if input signal 76 is logic 1 when input signal 78 transitions from logic 0 to logic 1, otherwise it remains logic 0. A linear array of these circuits 81 can be connected end-to-end to enable the output gates of a single group of proximity sensors at a time as shown in FIG. 8.

Figure 10:
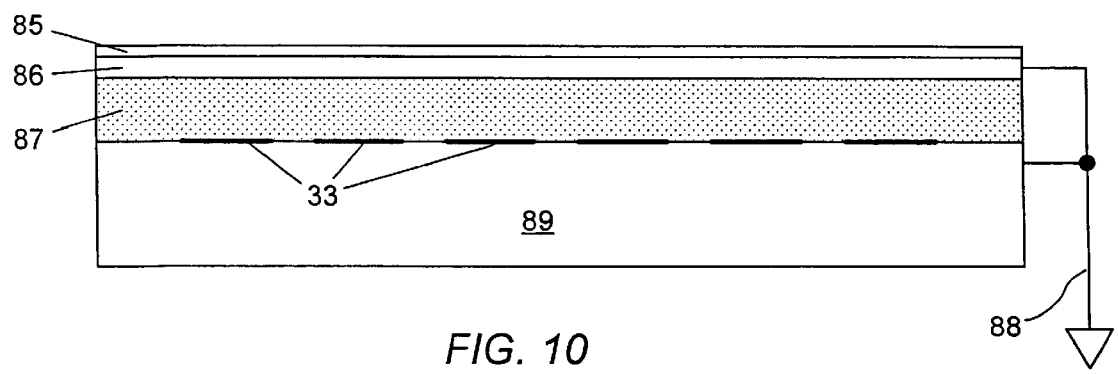
FIG. 10 is a side view of a 2D proximity sensor array that is sensitive to the pressure exerted by non-conducting touch objects.

FIG. 10 shows a cover for the multi-touch surface 89 that permits the system to be sensitive to pressure exerted by non-conducting touch objects (e.g., gloved fingers) contacting the multi-touch surface. This cover comprises a deformable dielectric touch layer 85, a deformable conducting layer 86, and a compliant dielectric layer 87. The touch surface 85 would have a symbol set printed on it appropriate for a specific application, and this surface could be removed and replaced with another one having a different symbol set. The conducting layer 86 is electrically connected 88 to the reference ground of the proximity sensor's power supply 34. When a touch object presses on the top surface 85 it causes the conducting surface 86 under the touch device to move closer to the sensing electrode 33 of the proximity sensor. This results in a change in the amount of charge stored on the sensing electrode 33 and thus the presence of the touch object can be detected. The amount of charge stored will depend on the pressure exerted by the touch object. More pressure results in more charge stored as indicated in Equation 1.

Figure 11:
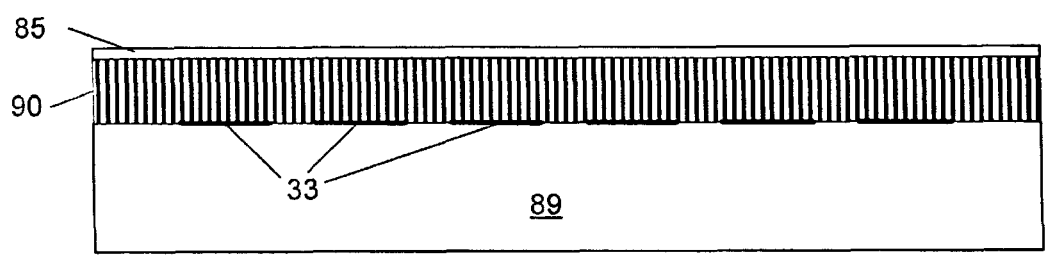
FIG. 11 is a, side view of a 2D proximity sensor array that provides a compliant surface without loss of spatial sensitivity.

To obtain a softer touch surface on the multi-touch device a thicker and more, compliant dielectric cover could be used. However, as the dielectric thickness increases the effect of the touch device on the sensing electrodes 33 spreads out thus lowering spatial resolution. A compliant anisotropically-conducting material can be used to counter this negative effect while also providing a soft touch surface. FIG. 11 shows a cover in which a compliant anisotropically-conducting material 90 is set between a thin dielectric cover 85 and the sensing electrodes 33. If the conductivity of the compliant material 90 is oriented mostly in the vertical direction, the image formed by a touch device on the surface 85 will be translated without significant spreading to the sensing electrodes 33, thus preserving spatial resolution while providing a compliant touch surface.

Figure 12:
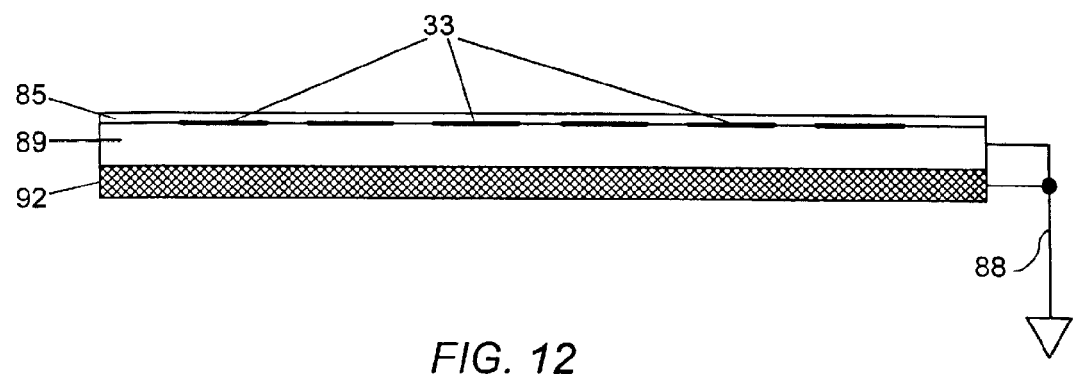
FIG. 12 is a side view of a 2D proximity sensor array that is sensitive to both the proximity of conducting touch objects and to the pressure exerted by non-conducting touch objects.

FIG. 12 shows a cross section of a multi-touch surface that senses both the proximity and pressure of a touch device. The touch layer 85 is a thin dielectric that separates touch devices from the sensing electrodes 33. Proximity sensing is relative to this surface. The electrodes 33 and associated switches and conductors are fabricated on a compliant material 89 which is attached to a rigid metal base 92. The metal base 92 is electrically connected 88 to the reference ground of the proximity sensor's power supply 34. When a touch device presses on the touch surface 85 it causes the sensing electrodes 33 directly below to move closer to the rigid metal base 92. The distance moved depends on the pressure applied and thus the pressure exerted by a touch device can be detected as described before.

Figure 13:
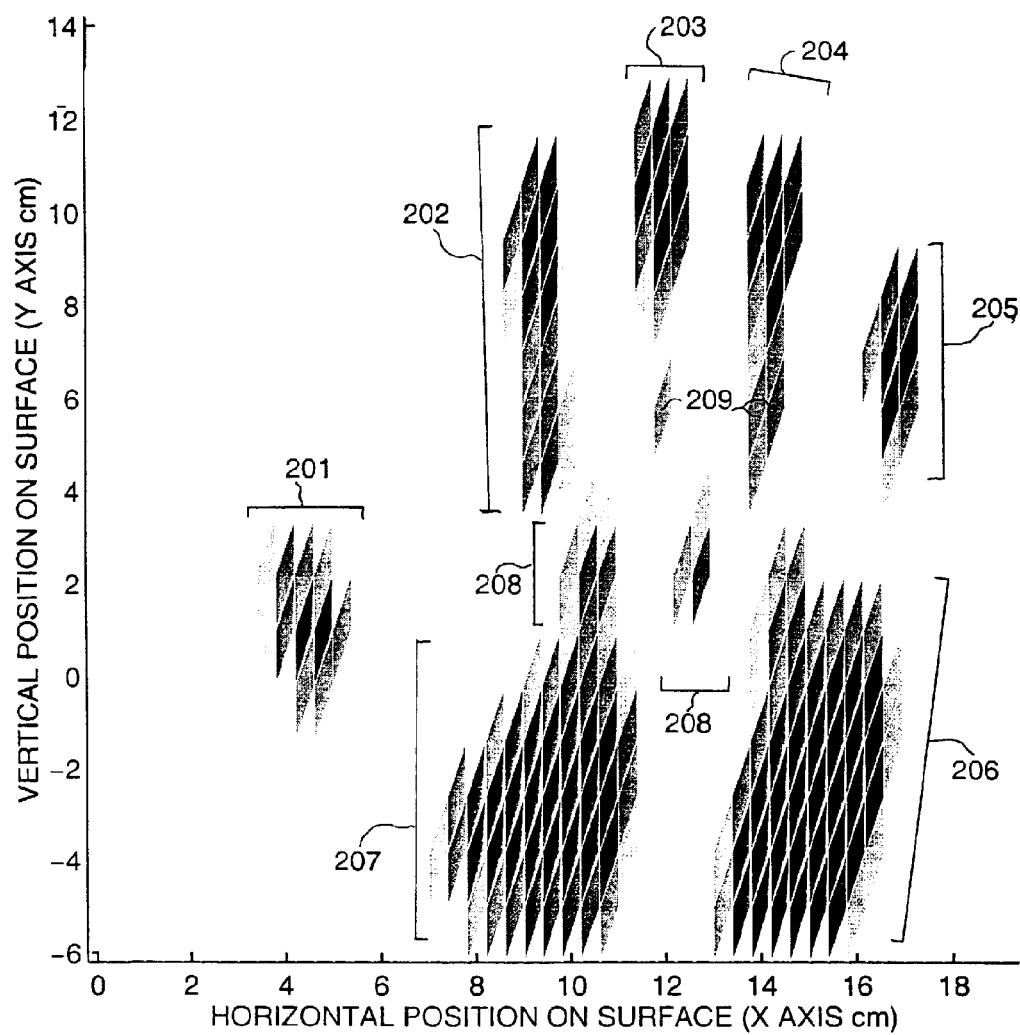
FIG. 13 is an example proximity image of a hand flattened onto the surface with fingers outstretched.
Figure 14:
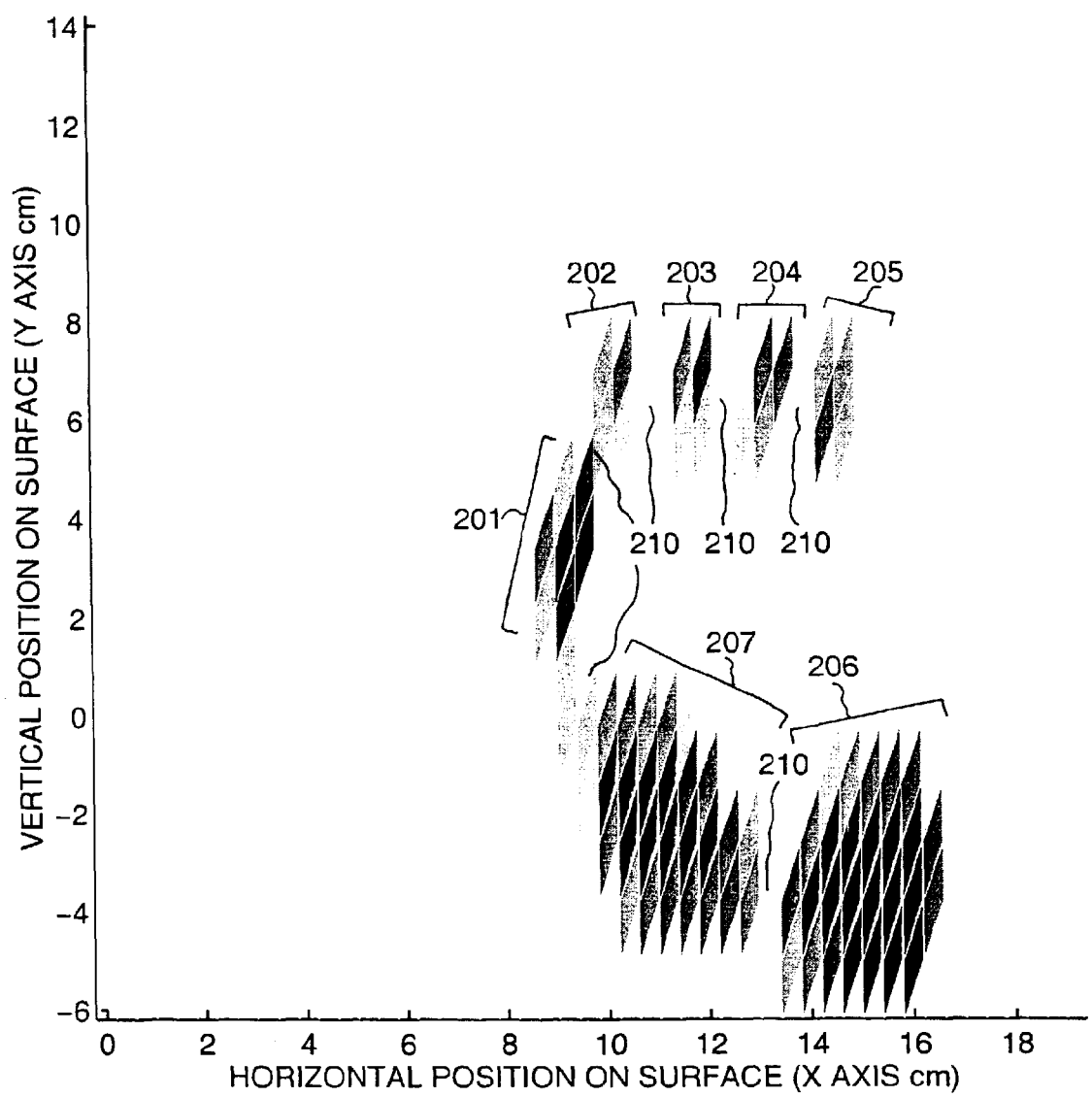
FIG. 14 is an example proximity image of a hand partially closed with fingertips normal to surface.
Figure 15:
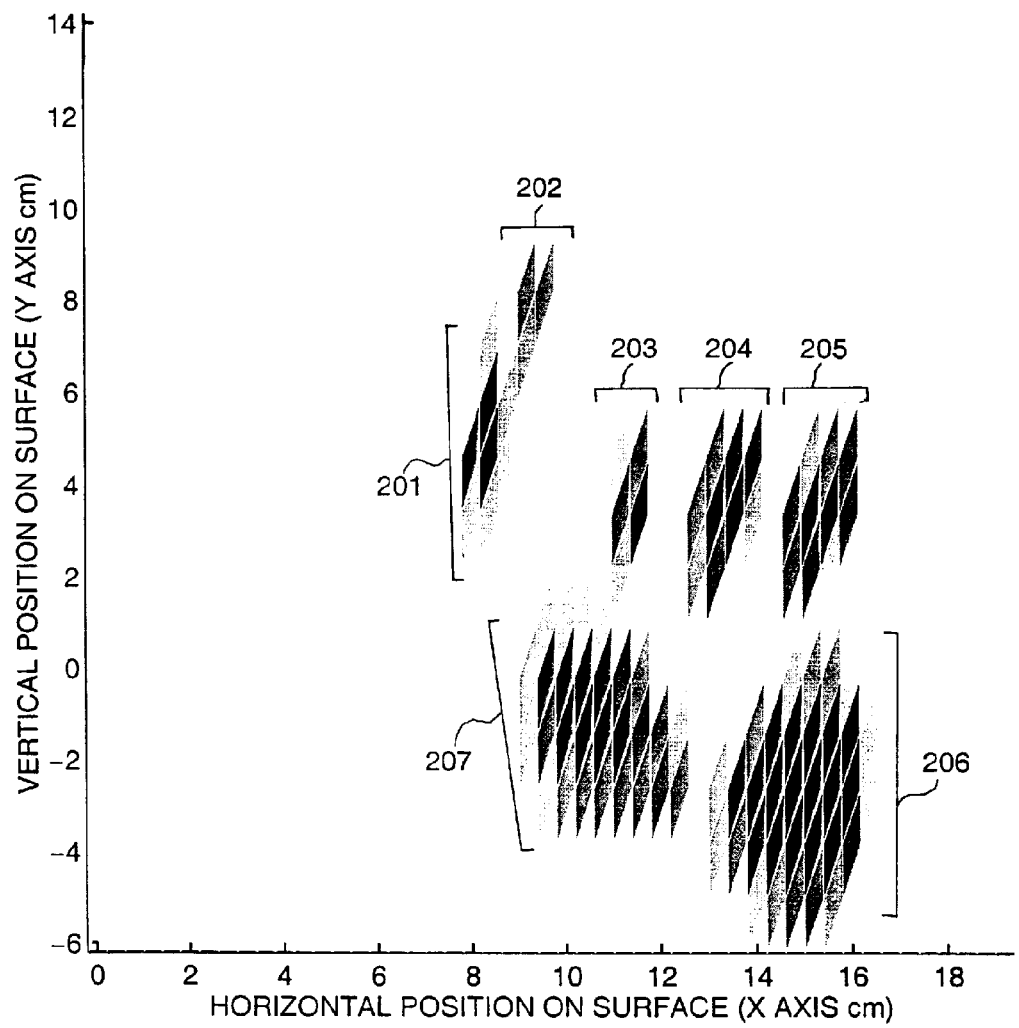
FIG. 15 is an example proximity image of a hand in the pen grip configuration with thumb and index fingers pinched.

To illustrate typical properties of hand contacts as they appear in proximity images, FIGS. 13-15 contain sample images captured by a prototype array of parallelogram-shaped electrodes. Shading of each electrode darkens to indicate heightened proximity signals as flesh gets closer to the surface, compresses against the surface due to hand pressure, and overlaps the parallelogram more completely. Note that the resolution of these images is in no way intended to limit the scope of the invention, since certain applications such as handwriting recognition will clearly require finer electrode arrays than indicated by the electrode size in these sample images. In the discussion that follows, the proximity data measured at one electrode during a particular scan cycle constitutes one "pixel" of the proximity image captured in that scan cycle.

FIG. 13 shows a right hand flattened against the surface with fingers outstretched. At the far left is the oblong thumb 201 which tends to point off at about 120-degrees. The columnar blobs arranged in an arc across the top of the image are the index finger 202, middle finger 203, ring finger 204 and pinky finger 205. Flesh from the proximal finger joint, or proximal phalanges 209, will appear below each fingertip if the fingers are fully extended. The inner 207 and outer 206 palm heels cause the pair of very large contacts across the bottom of the image. Forepalm calluses 213 are visible at the center of the hand if the palm is fully flattened. This image shows that all the hand contacts are roughly oval-shaped, but they differ in pressure, size, orientation, eccentricity and spacing relative to one another. This image includes all of the hand parts which can touch the surface from the bottom of one hand but in many instances only a few of these parts will be touching the surface, and the fingertips may roam widely in relation to the palms as fingers are flexed and extended.

FIG. 14 shows another extreme in which the hand is partially closed. The thumb 201 is adducted toward the fingertips 202-208 and the fingers are flexed so the fingertips come down normal instead of tangential to the surface. The height and intensity of fingertip contacts is lessened somewhat because the boney tip rather than fleshy pulp pad is actually touching the surface, but fingertip width remains the same. Adjacent fingertips 202-205 and thumb 201 are so close together as to be distinguishable only by slight proximity valleys 210 between them. The proximal phalange finger joints are suspended well above the surface and do not appear in the image, nor do the forepalm calluses. The palm heels 206, 207 are somewhat shorter since only the rear of the palm can touch the surface when fingers are flexed, but the separation between them is unchanged. Notice that the proximity images are uncluttered by background objects. Unlike optical images, only conductive objects within a few millimeters of the surface show up at all.

FIG. 15 is a proximity image of a right hand in a pen grip configuration. The thumb 201 and index fingertip 202 are pinched together as if they were holding a pen but in this case they are touching the surface instead. Actually the thumb and index finger appear the same here as in FIG. 14. However, the middle 203, ring 204, and pinky 205 fingers are curled under as if making a fist, so the knuckles from the top of the fingers actually touch the surface instead of the finger tips. The curling under of the knuckles actually places them behind the pinched thumb 201 and index fingertip 202 very close to the palm heels 206, 207. The knuckles also appear larger than the curled fingertips of FIG. 14 but the same size as the flattened fingertips in FIG. 13. These differences in size and arrangement will be measured by the pen grip detector 17 to distinguish this pen grip configuration from the closed and flattened hand configurations.

Figure 16:
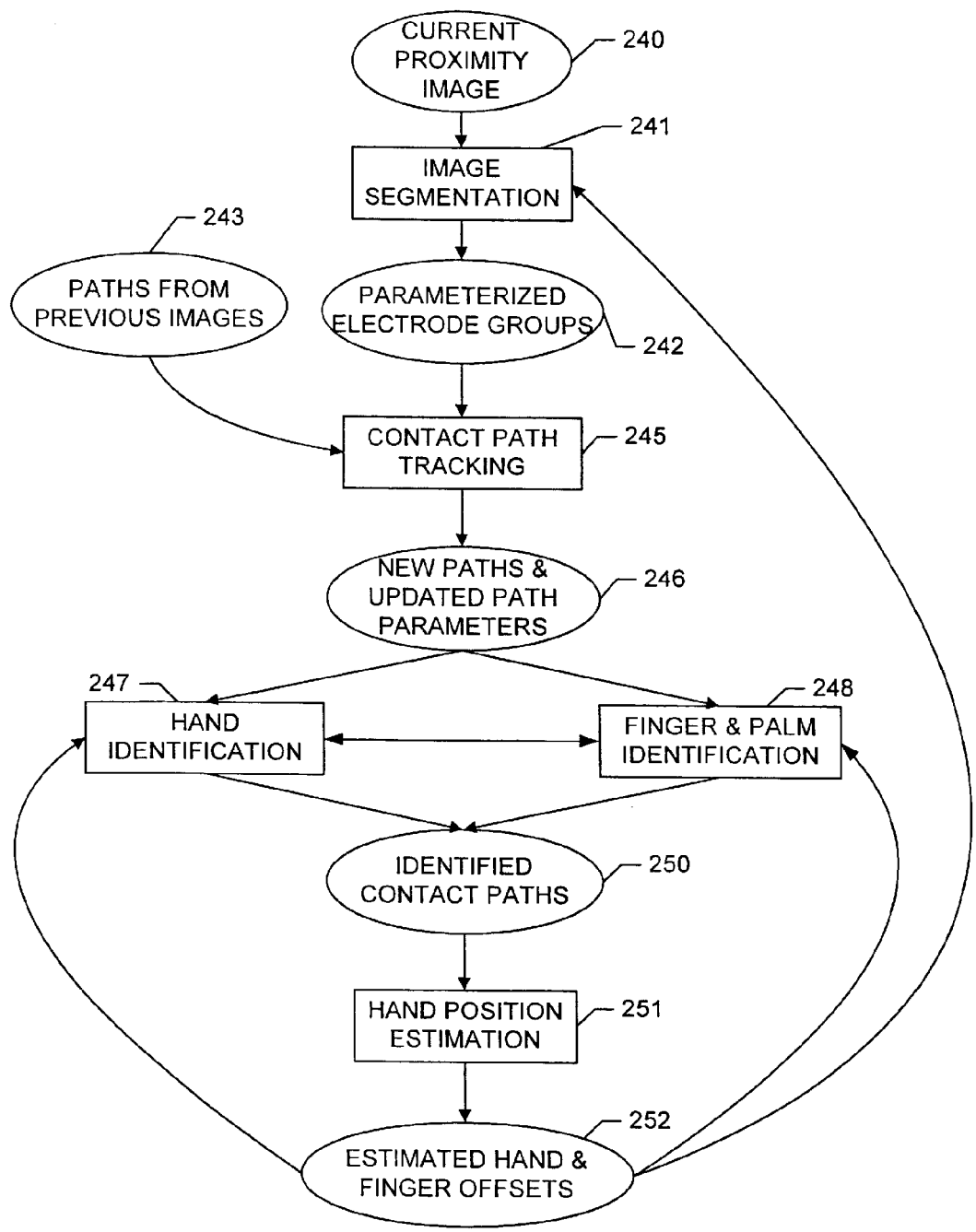
FIG. 16 is a data flow diagram of the hand tracking and contact identification system.

FIG. 16 represents the data flow within the contact tracking and identification module 10. The image segmentation process 241 takes the most recently scanned proximity image data 240 and segments it into groups of electrodes 242 corresponding to the distinguishable hand parts of FIG. 13. The filtering and segmentation rules applied in particular regions of the image are partially determined by feedback of the estimated hand offset data 252. The image segmentation process 241 outputs a set of electrode group data structures 242 which are parameterized by fitting an ellipse to the positions and proximity measurements of the electrodes within each group.

The path tracking process 245 matches up the parameterized electrode groups 242 with the predicted continuations of contact path data structures 243 extracted from previous images. Such path tracking ensures continuity of contact representation across proximity images. This makes it possible to measure the velocity of individual hand contacts and determine when a hand part lifts off the surface, disappearing from future images. The path tracking process 245 updates the path positions, velocities, and contact geometry features from the parameters of the current groups 242 and passes them on to the contact identification processes 247 and 248. For notational purposes, groups and unidentified paths will be referred to by data structure names of the form Gi and Pi respectively, where the indices i are arbitrary except for the null group G0 and null path P0. Particular group and path parameters will be denoted by subscripts to these structure names and image scan cycles will be denoted by bracketed indices, so that, for example, $P2_x[n]$ represents the horizontal position of path 2 in the current proximity image, and $P2_x[n-1]$ represents the position in the previous proximity image. The contact identification system is hierarchically split into a hand identification process 247 and within-hand finger and palm identification process 248. Given a hand identification for each contact, the finger and palm identification process 248 utilizes combinatorial optimization and fuzzy pattern recognition techniques to identify the part of the hand causing each surface contact. Feedback of the estimated hand offset helps identify hand contacts when so few contacts appear in the image that the overall hand structure is not apparent.

The hand identification process 247 utilizes a separate combinatorial optimization algorithm to find the assignment of left or right hand identity to surface contacts which results in the most biomechanically consistent within-hand identifications. It also receives feedback of the estimated hand and finger offsets 252, primarily for the purpose of temporarily storing the last measured hand position after fingers in a hand lift off the surface. Then if the fingers soon touch back down in the same region they will more likely receive their previous hand identifications.

The output of the identification processes 247 and 248 is the set of contact paths with non-zero hand and finger indices attached. For notational purposes identified paths will be referred to as F0 for the unidentified or null finger, F1 for the thumb 201, F2 for the index finger 202, F3 for the middle finger 203, F4 for the ring finger 204, F5 for the pinky finger 205, F6 the outer palm heel 206. F7 for the inner palm heel 207, and F8 for the forepalm calluses 208. To denote a particular hand identity this notation can be prefixed with an L for left hand or R for right hand, so that, for example, RF2 denotes the right index finger path. When referring to a particular hand as a whole. LH denotes the left hand and RH denotes the right hand. In the actual algorithms left hand identity is represented by a −1 and right hand by +1, so it is easy to reverse the handedness of measurements taken across the vertical axis of symmetry.

It is also convenient to maintain for each hand a set of bitfield data registers for which each bit represents touchdown, continued contact or liftoff of a particular finger. Bit positions within each bit field correspond to the hand part indices above. Such registers can quickly be tested with a bit mask to determine whether a particular subset of fingers has touched down. Alternatively, they can be fed into a lookup table to find the input events associated with a particular finger chord (combination of fingers). Such finger identity bitfields are needed primarily by the synchronization detector 14 and chord motion recognizer 18.

The last process within the tracking and identification subsystem is the hand position estimator 251, which as described above provides biasing feedback to the identification and segmentation processes. The hand position estimator is intended to provide a conservative guess 252 of lateral hand position under all conditions including when the hand is floating above the surface without touching. In this case the estimate represents a best guess of where the hand will touch down again. When parts of a hand are touching the surface, the estimate combines the current position measurements of currently identified hand parts with past estimates which may have been made from more or less reliable identifications.

The simplest but inferior method of obtaining a hand position measurement would be to average the positions of all the hand's contacts regardless of identity. If hand parts 201-207 were all touching the surface as in FIG. 13 the resulting centroid would be a decent estimate, lying somewhere under the center of the palm since the fingers and palm heels typically form a ring around the center of the palm. However, consider when only one hand contact is available for the average. The estimate would assume the hand center is at the position of this lone contact, but if the contact is from the right thumb the hand center would actually be 4-8 cm to the right, or if the contact is from a palm heel the hand center is actually 4-6 cm higher, or if the lone contact is from the middle finger the hand center should actually be actually 4-6 cm lower.

Figure 17:
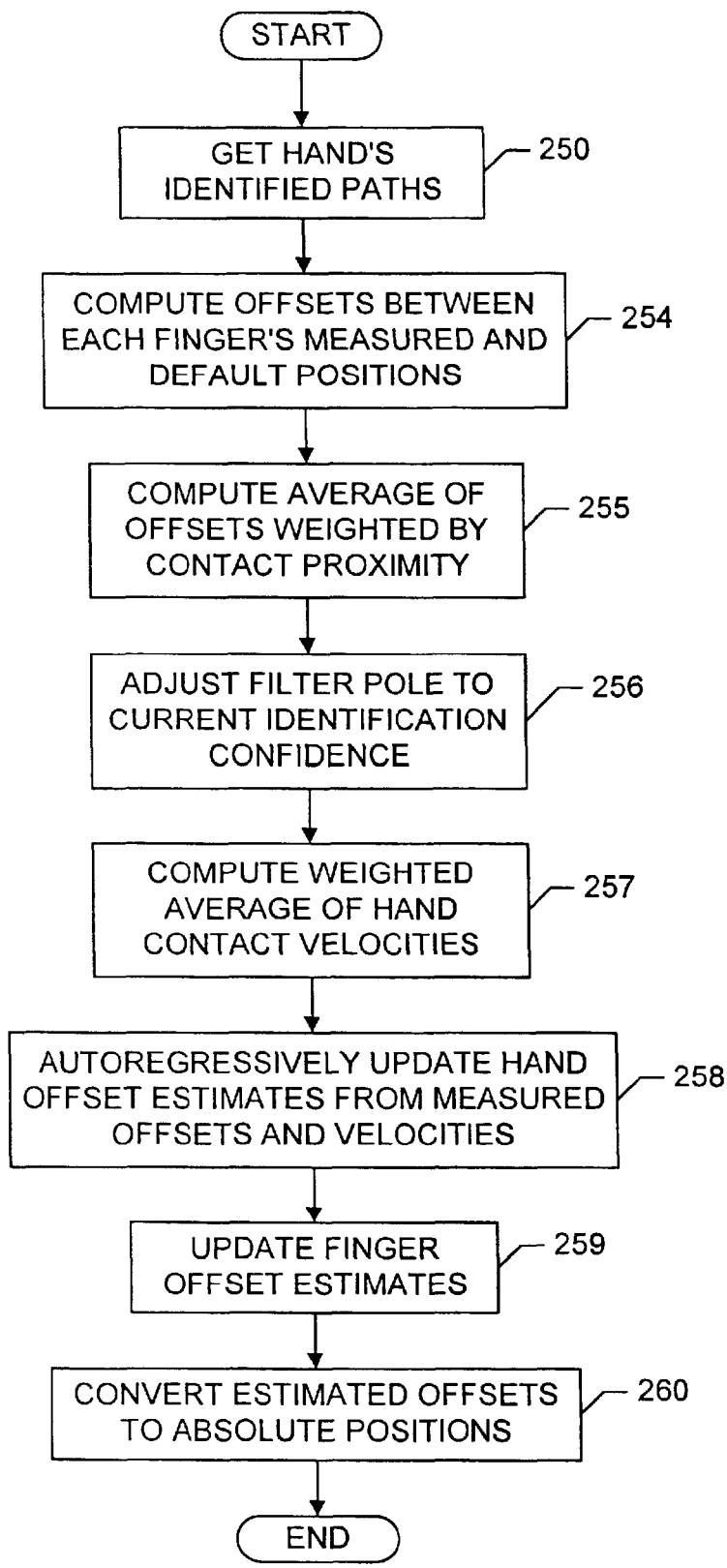
FIG. 17 is a flow chart of hand position estimation.

FIG. 17 shows the detailed steps within the hand position estimator 251. The steps must be repeated for each hand separately. In a preferred embodiment, the process utilizes the within-hand contact identifications (250) to compute (step 254) for each contact an offset between the measured contact position ($Fi_x[n]$, $Fi_y[n]$) and the default position of the particular finger or palm heel ($Fi_{defx}$, $Fi_{defy}$) with hand part identity i. The default positions preferably correspond to finger and palm positions when the hand is in a neutral posture with fingers partially closed, as when resting on home row of a keyboard. Step 255 averages the individual contact offsets to obtain a measured hand offset, ($H_{max}[n]$, $H_{moy}[n]$):

$$H_{mox}[n] = \frac{\sum_{i=1}^{i=7} Fi_{mow}[n](Fi_x[n] - Fi_{defx})}{\sum_{i=1}^{i=7} Fi_{mow}[n]} \quad (3)$$

$$H_{moy}[n] = \frac{\sum_{i=1}^{i=7} Fi_{mow}[n](Fi_y[n] - Fi_{defy})}{\sum_{i=1}^{i=7} Fi_{mow}[n]} \quad (4)$$

Preferably the weighting $Fi_{mow}[n]$ of each finger and palm heel is approximately its measured total proximity, i.e., $Fi_{mow}[n]=Fi_z[n]$. This ensures that lifted fingers, whose proximity is zero, have no influence on the average, and that contacts with lower than normal proximity, whose measured positions and identities are less accurate, have low influence. Furthermore, if palm heels are touching, their large total proximities will dominate the average. This is beneficial because the palm heels, being immobile relative to the hand center compared to the highly flexible fingers, supply a more reliable indication of overall hand position. When a hand is not touching the surface, i.e., when all proximities are zero, the measured offsets are set to zero. This will cause the filtered hand position estimate below to decay toward the default hand position.

As long as the contact identifications are correct, this hand position measurement method eliminates the large errors caused by assuming lone contacts originate from the center of the hand. Flexing of fingers from their default positions will not perturb the measured centroid more than a couple centimeters. However, this scheme is susceptible to contact misidentification, which can cause centroid measurement errors of up to 8 cm if only one hand part is touching. Therefore, the current measured offsets are not used directly, but are averaged with previous offset estimates ($H_{eox}[n-1]$, $H_{eoy}[n-1]$) using a simple first-order autoregressive filter, forming current offset estimates ($H_{eox}[n]$, $H_{eoy}[n]$).

Step 256 adjusts the filter pole $H_{oa}[n]$ according to confidence in the current contact identifications. Since finger identifications accumulate reliability as more parts of the hand contact the surface one simple measure of identification confidence: is the number of fingers which have touched down from the hand since the hand last left the surface. Contacts with large total proximities also improve identification reliability because they have strong disambiguating features such as size and orientation. Therefore $H_{oa}[n]$ is set roughly proportional to the maximum finger count plus the sum of contact proximities for the hand. $H_{oa}[n]$ must of course be normalized to be between zero and one or the filter will be unstable. Thus when confidence in contact identifications is high, i.e., when many parts of the hand firmly touch the surface, the autoregressive filter favors the current offset measurements. However, when only one or two contacts have reappeared since hand liftoff, the filter emphasizes previous offset estimates in the hope that they were based upon more reliable identifications.

The filtered offsets must also maintain a conservative estimate of hand position while the hand is floating above the surface for optimal segmentation and identification as the hand touches back down. If a hand lifts off the surface in the middle of a complex sequence of operations and must, quickly touch down again, it will probably touch down close to where it lifted off. However, if the operation sequence has ended, the hand is likely to eventually return to the neutral posture, or default position, to rest. Therefore, while a hand is not touching the surface, $H_{oa}[n]$ is made small enough that the estimated offsets gradually decay to zero at about the same rate as a hand lazily returns to default position.

When $H_{oa}[n]$ is made small due to low identification confidence, the filter tracking delay becomes large enough to lag behind a pair of quickly moving fingers by several centimeters. The purpose of the filter is to react slowly to questionable changes in contact identity, not to smooth contact motion. This motion tracking delay can be safely eliminated by adding the contact motion measured between images to the old offset estimate. Step 257 obtains motion from the average, ($H_{mvx}[n]$, $H_{mvy}[n]$) of the current contact velocities:

$$H_{mvx}[n] = \frac{\sum_{i=1}^{i=7} Fi_{mow}[n] Fi_{vx}[n]}{\sum_{i=1}^{i=7} Fi_{mow}[n]} \quad (5)$$

$$H_{mvy}[n] = \frac{\sum_{i=1}^{i=7} FI_{mow}[n] Fi_{vy}[n]}{\sum_{i=1}^{i=7} Fi_{mow}[n]} \quad (6)$$

The current contact velocities. ($Fi_{vx}[n]$, $F_{vy}[n]$), are retrieved from the path tracking process 245, which measures them independent of finger identity. Step 258 updates the estimated hand offsets ($H_{eox}[n]$, $H_{eoy}[n]$) using the complete filter equations:

$$H_{eox}[n] = H_{oa}[n] H_{mox}[n] + (1 - H_{oa}[n])(H_{eox}[n-1] + H_{mox}[n]\Delta t) \quad (7)$$

$$H_{eoy}[n] = H_{oa}[n] H_{moy}[n] + (1 - H_{oa}[n])(H_{eoy}[n-1] + H_{moy}[n]\Delta t) \quad (8)$$

Finally, to provide a similarly conservative estimate of the positions of particular fingers step 259 computes individual finger offsets ($Fi_{eox}[n]$, $Fi_{eoy}[n]$) from the distance between identified contacts and their corresponding default finger positions less the estimated hand offsets. For each identifiable contact i, the offsets are computed as:

$$Fi_{eox}[n] = H_{oa}[n](H_{mox}[n] + Fi_x[n] - Fi_{defx}) + (1 - H_{oa}[n])(Fi_{eox}[n-1] + Fi_{vx}[n]\Delta t) \quad (9)$$

$$FI_{eoy}[n] = H_{oa}[n](H_{moy}[n] + Fi_y[n] - Fi_{defy}) + (1 - H_{oa}[n])(Fi_{eoy}[n-1] + Fi_{vy}[n]\Delta t) \quad (10)$$

These finger offsets reflect deviations of finger flexion and extension from the neutral posture. If the user places the fingers in an extreme configuration such as the flattened hand configuration, the collective magnitudes of these finger offsets can be used as an indication of user hand size and finger length compared to the average adult.

The parameters ($H_{eox}[n]$, $H_{eoy}[n]$) and ($Fi_{eox}[n]$, $Fi_{eoy}[n]$) for each hand and finger constitute the estimated hand and finger offset data 252, which is fed back to the segmentation and identification processes during analysis of the next proximity image. If the other processes need the estimate in absolute coordinates, they can simply add (step 260) the supplied offsets to the default finger positions, but in many cases the relative offset representation is actually more convenient.

It should be clear to those skilled in the art that many improvements can be made to the above hand position estimation procedure which remain well within the scope of this invention, especially in the manner of guessing the position of lifted hands. One improvement is to make the estimated hand offsets decay toward zero at a constant speed when a hand is lifted rather than decay exponentially. Also, the offset computations for each hand have been independent as described so far. It is actually advantageous to impose a minimum horizontal separation between the estimated left hand position and estimated right hand position such that when a hand such as the right hand slides to the opposite side of the board while the other hand is lifted, the estimated position of the other hand is displaced. In this case the estimated position of the lifted left hand would be forced from default to the far left of the surface, possibly off the surface completely. If the right hand is lifted and the left is not, an equation like the following can be applied to force the estimated right hand position out of the way:

$$Rh_{eox}[n] := \min(RH_{eox}[n], (LF1_{defx} - RF1_{defx}) + Lh_{eox}[n] + \min\_hard\_sep) \quad (11)$$

where ($LF1_{defx} - RF1_{defx}$) is the default separation between left and right thumbs, is the minimum horizontal separation to be imposed, and $LH_{eox}[n]$ is the current estimated offset of the left hand.

Figure 18:
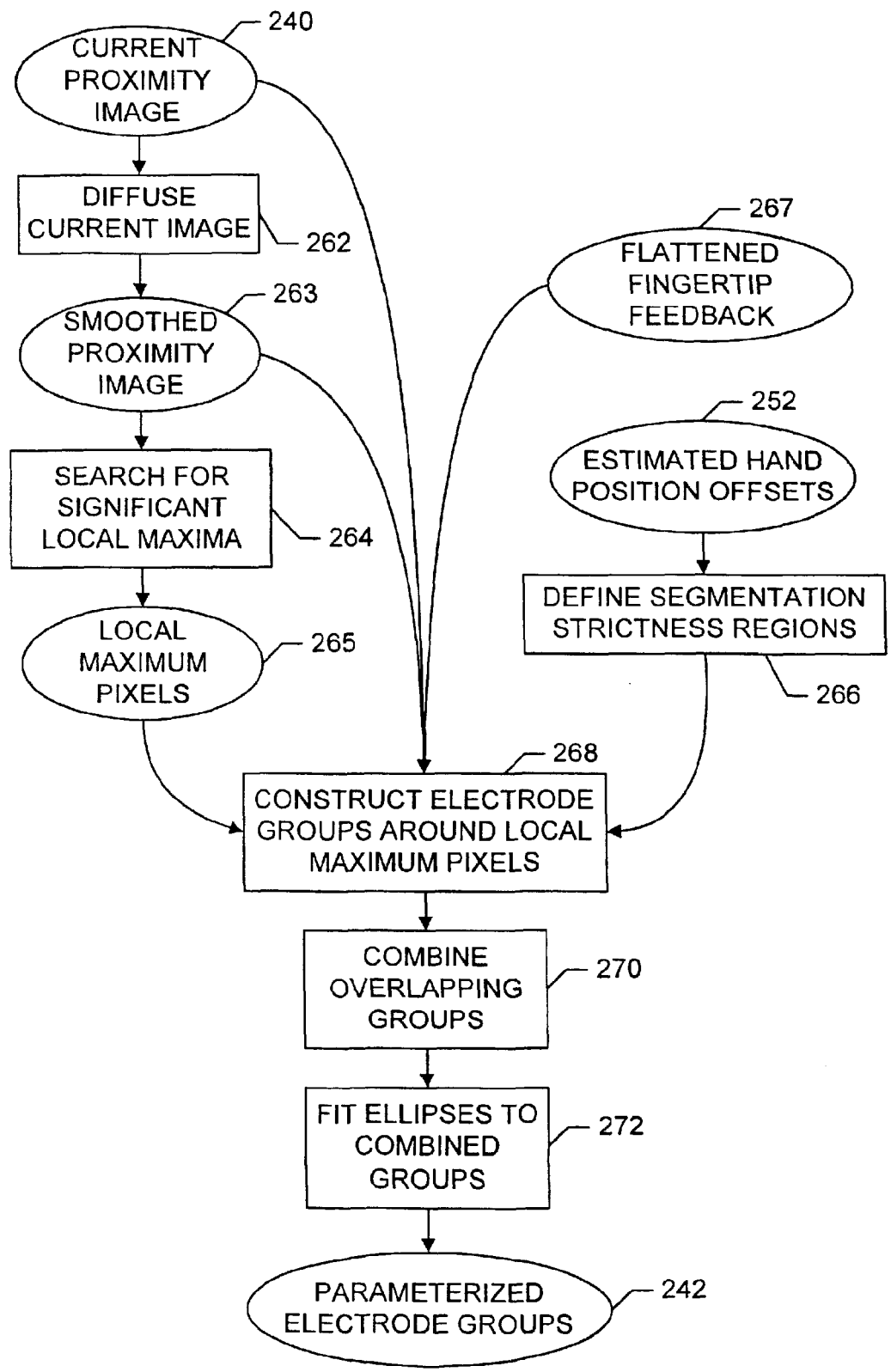
FIG. 18 is a data flow diagram of proximity image segmentation.

FIG. 18 represents the data flow within the proximity image segmentation process 241. Step 262 makes a spatially smoothed copy 263 of the current proximity image 240 by passing a two-dimensional diffusion operator or Gaussian kernel over it. Step 264 searches the smoothed image 263 for local maximum pixels 265 whose filtered proximity exceeds a significance threshold and exceeds the filtered proximities of nearest neighbor pixels. The smoothing reduces the chance that an isolated noise spike on a single electrode will result in a local maximum-which exceeds the significance threshold, and consolidates local maxima to about one per distinguishable fleshy contact.

Figure 19:
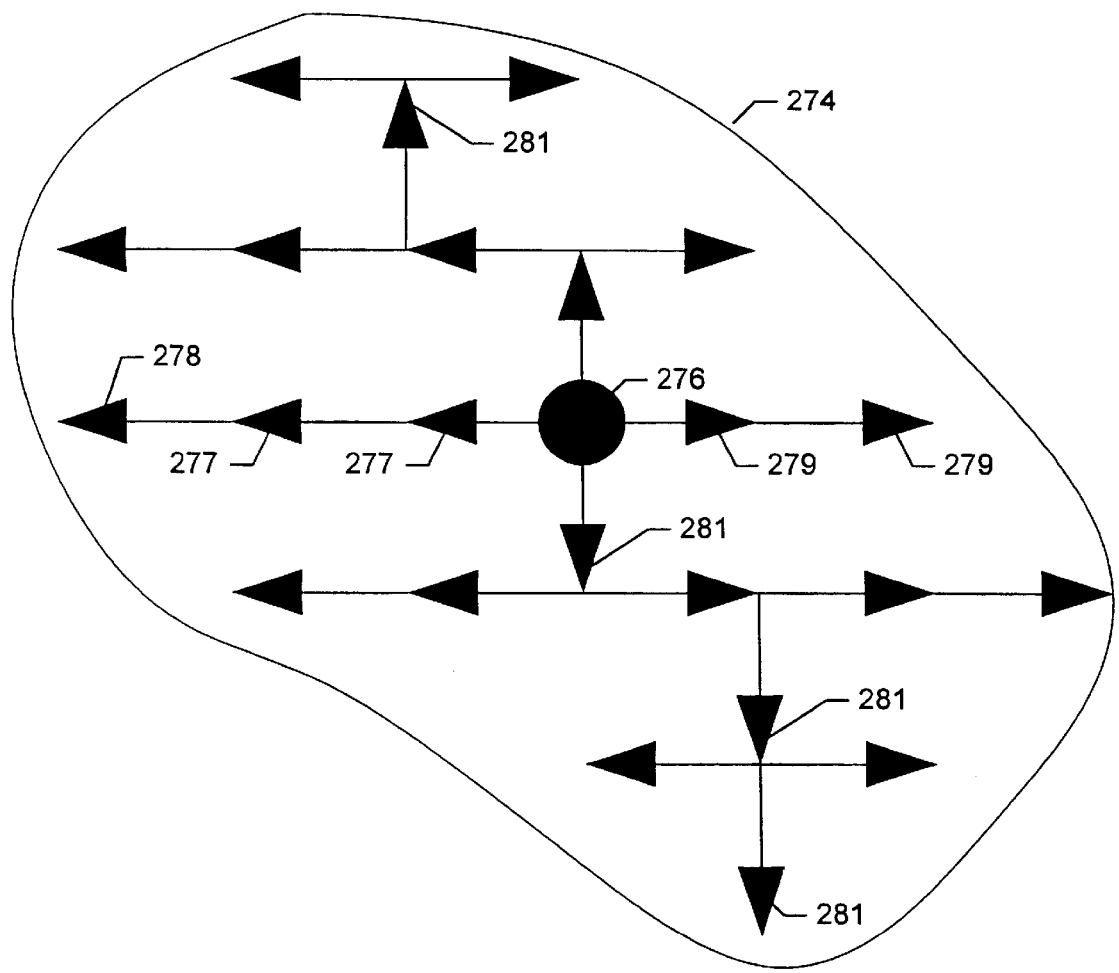
FIG. 19 is a diagram of the boundary search pattern during construction of an electrode group.

Process 268 then constructs a group of electrodes or pixels which register significant proximity around each local maximum pixel by searching outward from each local maximum for contact edges. Each electrode encountered before reaching a contact boundary is added to the local maximum's group. FIG. 19 shows the basic boundary electrode search pattern for an example contact boundary 274. In this diagram, an electrode or image pixel lies at the tip of each arrow. The search starts at the local maximum pixel 276, proceeds to the left pixels 277 until the boundary 274 is detected. The last pixel before the boundary 278 is marked as an edge pixel, and the search resumes to the right 279 of the local maximum pixel 276. Once the left and right edges of the local maximum's row have been found, the search recurses to the rows above and below, always starting 281 in the column of the pixel in the previous row which had the greatest proximity. As the example illustrates, the resulting set of pixels or electrodes is connected in the mathematical sense but need not be rectangular. This allows groups to closely fit the typical oval-shape of flesh contacts without leaving electrodes out or including those from adjacent contacts.

If contacts were small and always well separated, edges could simply be established wherever proximity readings fell to the background level. But sometimes fingertips are only separated by a slight valley or shallow saddle point 210. To segment adjacent fingertips the partial minima of these valleys must be detected and used as group boundaries. Large palm heel contacts, on the other hand, may exhibit partial minima due to minor nonuniformities in flesh proximity across the contact. If all electrodes under the contact are to be collected in a single group, such partial minima must be ignored. Given a hand position estimate the segmentation system can apply strict edge detection rules in regions of the image where fingertips and thumb are expected to appear but apply sloppy edge detection rules in regions of the image where palms are expected to, appear. This ensures that adjacent fingertips are not joined into a single group and that each palm heel is not broken into multiple groups.

Figure 20A:
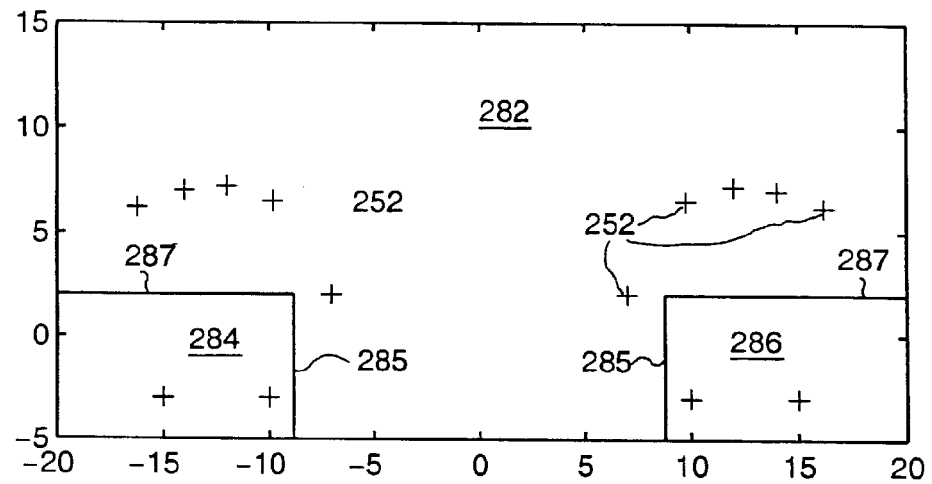
FIG. 20A is a diagram of the segmentation strictness regions with both hands in their neutral, default position on surface.
Figure 20B:
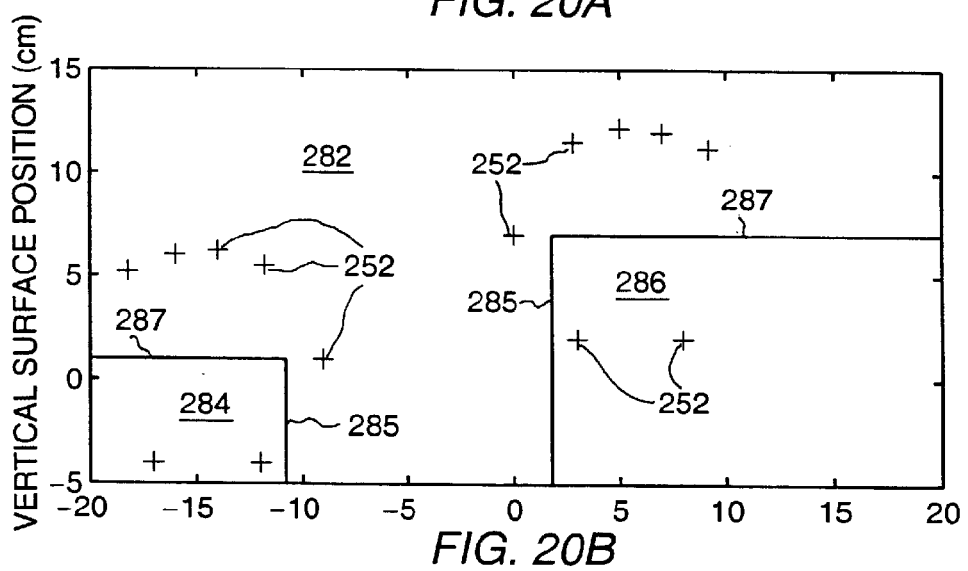
FIG. 20B is a diagram of the segmentation strictness regions when the hands are in asymmetric positions on surface.

Step 266 of FIG. 18 defines the positions of these segmentation regions using the hand position estimates 252 derived from analyses of previous images. FIG. 20A shows the extent of the strict and sloppy segmentation regions while the hands are in their default positions, making estimated offsets for both hands zero. Plus signs in the diagram 252 indicate the estimated position of each finger and palm heel in each hand. Rectangular outlines in the lower corners represent the left 284 and right 286 sloppy segmentation regions where partial minima are largely ignored. The T-shaped region remaining is the strict segmentation region 282, where proximity saddle points must serve as contact boundaries. As a preferred embodiment the sloppy regions are rectangular, their inner boundaries 285 are placed just inside of the columns where the index fingers 202 are expected to lie, and the upper boundaries 287 are placed at the estimated vertical levels of their respective thumbs 201. The outer and lower boundaries of the sloppy regions are determined by the outside edges of the surface. Due to the decay in estimated hand offsets after hands leave the surface, the sloppy segmentation regions return to the positions shown after the hands have stayed off the surface a few seconds, regardless of hand position at liftoff. FIG. 20B shows how the sloppy regions follow the estimated hand positions 252 as the right hand moves toward the upper left and the left hand moves toward the lower left. This ensures that the palms and only the palms fall in the sloppy regions as long as the hand position estimates are correct.

Figure 20C:
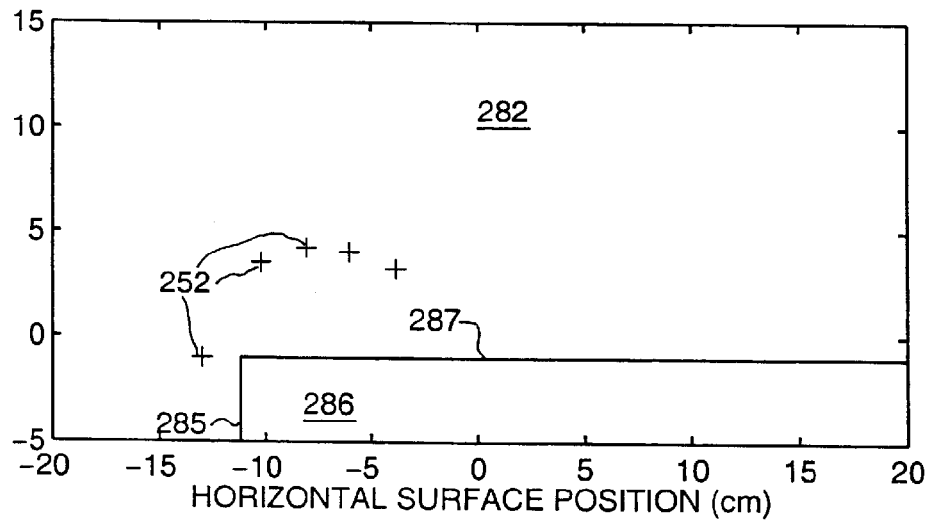
FIG. 20C is a diagram of the segmentation strictness regions when the right hand crosses to the left half of the surface and the left hand is off the surface.
Figure 21:
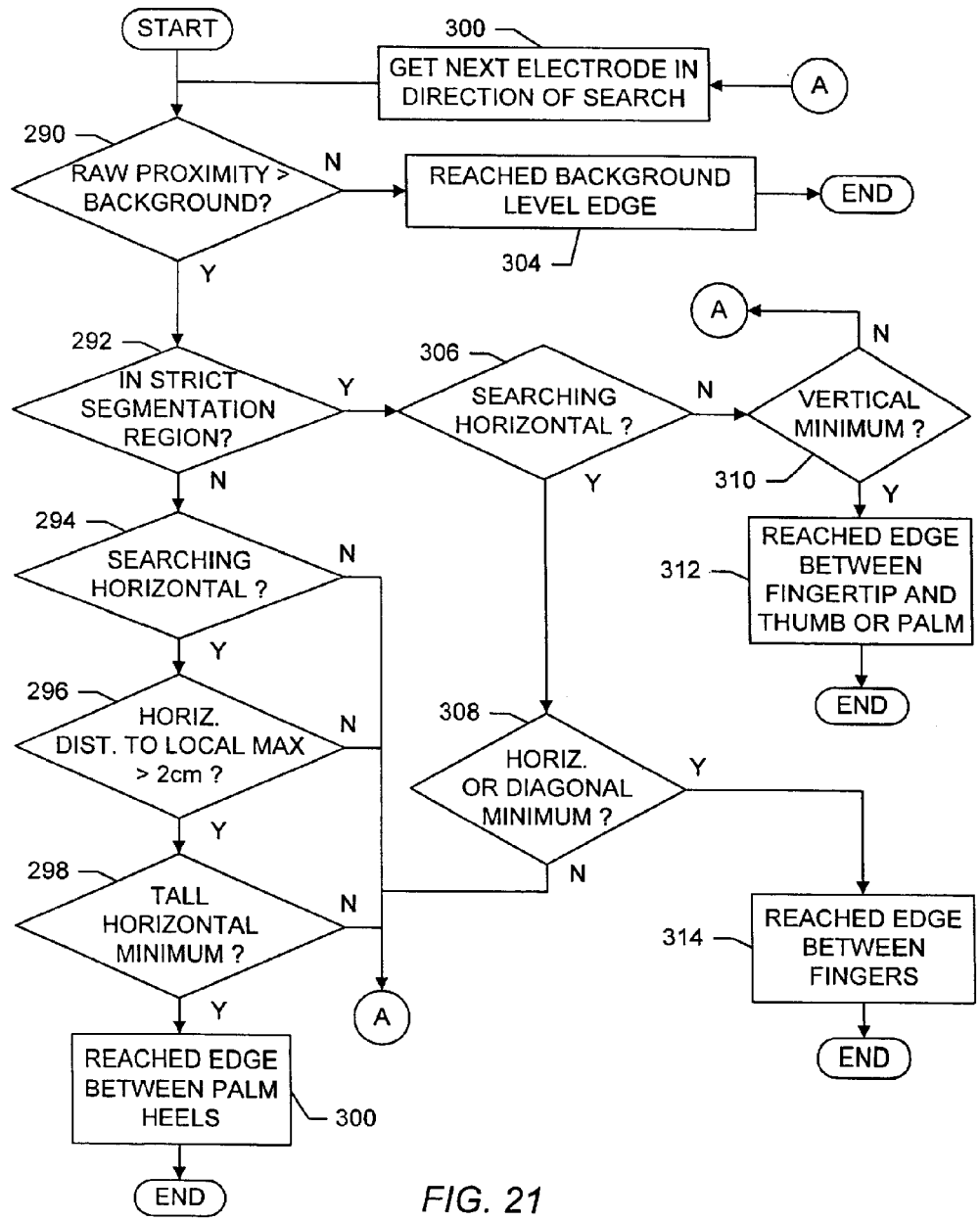
FIG. 21 is a flow chart of segmentation edge testing.

FIG. 20C shows that the left sloppy region 284 is moved left off the surface entirely when the left hand is lifted off the surface and the right hand slides to the left side of the surface. This prevents the fingers of one hand from entering the sloppy segmentation region of the opposite hand. This effect is implemented by imposing a minimum horizontal separation between the sloppy regions and, should the regions get too close to one another, letting the hand with the most surface contacts override the estimated position of the hand with fewer contacts. FIG. 21 is a detailed flow chart of the edge tests which are applied at each searched electrode depending on whether the electrode is in a strict or sloppy segmentation region. Decision diamond 290 checks whether the unsmoothed proximity of the electrode is greater than the background proximity levels. If not, the electrode is labeled an edge electrode in step 304 regardless of the segmentation region or search direction, and in step 305 the search returns to the row maximum to recurse in another direction. If the unsmoothed proximity is significant farther tests are applied to the smoothed proximity of neighboring electrodes depending on whether decision diamond 292 decides the search electrode is in a sloppy or strict region.

If a strict region search is advancing horizontally within a row, decision diamond 306 passes to decision diamond 308 which tests whether the electrode lies in a horizontal or diagonal partial minimum with respect to its nearest neighbor electrodes. If so, a proximity valley between adjacent fingers has probably been detected, the electrode is labeled as an edge 314 and search resumes in other directions 305. If not, the search continues on the next electrode in the row 302. If a strict region search is advancing vertically to the next row, decision diamond 306 passes to decision diamond 310 which tests whether the electrode lies in a vertical partial minimum with respect to the smoothed proximity of its nearest neighbor electrodes. If so, a proximity valley between a finger and the thumb has probably been detected, the electrode is labeled as an edge 312 and search resumes in other directions 305. If not, the search continues into the next row 302. If decision diamond 294 determines that a sloppy region search is advancing horizontally within a row, stringent horizontal minimum tests are performed to check for the crease or proximity valley between the inner and outer palm heels. To qualify, the electrode must be more than about 2 cm horizontal distance from the originating local maximum, as checked by decision diamond 296. Also the electrode must be part of a tall valley or partial horizontal minimum which extends to the rows above and below and the next-nearest neighbors within the row, as checked by decision diamond 298. If so, the electrode is labeled as an edge 300 and search recurses in other directions 305. All other partial minima within the sloppy regions are ignored, so the search continues 302 until a background level edge is reached on an upcoming electrode.

In sloppy segmentation regions it is possible for groups to overlap significantly because partial minima between local maxima do not act as boundaries. Typically when this happens the overlapping groups are part of a large fleshy contact such as a palm which, even after smoothing, has multiple local maxima. Two groups are defined to be overlapping if the search originating local maximum electrode of one group is also an element of the other group. In the interest of presenting only one group per distinguishable fleshy contact to the rest of the system, step 270 of FIG. 18 combines overlapping groups into single supergroups before parameter extraction. Those skilled in the art will realize that feedback from high-level analysis of previous images can be applied in various alternative ways to improve the segmentation process and still lie well within the scope of this invention. For example, additional image smoothing in sloppy segmentation regions could consolidate each palm heel contact into a single local maximum which would pass strict segmentation region boundary tests. Care must be taken with this approach however, because too much smoothing can cause finger pairs which unexpectedly enter sloppy palm regions to be joined into one group. Once a finger pair is joined the finger identification process 248 has no way to tell that the fingertips are actually not a single palm heel, so the finger identification process will be unable to correct the hand position estimate or adjust the sloppy regions for proper segmentation of future images.

More detailed forms of feedback than the hand position estimate can be utilized as well. For example, the proximal phalanges (209 in FIG. 13) are actually part of the finger but tend to be segmented into separate groups than the fingertips by the vertical minimum test 310. The vertical minimum test is necessary to separate the thumb group from index fingertip group in the partially closed FIG. 14 and pen grip FIG. 15 hand configurations. However, the proximal phalanges of flattened fingers can be distinguished from a thumb behind a curled fingertip by the fact that it is very difficult to flatten one long finger without flattening the other long fingers. To take advantage of this constraint, a flattened finger flag 267 is set whenever two or more of the contacts identified as index through pinky in previous images are larger than normal, reliably indicating that fingertips are flattening. Then decision diamond 310 is modified during processing of the current image to ignore the first vertical minimum encountered during search of rows below the originating local minimum 276. This allows the proximal phalanges to be included in the fingertip group but prevents fingertip groups from merging with thumbs or forepalms. The last step 272 of the segmentation process is to extract shape, size, and position parameters from each electrode group. Group position reflects hand contact position and is necessary to determine finger velocity. The total group proximity, eccentricity, and orientation are used by higher level modules to help distinguish finger, palm, and thumb contacts.

Provided $G_E$ is the set of electrodes in group G, $e_z$ is the unsmoothed proximity of an electrode or pixel e, and $e_x$ and $e_y$ are the coordinates on the surface of the electrode center in centimeters, to give a basic indicator of group position, the proximity-weighted center, or centroid, is computed from positions and proximities of the group's electrodes:

$$G_z = \sum_{e \in G_E} e_z \quad (12)$$

$$G_x = \sum_{e \in G_E} \frac{e_z e_x}{G_z} \quad (13)$$

$$G_y = \sum_{e \in G_E} \frac{e_z e_y}{G_z} \quad (14)$$

Note that since the total group proximity $G_z$ integrates proximity over each pixel in the group, it depends upon both of the size of a hand part, since large hand parts tend to cause groups with more pixels, and of the proximity to or pressure on the surface of a hand part.

Since most groups are convex, their shape is well approximated by ellipse parameters. The ellipse fitting procedure requires a unitary transformation of the group covariance matrix $G_{eov}$ of second moments $Q_{xx}$, $Q_{xy}$, $G_{yy}$:

$$G_{eov} = \begin{bmatrix} G_{xx} & G_{xy} \\ G_{yx} & G_{yy} \end{bmatrix} \quad (15)$$

$$G_{xx} = \sum_{e \in G_E} e_z (G_x - e_x)^2 \quad (16)$$

$$G_{yx} = G_{xy} = \sum_{e \in G_E} e_z (G_x - e_x)(G_y - e_y) \quad (17)$$

$$G_{yy} = \sum_{e \in G_E} e_x (G_y - e_y)^2 \quad (18)$$

The eigenvalues $\lambda_0$ and $\lambda_1$ of the covariance matrix $G_{eov}$ determine the ellipse axis lengths and orientation $G_\theta$:

$$G_{major} = \sqrt{\lambda_0} \quad (19)$$

$$G_{minor} = \sqrt{\lambda_1} \quad (20)$$

$$G_\theta = \arctan\left(\frac{\lambda_0 - G_{xx}}{G_{xy}}\right) \quad (21)$$

where $G_\theta$ is uniquely wrapped into the range (0,180°).

For convenience while distinguishing fingertips from palms at higher system levels, the major and minor axis lengths are converted via their ratio into an eccentricity $G_\epsilon$:

$$G_\epsilon = \frac{G_{major}}{G_{minor}} \quad (22)$$

Note that since the major axis length is always greater than or equal to the minor axis length, the eccentricity will always be greater than or equal to one. Finally, the total group proximity is empirically renormalized so that the typical curled fingertip will have a total proximity around one:

$$G_z := \frac{G_z}{Z_{averageFingertip}} \quad (23)$$

On low resolution electrode arrays, the total group proximity $G_z$ is a more reliable indicator of contact size as well as finger pressure than the fitted ellipse parameters. Therefore, if proximity images have low resolution, the orientation and eccentricity of small contacts are set to default values rather than their measured values, and total group proximity $G_z$ is used as the primary measure of contact size instead of major and minor axis lengths.

Figure 22:
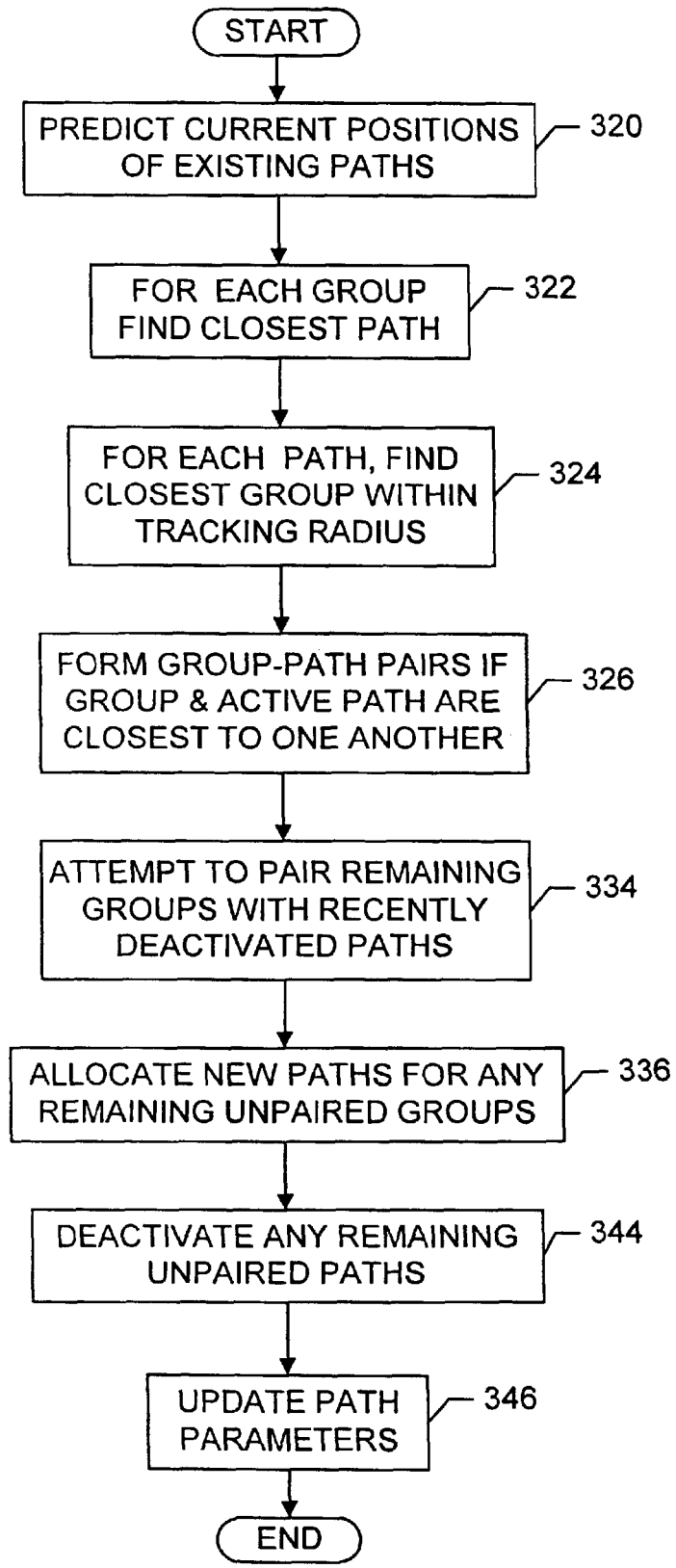
FIG. 22 is a flow chart of persistent path tracking.

FIG. 22 shows the steps of the path tracking process, which chains together those groups from successive proximity images which correspond to the same physical hand contact. To determine where each hand part has moved since the last proximity image, the tracking process must decide which current groups should be matched with which existing contact paths. As a general rule, a group and path arising from the same contact will be closer to one another than to other groups and paths. Also, biomechanical constraints on lateral finger velocity and acceleration limit how far a finger can travel between images. Therefore a group and path should not be matched unless they are within a distance known as the tracking radius of one another. Since the typical lateral separation between fingers is greater than the tracking radius for reasonable image scan rates touchdown and liftoff are easily detected by the fact that touchdown usually causes a new group to appear outside the tracking radii of existing paths, and liftoff will leave an active path without a group within its tracking radius. To prevent improper breaking of paths at high finger speeds each path's tracking radius $P_{rtruck}$ can be made dependent on its existing speed and proximity.

The first step 320 predicts the current locations of surface contacts along existing trajectories using path positions and velocities measured from previous images. Applying previous velocity to the location prediction improves the prediction except when a finger suddenly starts or stops or changes direction. Since such high acceleration events occur less often than zero acceleration events, the benefits of velocity-based prediction outweigh the potentially bad predictions during finger acceleration. Letting $P_x[n-1], P_y[n-1]$ be the position of path P from time step n−1 and $P_{vx}[n-1]$, $P_{vy}[n-1]$ the last known velocity, the velocity-predicted path continuation is then:

$$P_{predx}[n] = P_x[n-1] + \Delta t P_{vx}[n-1] \quad (24)$$

$$P_{predy}[n] = P_y[n-1] + \Delta t P_{vy}[n-1] \quad (25)$$

Letting the set of paths active in the previous image be PA, and let the set electrode groups constructed in the current image be G, step 322 finds for each group Gk the closest active path and records the distance to it:

$$Gk_{closestP} = \arg \min_{Pl \in PA} d^2(Gk, Pl) \quad \forall\, Gk \in G \quad (26)$$

$$Gk_{closestPdist2} = \min_{Pl \in PA} d^2(Gk, Pl) \quad \forall\, Gk \in G \quad (27)$$

where the squared Euclidean distance is an easily computed distance metric:

$$d^2(Gk, Pl) = (Gk_x - Pl_{predx})^2 + (Gk_y - Pl_{predy})^2 \quad (28)$$

Step 324 then finds for each active path Pl, the closest active group and records the distance to it:

$$Pl_{closestG} = \arg \min_{Gk \in G} d^2(Gk, Pl) \quad \forall\, Pl \in PA \quad (29)$$

$$Pl_{closestGdist2} = \min_{Gk \in G} d^2(Gk, Pl) \quad \forall\, Pl \in PA \quad (30)$$

In step 326, an active group Gk and path Pl are only paired with one another if they are closest to one another, i.e., $Gk_{closestP}$ and $Pl_{closestG}$ refer to one another, and the distance between them is less than the tracking radius. All of the following conditions must hold:

$$Gk_{closestP} = Pl \quad (31)$$

$$Pl_{closestG} = Gk \quad (32)$$

$$Pl_{closestGdist2} < Pl_{mack2} \quad (33)$$

To aid in detection of repetitive taps of the same finger, it may be useful to preserve continuity of path assignment between taps over the same location. This is accomplished in step 334 by repeating steps 322-326 using only groups which were left unpaired above and paths which were deactivated within the last second or so due to finger liftoff.

In step 336, any group which has still not be paired with an active or recently deactivated path is allocated a new path, representing touchdown of a new finger onto the surface. In step 344, any active path which cannot be so paired with a group is deactivated, representing hand part liftoff from the surface.

Step 346 incorporates the extracted parameters of each group into its assigned path via standard filtering techniques. The equations shown below apply simple autoregressive filters to update the path position ($P_x[n], P_y[n], P_z[n]$), velocity ($P_x[n], P_y[n]$), and shape ($P_\theta[n], P_\epsilon[n]$) parameters from corresponding group parameters, but Kalman or finite impulse response filters would also be appropriate.

If a path P has just been started by group G at time step n, i.e., a hand part has just touched down, its parameters are initialized as follows:

$$P_x[n] = G_x \quad (34)$$

$$P_y[n] = G_y \quad (35)$$

$$P_z[n] = G_z \quad (36)$$

$$P_\theta[n] = G_\theta \quad (37)$$

$$P_\epsilon[n] = G_\epsilon \quad (38)$$

$$P_{vx}[n] = 0 \quad (39)$$

$$P_{vy}[n] = 0 \quad (40)$$

$$P_{vz}[n] = G_z / \Delta t \quad (41)$$

else if group G is a continuation of active path P[n−1] to time step n:

$$P_x[n] = G_\alpha G_x + (1 - G_\alpha)(P_{predx}[n-1]) \quad (42)$$

$$P_y[n] = G_\alpha G_y + (1 - G_\alpha)(P_{predy}[n-1]) \quad (43)$$

$$P_z[n] = G_\alpha G_z + (1 - G_\alpha)(P_{predz}[n-1]) \quad (44)$$

$$P_\theta[n] = G_\alpha G_\theta + (1 - G_\alpha)(P_\theta[n-1]) \quad (45)$$

$$P_\epsilon[n] = G_\alpha G_\epsilon + (1 - G_\alpha)(P_\epsilon[n-1]) \quad (46)$$

$$P_{vx}[n] = (P_x[n] - P_x[n-1])/\Delta t \quad (47)$$

$$P_{vy}[n] = (P_y[n] - P_y[n-1])/\Delta t \quad (48)$$

$$P_{vz}[n] = (P_z[n] - P_z[n-1])/\Delta t \quad (49)$$

It is also useful to compute the magnitude $P_{speed}$ and angle $P_{dir}$ from the velocity vector ($P_{vx}, P_{vx}$). Since the reliability of position measurements increases considerably with total proximity $P_z$, the low-pass filter pole $G_\alpha$ is decreased for groups with total proximities lower than normal. Thus when signals are weak, the system relies heavily on the previously established path velocity, but when the finger firmly touches the surface causing a strong, reliable signal, the system relies entirely on the current group centroid measurement.

The next process within the tracking module is contact identification. On surfaces large enough for multiple hands, the contacts of each hand tend to form a circular cluster, and the clusters tend to remain separate because users like to avoid entangling the fingers of opposite hands. Because the arrangement of fingers within a hand cluster is independent of the location of and arrangement within the other hand's cluster, the contact identification system is hierarchically split. The hand identification process 247 first decides to which cluster each contact belongs. Then a within-cluster identification process 248 analyzes for each hand the arrangement of contacts within the hand's cluster, independent of the other hand's cluster. Because within-cluster or finger identification works the same for each hand regardless of how many hands can fit on the surface, it will be described first. The description below is for identification within the right hand. Mirror symmetry must be applied to some parameters before identifying left hand contacts.

Figure 23:
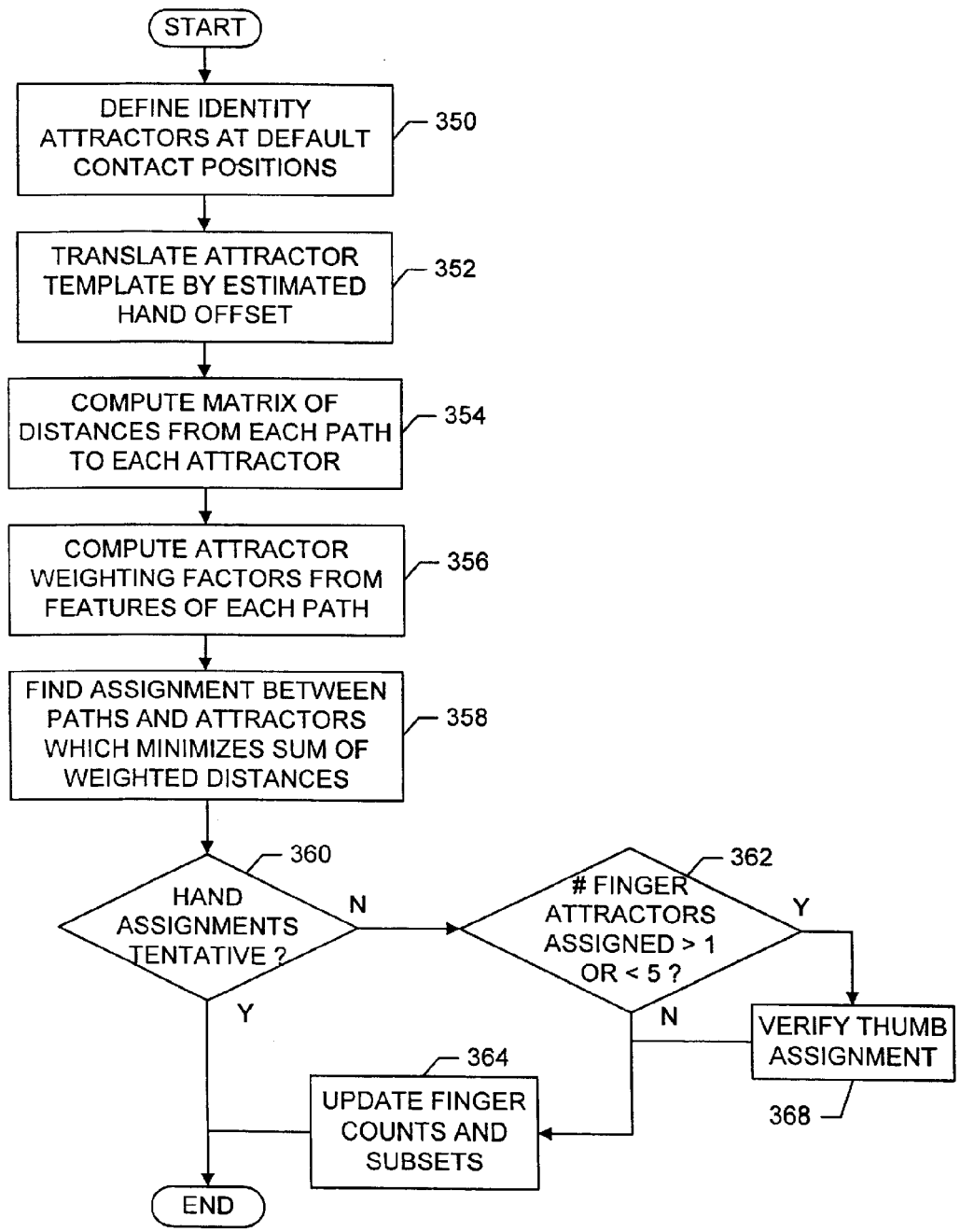
FIG. 23 is a flow chart of the hand part identification algorithm.

FIG. 23 shows the preferred embodiment of the finger identification process 248. For the contacts assigned to each hand this embodiment attempts to match contacts to a template of hand part attractor points, each attractor point having an identity which corresponds to a particular finger or palm heel. This matching between contact paths and attractors should be basically one to one but in the case that some hand parts are not touching the surface, some attractors will be left unfilled, i.e., assigned to the null path or dummy paths.

Step 350 initializes the locations of the attractor points to the approximate positions of the corresponding fingers and palms when the hand is in a neutral posture with fingers partially curled. Preferably these are the same default finger locations ($Fi_{defx}, Fi_{defy}$) employed in hand offset estimation. Setting the distances and angles between attractor points from a half-closed hand posture allows the matching algorithm to perform well for a wide variety of finger flexions and extensions.

Figure 24:
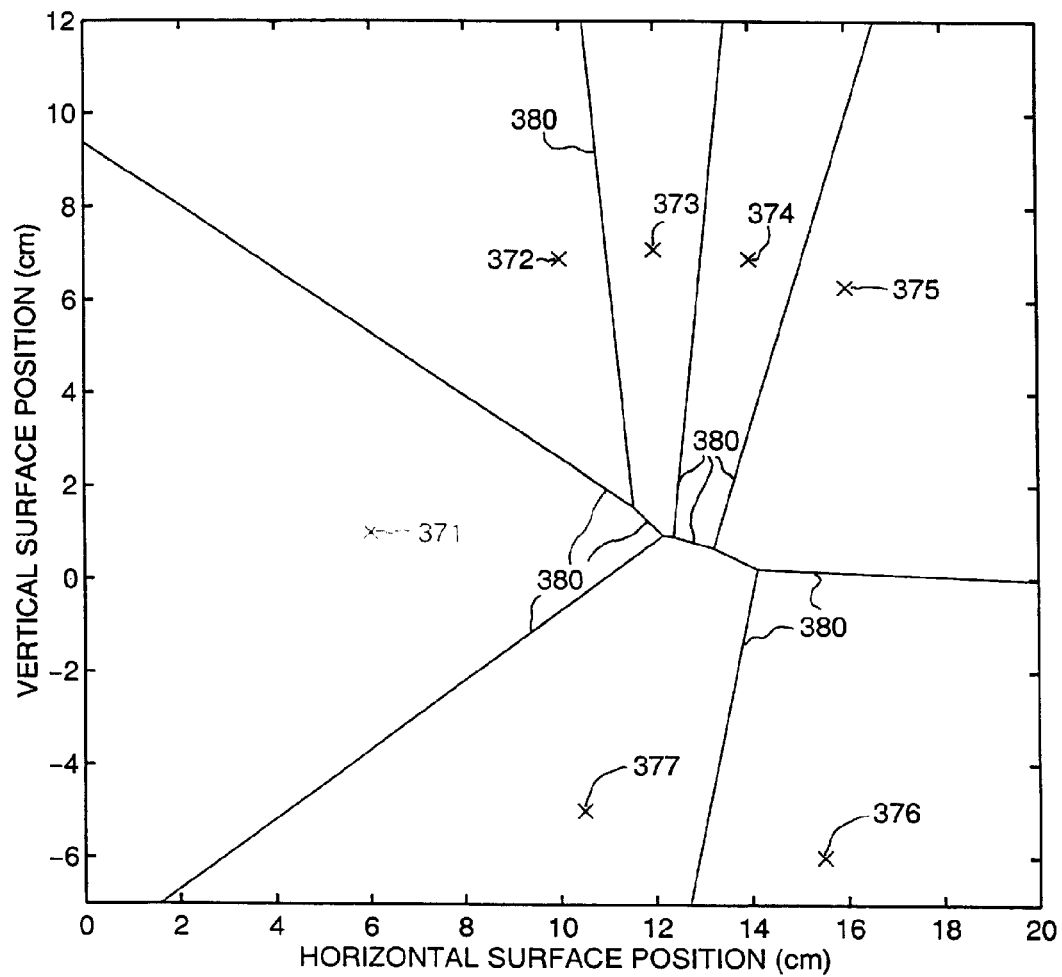
FIG. 24 is a Voronoi cell diagram constructed around hand part attractor points.

The resulting attractor points tend to lie in a ring as displayed by the crosses in FIG. 24. The identities of attractor points 371-377 correspond to the identities of hand parts 201-207. If the given hand is a left hand, the attractor ring must be mirrored about the vertical axis from that shown. FIG. 24 also includes line segments 380 forming the Voronoi cell around each attractor point. Every point within an attractor's Voronoi cell is closer to that attractor than any other attractor. When there is only one contact in the cluster and its features are not distinguishing, the assignment algorithm effectively assigns the contact to the attractor point of the Voronoi cell which the contact lies within. When there are multiple surface contacts in a hand cluster, they could all lie in the same Voronoi cell, so the assignment algorithm must perform a global optimization which takes into account all of the contact positions at once.

Alternative embodiments can include additional attractors for other hand part or alternative attractor arrangements for atypical hand configurations. For example, attractors for forepalm contacts can be placed at the center of the ring, but since the forepalms typically do not touch the surface unless the rest of the hand is flattened onto the surface as well, forepalm attractors should be weighted such that contacts are assigned to them only when no regular attractors are left unassigned.

For optimal matching accuracy the ring should be kept roughly centered on the hand cluster. Therefore step 352 translates all of the attractor points for a given hand by the hand's estimated position offset. The final attractor positions ($Aj_x[n], Aj_y[n]$) are therefore given by:

$$Aj_x[n]=H_{eox}[n]+Fj_{defx} \quad (50)$$

$$Aj_y[n]=H_{eoy}[n]+Fj_{defy} \quad (51)$$

In alternative embodiments the attractor ring can also be rotated or scaled by estimates of hand rotation and size such as the estimated finger offsets, but care must be taken that wrong finger offset estimates and identification errors do not reinforce one another by severely warping the attractor ring.

Once the attractor template is in place, step 354 constructs a square matrix [$d_{ij}$] of the distances in the surface plane from each active contact path Pi to each attractor point Aj. If there are fewer surface contacts than attractors, the null path P0, which has zero distance to each attractor, takes place of the missing contacts. Though any distance metric can be used, the squared Euclidean distance, $$d_{ij}=(Aj_x[n]-Pi_x[n])^2+(Aj_y[n]-Pi_y[n]) \quad (52)$$

is preferred because it specially favors assignments wherein the angle between any pair of contacts is close to the angle between the pair of attractors assigned to those contacts. This corresponds to the biomechanical constraint that fingertips avoid crossing over one another, especially while touching a surface.

In step 356, the distances from each contact to selected attractors are weighted according to whether the geometrical features of the given contact match those expected from the hand part that the attractor represents. Since the thumb and palm heels exhibit the most distinguishing geometrical features, weighting functions are computed for the thumb and palm heel attractors, and distances to fingertip attractors are unchanged. In a preferred embodiment, each weighting function is composed of several factor versus feature relationships such as those plotted approximately in FIG. 25. Each factor is designed to take on a default value of 1 when its feature measurement provides no distinguishing information, take on larger values if the measured contact feature uniquely resembles the given thumb or palm hand part, and take on smaller values if the measured feature is inconsistent with the given attractor's hand part. The factor relationships can be variously stored and computed as lookup tables, piecewise linear functions, polynomials, trigonometric functions, rational functions, or any combination of these. Since assignment between a contact and an attractor whose features match is favored as the weighted distance between becomes smaller, the distances are actually weighted (multiplied) with the reciprocals of the factor relationships shown.

Figure 25A:
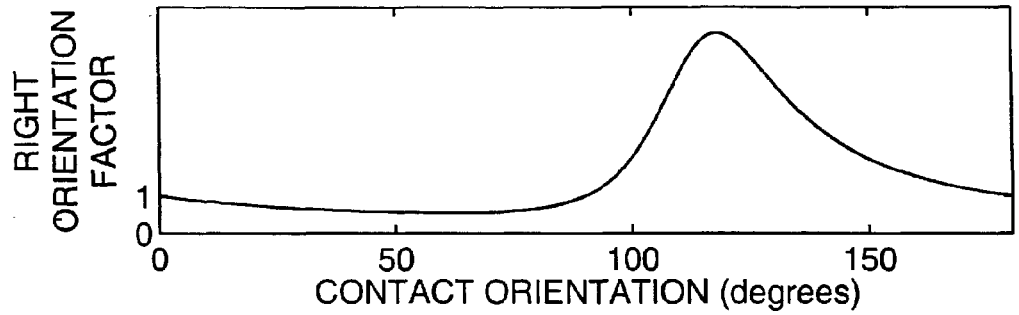
FIG. 25A is a plot of orientation weighting factor for right thumb, right inner palm, and left outer palm versus contact orientation.

FIG. 25A shows the right thumb and right inner palm heel orientation factor versus orientation of a contact's fitted ellipse. Orientation of these hand parts tends to be about 120+, whereas fingertip and outer palm heel contacts are usually very close to vertical (90°), and orientation of the left thumb and left inner palm heel averages 60°. The right orientation factor therefore approaches a maximum at 120°. It approaches the default value of 1 at 0°, 90°, and 180° where orientation is inconclusive of identity, and reaches a minimum at 60°, the favored orientation of the opposite thumb or palm heel. The corresponding relationship for the left thumb and inner palm heel orientation factor is flipped about 90°.

Figure 25B:
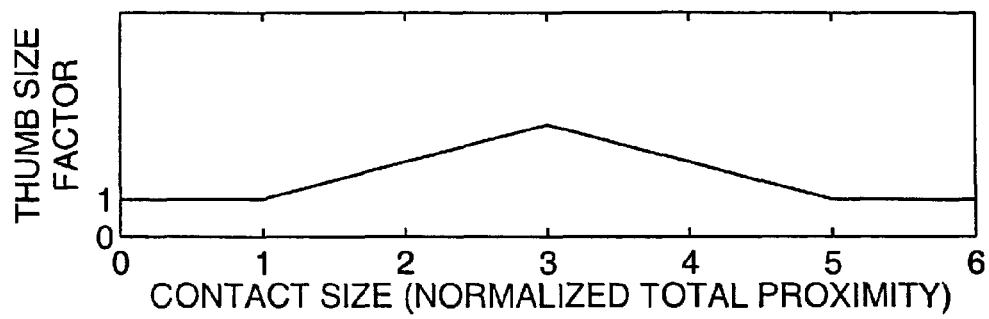
FIG. 25B is a plot of thumb size factor versus contact size.

FIG. 25B approximately plots the thumb size factor. Since thumb size as indicated by total proximity tends to peak at two or three times the size of the typical curled fingertip, the thumb size factor peaks at these sizes. Unlike palm heels, thumb contacts can not be much larger than two or three times the default fingertip size, so the thumb factor drops back down for larger sizes. Since any hand part can appear small when touching the surface very lightly or just starting to touchdown, small size is not distinguishing, so the size factor defaults to 1 for very small contacts.

Figure 25C:
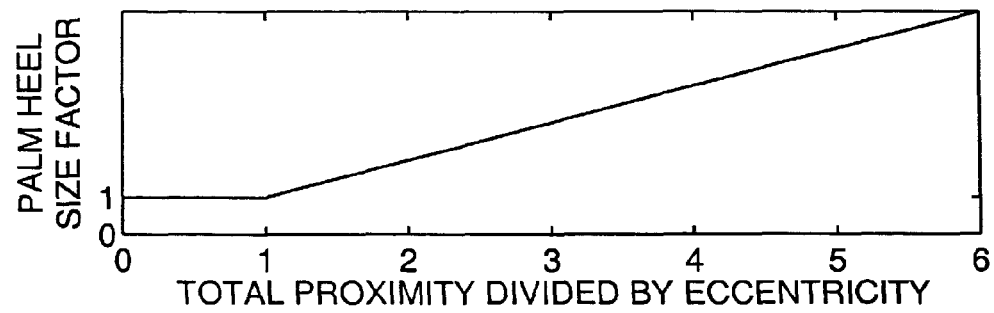
FIG. 25C is a plot of palm size factor versus ratio of total contact proximity to contact eccentricity.
Figure 25D:
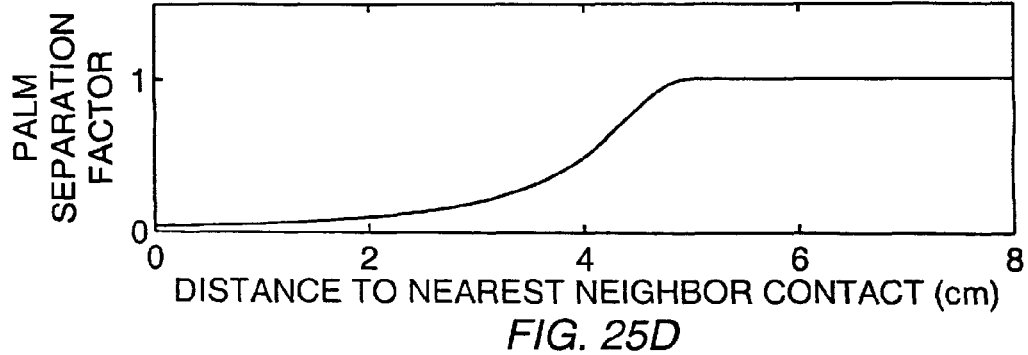
FIG. 25D is a plot of palm separation factor versus distance between a contact and it nearest neighbor contact.

FIG. 25C approximately plots the palm heel size factor. As more pressure is applied to the palms, the palm heel contacts can grow quite large, remaining fairly round as they do so. Thus the palm heel size factor is much like the thumb size factor except the palm factor is free to increase indefinitely. However, fingertip contacts can grow by becoming taller as the fingers are flattened. But since finger width is constant, the eccentricity of an ellipse fitted to a growing fingertip contact increases in proportion to the height. To prevent flattened fingers from having a large palm factor, has little effect for palms, whose eccentricity remains near 1, but cancels the high proximities of flattened fingertips. Though directly using fitted ellipse width would be less accurate for low resolution electrode arrays, the above ratio basically captures contact width.

Another important distinguishing feature of the palm heels is that wrist anatomy keeps the centroids of their contacts separated from one other and from the fingers by several centimeters. This is not true of the thumb and fingertips, which can be moved within a centimeter of one another via flexible joints. The inter-palm separation feature is measured by searching for the nearest neighbor contact of a given contact and measuring the distance to the neighbor. As plotted approximately in FIG. 25D, the palm separation factor quickly decreases as the separation between the contact and its nearest neighbor falls below a few centimeters, indicating that the given contact (and its nearest neighbor) are not palm heels. Unlike the size and orientation factors which only become reliable as the weight of the hands fully compresses the palms, the palm separation factor is especially helpful in distinguishing the palm heels from pairs of adjacent fingertips because it applies equally well to light, small contacts.

Once the thumb and palm weightings have been applied to the distance matrix, step 358 finds the one-to-one assignment between attractors and contacts which minimizes the sum of weighted; distances between each attractor and it's assigned contact. For notational purposes, let a new matrix $[c_{ij}]$ hold the weighted distances:

$$c_{ij} = \begin{cases} d_{ij}/(Pi_{\text{thumb\_size\_fact}} Pi_{\text{orient\_fact}}) & \text{if } j = 1 \\ d_{ij} & \text{if } 2 \leq j \leq 5 \\ d_{ij}/(Pi_{\text{palm\_size\_fact}} Pi_{\text{palm\_sep\_fact}}) & \text{if } j = 6 \\ d_{ij}/(Pi_{\text{palm\_size\_fact}} Pi_{\text{palm\_sep\_fact}}) & \text{if } j = 7 \end{cases} \quad (53)$$

Mathematically the optimization can then be stated as finding the permutation $\{\pi_1, \ldots, \pi_7\}$ of integer hand part identities $\{1, \ldots, 7\}$ which minimizes:

$$\sum_{i=1}^{7} c_{i\pi_i} \quad (54)$$

where $c_{ij}$ is the weighted distance from contact i to attractor j, and contact i and attractor j are considered assigned to one another when $\pi_i = j$. This combinatorial optimization problem, known more specifically in mathematics as an assignment problem, can be efficiently solved by a variety of well-known mathematical techniques, such as branch and bound, localized combinatorial search, the Hungarian method, or network flow solvers. Those skilled in the art will recognize that this type of combinatorial optimization problem has a mathematically equivalent dual representation in which the optimization is reformulated as a maximization of a sum of dual parameters. Such reformulation of the above hand part identification method as the dual of attractor-contact distance minimization remains well within the scope of this invention.

To avoid unnecessary computation, decision diamond 360 ends the finger identification process at this stage if the hand assignment of the given contact cluster is only a tentative hypothesis being evaluated by the hand identification module 247. However, if the given hand assignments are the final preferred hypothesis, further processes verify finger identities and compile identity statistics such as finger counts.

The identifications produced by this attractor assignment method are highly reliable when all five fingers are touching the surface or when thumb and palm features are unambiguous. Checking that the horizontal coordinates for identified fingertip contacts are in increasing order easily verifies that fingertip identities are not erroneously swapped. However, when-only two to four fingers are touching, yet no finger strongly exhibits thumb size or orientation features, the assignment of the innermost finger contact may wrongly indicate whether the contact is the thumb. In this case, decision diamond 362 employs a thumb verification process 368 to take further measurements between the innermost finger contact and the other fingers. If these further measurements strongly suggest the innermost finger contact identity is wrong, the thumb verification process changes the assignment of the innermost finger contact. Once the finger assignments are verified, step 364 compiles statistics about the assignments within each hand such as the number of touching fingertips and bitfields of touching finger identities. These statistics provide convenient summaries of identification results for other modules.

Figure 26:
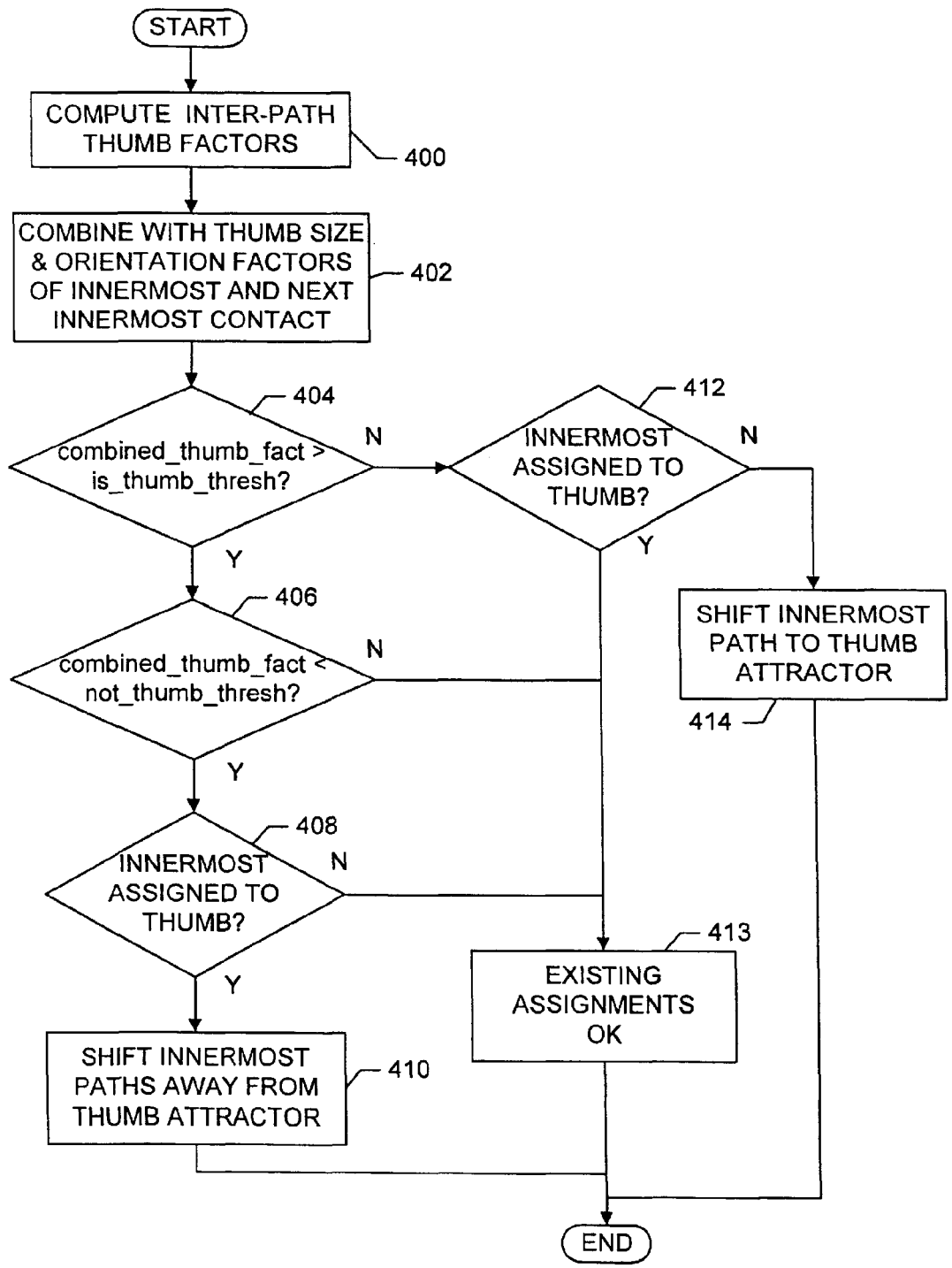
FIG. 26 is a flow chart of the thumb presence verification algorithm.

FIG. 26 shows the steps within the thumb verification module. The first 400 is to compute several velocity, separation, and angle factors for the innermost contact identified as a finger relative to the other contacts identified as fingers. Since these inter-path measurements presuppose a contact identity ordering, they could not have easily been included as attractor distance weightings because contact identities are not known until the attractor distance minimization is complete. For the factor descriptions below, let FI be the innermost finger contact, FN be the next innermost finger contact, FO be the outermost finger contact.

The separation between thumb and index finger is often larger than the separations between fingertips, but all separations tend to grow as the fingers are outstretched. Therefore an inner separation factor inner_separation_fact is defined as the ratio of the distance between the innermost and next innermost finger contacts to the average of the distances between other adjacent fingertip contacts, avg_separation: 12 innerseparationfact min $$innerseparationfact \approx \min\left(1, \frac{\sqrt{(FI_x - FN_x)^2 + (FI_y - FN_y)^2}}{avgseparation}\right) \quad (55)$$

The factor is clipped to be greater than one since an innermost separation less than the average can occur regardless of whether thumb or index finger is the innermost touching finger. In case there are only two finger contacts, a default average separation of 2-3 cm is used. The factor tends to become larger than one if the innermost contact is actually the thumb but remains near one if the innermost contact is a fingertip.

Figure 32:
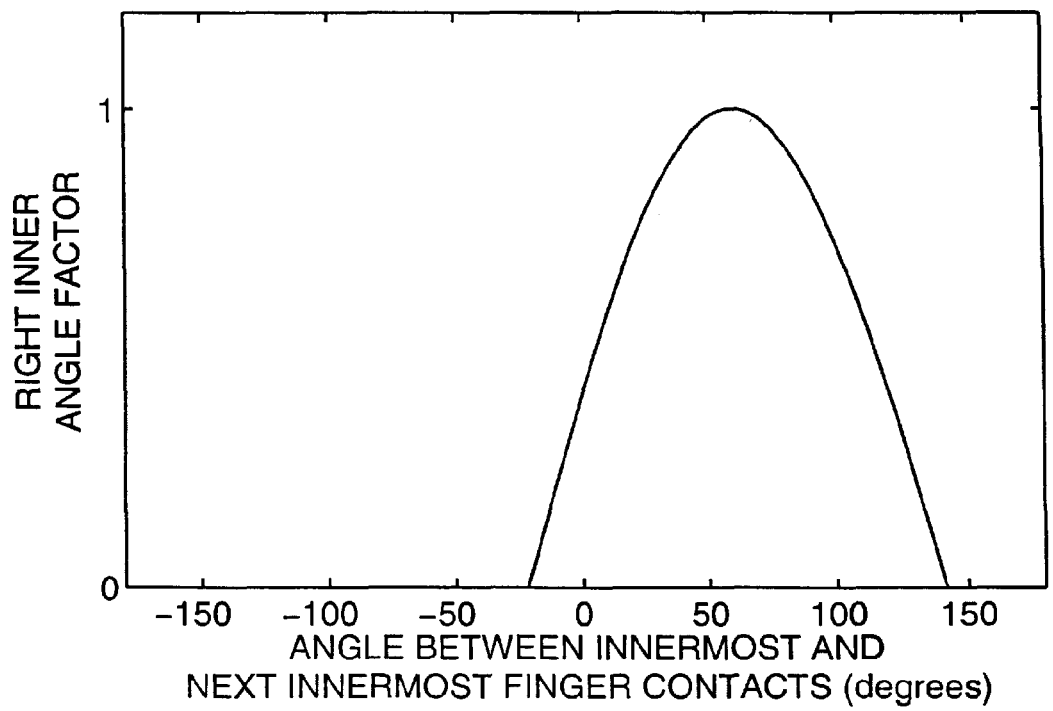
FIG. 32 is a plot of the inner finger angle factor versus the angle between the innermost and next innermost finger contacts.

Since the thumb rarely moves further forward than the fingertips except when the fingers are curled into a first, the angle between the innermost and next innermost finger contact can help indicate whether the innermost finger contact is the thumb. For the right hand the angle of the vector from the thumb to the index finger is most often 60°, though it ranges to 0° as the thumb moves forward and to 120° as the thumb adducts under the palm. This is reflected in the approximate plot of the inner angle factor in FIG. 32, which peaks at 60° and approaches 0 toward 0° and 120°. If the innermost finger contact is actually an index fingertip, the measured angle between innermost and next innermost contact will likely be between 30° and −60°, producing a very small angle factor.

The inner separation and angle factors are highly discriminating of neutral thumb postures, but users often exceed the above cited separation and angle ranges when performing hand scaling or rotation gestures. For instance, during an anti-pinch gesture, the thumb may start pinched against the index or middle fingertip, but then the thumb and fingertip slide away from one another. This causes the inner separation factor to be relatively small at the start of the gesture. Similarly, the thumb-index angle can also exceed the range expected by the inner angle factor at the beginning or end of hand rotation gestures, wherein the fingers rotate as if turning a screw. To compensate, the inner separation and angle factors are fuzzy OR'ed with expansion and rotation factors which are selective for symmetric finger scalings or rotations centered on a point between the thumb and fingertips.

When defined by the following approximate equation, the expansion factor peaks as the innermost and outermost finger contacts slide at approximately the same speed and in opposite directions, parallel to the vector between them:

$$expansionfact \approx -\sqrt{FI_{speed}[n] \times FO_{speed}[n]} \times \qquad (56)$$
$$\cos(FI_{dir}[n] - \angle(FI[n], (FO[n])) \times$$
$$\cos(FO_{dir}[n] - \angle(FI[n], FO[n]))$$

$$expansion\_fact := \max(0, expansion\_fact) \qquad (57)$$

where $\angle(FI[n], FO[n])$ is the angle between the fingers:

$$\angle(FI[n], FO[n]) = \arctan\left(\frac{FI_y[n] - FO_y[n]}{FI_x[n] - FO_x[n]}\right) \qquad (58)$$

Translational motions of both fingers in the same direction produce negative factor values which are clipped to zero by the max operation. Computing the geometric rather than arithmetic mean of the innermost and outermost speeds aids selectivity by producing a large expansion factor only when speeds of both contacts are high.

The rotation factor must also be very selective. If the rotation factor was simply proportional to changes in the angle between innermost and outermost finger, it would erroneously grow in response to asymmetries in finger motion such as when the innermost finger starts translating downward while the outermost contact is stationary. To be more selective, the rotation factor must favor symmetric rotation about an imaginary pivot between the thumb and fingertips. The approximate rotation factor equation below peaks as the innermost and outermost finger move in opposite directions, but in this case the contacts should move perpendicular to the vector between them:

$$rotationfact = -\sqrt{FI_{speed}[n] \, FO_{speed}[n]} \times \qquad (59)$$
$$\sin(FI_{dir}[n] - \angle(FI[n], (FO[n])) \times$$
$$\sin(FO_{dir}[n] - \angle(FI[n], FO[n]))$$

$$rotation\_fact := \max(0, rotation\_fact) \qquad (60)$$

Since motions which maximize this rotation factor are easy to perform between the opposable thumb and another finger but difficult to perform between two fingertips the rotation factor is a robust indicator of thumb presence.

Finally, a fuzzy logic expression (step 402) combines these inter-contact factors with the thumb feature factors for the innermost and next innermost finger contacts. In a preferred embodiment, this fuzzy logic expression for the combined_thumb_fact takes the form:

$$combined\_thumb\_fact \approx (inner\_separation\_fact \times angle\_fact + expansion\_fact + rotation\_fact) \times (FI_{orient\_fact}/FN_{orient\_fact}) \times (FI_{thumb\_size\_fact}/FN_{thumb\_size\_fact}) \qquad (61)$$

The feature factor ratios of this expression attempt to compare the features of the innermost contact to current features of the next innermost contact, which is already known to be a fingertip. If the innermost contact is also a fingertip its features should be similar to the next innermost, causing the ratios to remain near one. However, thumb-like features on the innermost contact will cause the ratios to be large. Therefore if the combined thumb factor exceeds a high threshold, diamond 404 decides the innermost finger contact is definitely a thumb. If decision diamond 412 determines the contact is not already assigned to the thumb attractor 412, step 414 shifts the contact assignment inward on the attractor ring to the thumb attractor. Otherwise, if decision diamond 406 determines that the combined thumb factor is less than a low threshold, the innermost contact is most definitely not the thumb. Therefore if decision diamond 408 finds the contact assigned to the thumb attractor, step 410 shifts the innermost contact assignment and any adjacent finger contacts outward on the attractor ring to unfill the thumb attractor. If the combined_thumb_fact is between the high and low threshold or if the existing assignments agree with the threshold decisions, step 413 makes no assignment changes.

The hand contact features and interrelationships introduced here to aid identification can be measured and combined in various alternative ways yet remain well within the scope of the invention. In alternative embodiments of the multi-touch surface apparatus which include raised, touch-insensitive palm rests, palm identification and its requisite attractors and factors may be eliminated. Geometrical parameters can be optimally adapted to measurements of individual user hand size taken while the hand is flattened. However, the attractor-based identification method already tolerates variations in a single person's finger positions due to finger flexion and extension which are as great or greater than the variations in hand size across adult persons. Therefore adaptation of the thumb and palm size factors to a person's average finger and palm heel proximities is more important than adaptation of attractor positions to individual finger lengths, which will only add marginal performance improvements.

Figure 27:
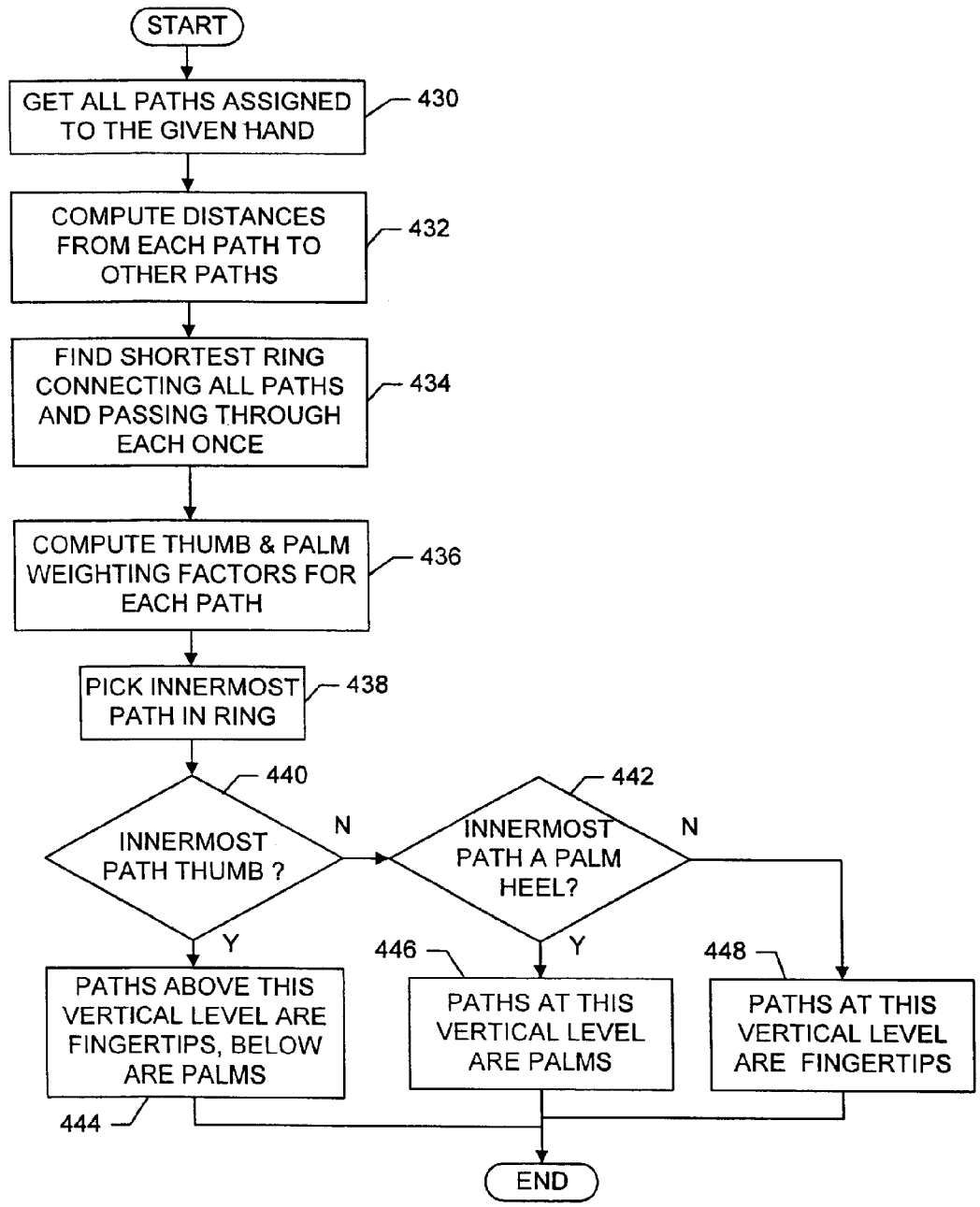
FIG. 27 is a flow chart of an alternative hand part identification algorithm.

As another example of an alternative method for incorporating these features and relationships into a hand contact identifier, FIG. 27 diagrams an alternative finger identification embodiment which does not include an attractor template. To order the paths from finger and palm contacts within a given hand 430, step 432 constructs a two-dimensional matrix of the distances from each contact to the other contacts. In step 434, a shortest path algorithm well known from the theory of network flow optimization then finds the shortest graph cycle connecting all the contact paths and passing through each once 434. Since hand contacts tend to lie in a ring this shortest graph cycle will tend to connect adjacent contacts, thus establishing a sensible ordering for them.

The next step 438 is to pick a contact at an extreme position in the ring such as the innermost or outermost and test whether it is a thumb (decision diamond 440) or palm (decision diamond 442). This can be done using contact features and fuzzy logic expressions analogous to those utilized in the thumb verification process and the, attractor weightings. If the innermost path is a thumb, step 444 concludes that contacts above are most likely fingertips, and contacts in the ring below the thumb are most likely palms. If (442) the innermost path is a palm heel, step 446 concludes the paths significantly above the innermost must be fingers while paths at the same vertical level should be palms. The thumb and palm tests are then repeated for the contacts adjacent in the ring to the innermost until any other thumb or palm contacts are found. Once any thumb and palm contacts are identified, step 448 identifies remaining fingertip contacts by their respective ordering in the ring and their relatively high vertical position.

Since this alternative algorithm does not include an attractor template to impose constraints on relative positions, the fuzzy verification functions for each contact may need to include measurements of the vertical position of the contact relative to other contacts in the ring and relative to the estimated hand offset. The attractor template embodiment is preferred over this alternative embodiment because the attractor embodiment more elegantly incorporates expected angles between contacts and the estimated hand offset into the finger identification process.

Hand identification is needed for multi-touch surfaces which are large enough to accommodate both hands simultaneously and which have the left and right halves of the surface joined such that a hand can roam freely across the middle to either half of the surface. The simplest method of hand identification would be to assign hand identity to each contact according to whether the contact initially touched down in the left or right half of the surface. However, if a hand touched down in the middle, straddling the left and right halves, some of the hand's contacts would end up assigned to the left hand and others to the right hand. Therefore more sophisticated methods which take into account the clustering properties of hand contacts must be applied to ensure all contacts from the same hand get the same identity. Once all surface contacts are initially identified, the path tracking module can reliably retain existing identifications as a hand slides from one side of the surface to the other.

The thumb and inner palm contact orientations and the relative thumb placement are the only contact features independent of cluster position which distinguish a lone cluster of right hand contacts from a cluster of left hand contacts. If the thumb is lifted off the surface, a right hand contact cluster appears nearly indistinguishable from a left hand cluster. In this case cluster identification must still depend heavily on which side of the board the cluster starts on, but the identity of contacts which recently lifted off nearby also proves helpful. For example, if the right hand moves from the right side to the middle of the surface and lifts off, the next contacts which appear in the middle will most likely be from the right hand touching back down, not from the left hand moving to the middle and displacing the right hand. The division between left and right halves of the surface should therefore be dynamic, shifting toward the right or left according to which hand was most recently near the middle. Since the hand offset estimates temporarily retain the last known hand positions after liftoff, such a dynamic division is implemented by tying the positions of left hand and right hand attractor templates to the estimated hard positions.

Though cases remain in which the user can fool the hand identification system with sudden placements of a hand in unexpected locations, the user may actually wish to fool the system in these cases. For example, users with only one hand free to use the surface may intentionally place the hand far onto the opposite half of the surface to access the chord input operations of the opposite hand. Therefore, when a hand cluster suddenly touches down well into the opposite half of the surface, it can safely be given the opposite halfs identity, regardless of its true identity. Arching the surface across the middle can also discourage users from sliding a hand to the opposite side by causing awkward forearm pronation should users do so.

Figure 29:
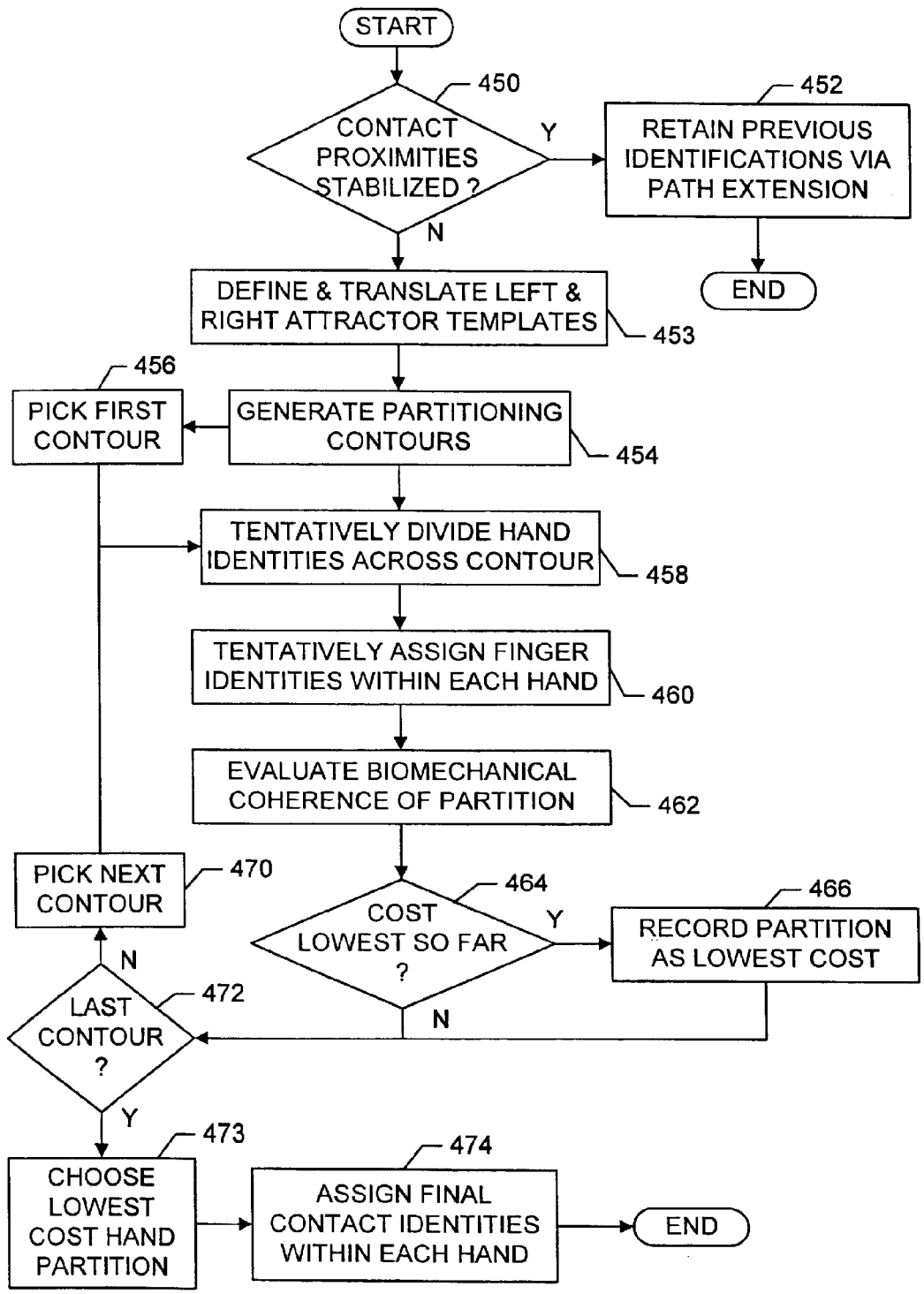
FIG. 29 is a flow chart of the hand identification algorithm.

FIG. 29 shows process details within the hand identification module 247. Decision diamond 450 first determines whether the hand identification algorithm actually needs to be executed by checking whether all path proximities have stabilized. To maximize stability of the identifications, hand and finger identities need only be reevaluated when a new hand part touches down or disambiguating features of existing contacts become stronger. The contact size and orientation features are unreliable until the flesh fully compresses against the surface a few dozen milliseconds after initial surface contact. Therefore decision diamond 450 executes the hand identification algorithm for each proximity image in which a new contact appears and for subsequent proximity images in which the total proximity of any new contacts continues to increase. For images in which proximities of existing contacts have stabilized and no new contacts appear, path continuation as performed by the path tracking process 245 is sufficient to retain and extend (step 452) the contact identifications computed from previous images.

Should the hand identification algorithm be invoked for the current image, the first step 453 is to define and position left and right hand attractor templates. These should be basically the same as the attractor templates (FIG. 24, step 352) used in within-hand identification, except that both left and right rings must now be utilized at once. The default placement of the rings relative to one another should correspond to the default left and right hand contact positions shown in FIG. 20A. Each ring translates to follow the estimated position of its hand, just like the sloppy segmentation regions follow the hands in FIG. 20B. Individual attractor points can safely be translated by their corresponding estimated finger offsets. Therefore the final attractor positions $(Aj_x[n],Aj_y[n])$ for the left hand L and right hand H attractor rings are:

$$Laj_x[n] = Lh_{eox}[n] + LFj_{eox}[n] + Lfj_{defx} \tag{62}$$

$$Laj_y[n] = Lh_{eoy}[n] + LFj_{eoy}[n] + Lfj_{defy} \tag{63}$$

$$Raj_x[n] = Rh_{eox}[n] + RFj_{eox}[n] + Rfj_{defx} \tag{64}$$

$$Raj_y[n] = Rh_{eoy}[n] + RFj_{eoy}[n] + Rfj_{defy} \tag{65}$$

Basically the hand identification algorithm will compare the cost of assigning contacts to attractors in one ring versus the other, the cost depending on the sum of weighted distances between each contact and its assigned attractor. Adjusting the attractor ring with the estimated hand and finger offsets lowers the relative costs for assignment hypotheses which resemble recent hand assignments, helping to stabilize identifications across successive proximity images even when hands temporarily lift off.

Figure 30A:
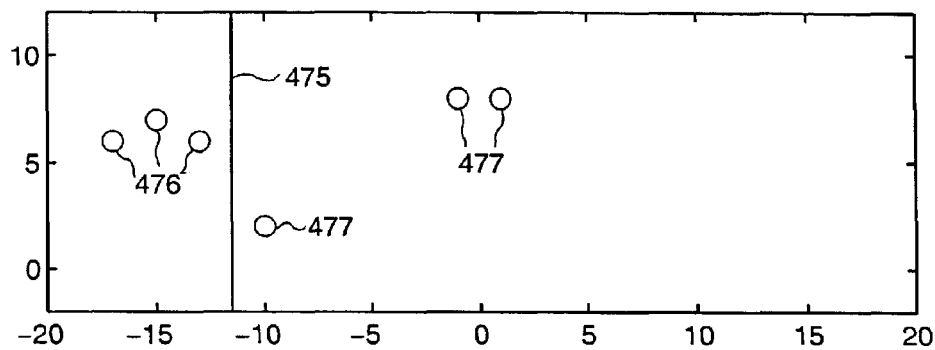
FIGS. 30A-C show three different hand partition hypotheses for a fixed arrangement of surface contacts.
Figure 30B:
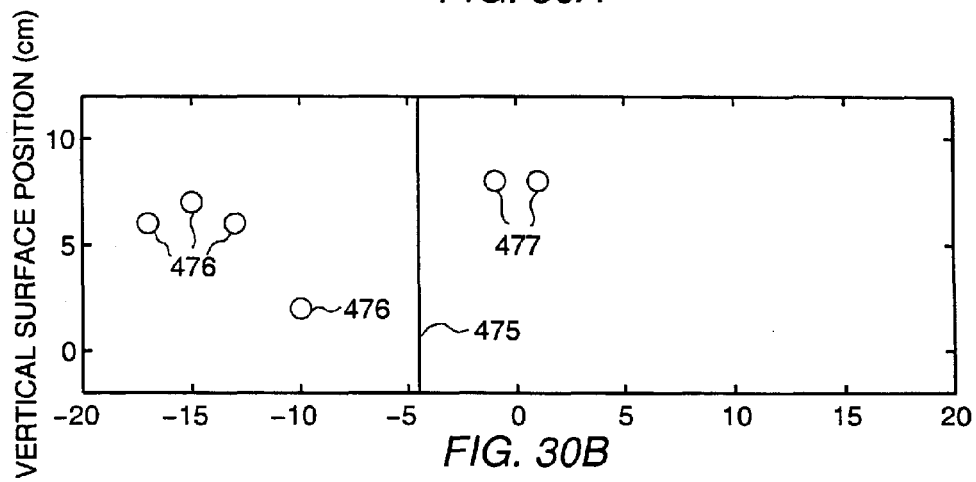
Figure 30C:
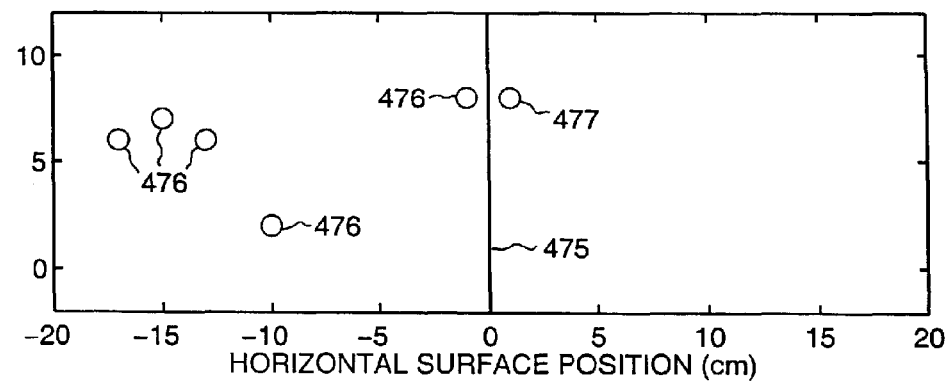

Next a set of assignment hypotheses must be generated and compared. The most efficient way to generate sensible hypotheses is to define a set of roughly vertical contour lines, one between each horizontally adjacent contact. Step 454 does this by ordering all surface contacts by their horizontal coordinates and establishing a vertical contour halfway between each pair of adjacent horizontal coordinates. FIGS. 30A-C show examples of three different contours 475 and their associated assignment hypotheses for a fixed set of contacts. Each contour corresponds to a separate hypothesis, known also as a partition, in which all contacts to the left 476 of the contour are from the left hand, and all contacts to the right 477 of the contour are from the right hand. Contours are also necessary at the left and right ends of the surface to handle the hypotheses that all contacts on the surface are from the same hand. Contours which hypothesize more contacts on a given hand than can be caused by a single hand are immediately eliminated.

Generating partitions via vertical contours avoids all hypotheses in which contacts of one hand horizontally overlap or cross over contacts of the opposite hand. Considering that each hand can cause seven or more distinct contacts, this reduces the number of hand identity permutations to examine from thousands to at most a dozen. With fewer hypotheses to examine, the evaluation of each partition can be much more sophisticated, and if necessary, computationally costly.

The optimization search loop follows. Its goal is to determine which of the contours divides the contacts into a partition of two contact clusters such that the cluster positions and arrangement of contacts within each cluster best satisfy known anatomical and biomechanical constraints. The optimization begins by picking (step 456) a first contour divider such as the leftmost and tentatively assigning (step 458) any contacts to the left of the contour to the left hand and the rest to the right hand. Step 460 invokes the finger identification algorithm of FIG. 23, which attempts to assign finger and palm identities to contacts within each hand. Decision diamond 360 avoids the computational expense of thumb verification 368 and statistics gathering 364 for this tentative assignment hypothesis.

Returning to FIG. 29, step 462 computes a cost for the partition. This cost is meant to evaluate how well the tentatively identified contacts fit their assigned attractor ring and how well the partition meets between-hand separation constraints. This is done by computing for each hand the sum of weighted distances from each tentatively identified contact to its assigned attractor point as in Equation 54 of finger identification, including size and orientation feature factors for thumb and palm attractors. This sum represents the basic template fitting cost for a hand. Each hand cost is then weighted as a whole with the reciprocals of its clutching velocity, handedness, and palm cohesion factors. These factors, to be described below, represent additional constraints which are underemphasized by the weighted attractor distances. Finally, the weighted left and right hand costs are added together and scaled by the reciprocal of a hand separation factor to obtain a total cost for the partition.

If decision diamond 464 determines this total cost is lower than the total costs of the partitions evaluated so far 464, step 466 records the partition cost as the lowest and records the dividing contour. Decision diamond 472 repeats this process for each contour 470 until the costs of all partitions have been evaluated. Step 473 chooses the partition which has the lowest cost overall as the actual hand partitioning 473, and the hand identities of all contact paths are updated accordingly. Then step 474 reinvokes the within-hand finger contact identification process so that the thumb verification and statistics gathering processes are performed using the actual hand assignments.

Figure 31A:
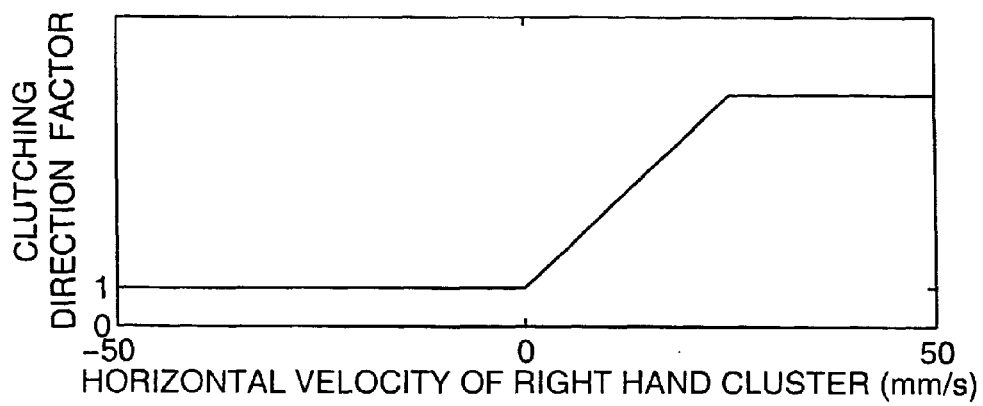
FIG. 31A is a plot of the hand clutching direction factor versus horizontal hand velocity.

Users often perform clutching motions in which the right hand, for example, lifts off from a slide at the right side of the surface, touches backdown in the middle of the surface, and resumes sliding toward the right. Therefore when a hand is detected touching down in the middle of the surface and sliding toward one side, it probably came from the at side. A hand velocity factor, plotted approximately in FIG. 31A, captures this phenomenon by slightly increasing in value when a hand cluster's contacts are moving toward the cluster's assigned side of the board, thus decreasing the basic cost of the hand. The factor is a function of the average of the contacts' horizontal velocities the side of the surface the given cluster is assigned. Since high speeds do not necessarily give a stronger indication of user intent the factor saturates at moderate speeds.

Figure 31B:
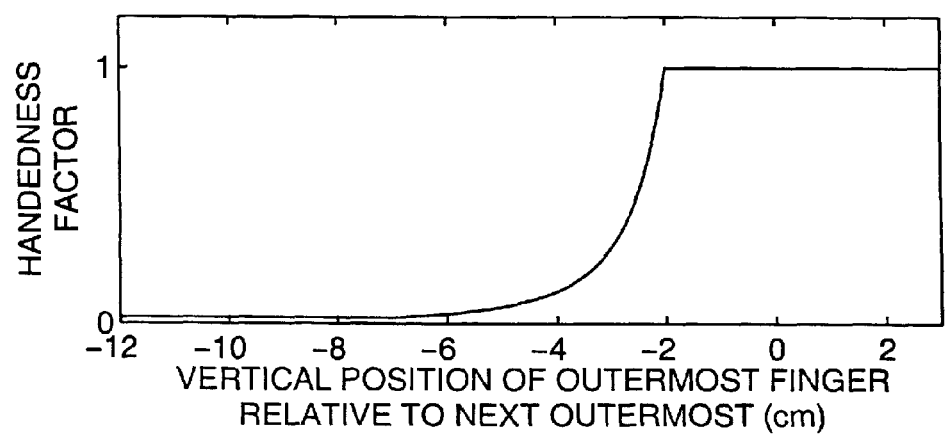
FIG. 31B is a plot of the handedness factor versus vertical position of outermost finger relative to next outermost.

Though the thumb orientation factors help identify which hand a thumb is from when the thumb lies in the ambiguous middle region of the surface, the vertical position of the thumb relative to other fingers in the same hand also gives a strong indication of handedness. The thumb tends to be positioned much lower than the fingertips, but the pinky tends to be only slightly lower than the other fingertips. The handedness factor plotted approximately in FIG. 31B, takes advantage of this constraint by boosting the hand cost when the contact identified as the outermost fingertip is more than a couple centimeters lower than the next outermost fingertip contact. In such cases the tentative hand assignment for all contacts in the cluster is probably wrong. Since this causes the within-hand identification algorithm to fit the contacts to the wrong attractor ring, finger identities become reversed such that the supposedly lowered pinky is truly a lowered thumb of the opposite hand. Unfortunately, limited confidence can be placed in the handedness factor. Though the pinky should not appear lowered as much as the thumb the outer palm heel can, creating an ambiguity in which the thumb and fingertips of one hand have the same contact arrangement as the fingertips and outer palm heel of the opposite hand. This ambiguity can cause the handedness factor to be erroneously low for an accurately identified hand cluster, so the handedness factor is only used on clusters in the middle of the surface where hand position is ambiguous.

Figure 31C:
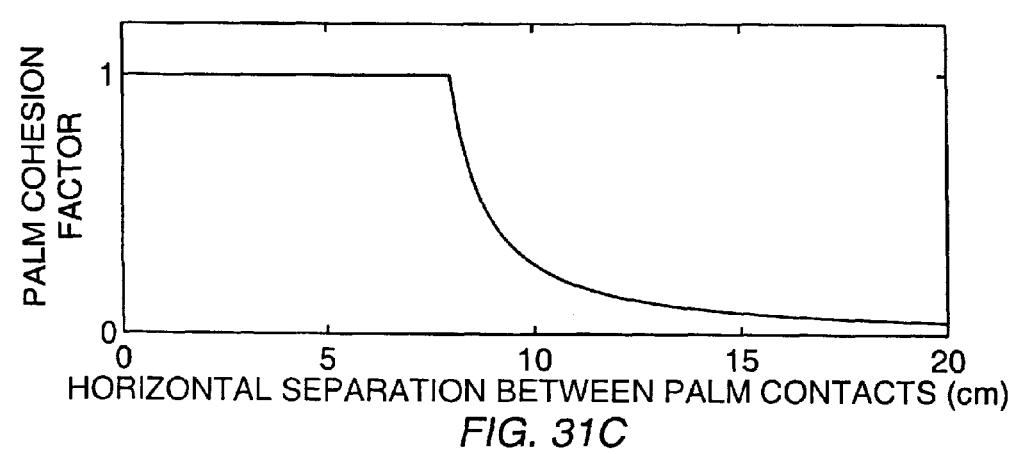
FIG. 31C is a plot of the palm cohesion factor versus maximum horizontal separation between palm contacts within a hand.

Distinguishing contact clusters is challenging because a cluster can become quite sparse and large when the fingers outstretched, with the pinky and thumb of the same hand spanning up to 20 cm. However, the palm can stretch very little in comparison, placing useful constraints on how far apart palm heel contacts and forepalms from the same hand can be. The entire palm region of an outstretched adult hand is about 10 cm square, so palm contact centroids should not be scattered over a region larger than about 8 cm. When a partition wrongly includes fingers from the opposite hand in a cluster, the within-cluster identification algorithm tends to assign the extra fingers from the opposite hand to palm heel and forepalm attractors. This usually causes the contacts assigned to the cluster's palm attractors to be scattered across the surface wider than is plausible for true palm contacts from a single hand. To punish such partitions, the palm cohesion factor quickly drops below one for a tentative hand cluster in which the supposed palm contacts are scattered over a region larger than 8 cm. Therefore its reciprocal will greatly increase the hand's basic cost. FIG. 31C shows the value of the palm cohesion factor versus horizontal separation between palm contacts. The horizontal spread can be efficiently measured by finding the maximum and minimum horizontal coordinates of all contacts identified as palm heels or forepalms and taking the difference between the maximum and minimum. The measurement and factor value lookup are repeated for the vertical separation, and the horizontal and vertical factors are multiplicatively combined to obtain the final palm cohesion factor.

Figure 33:
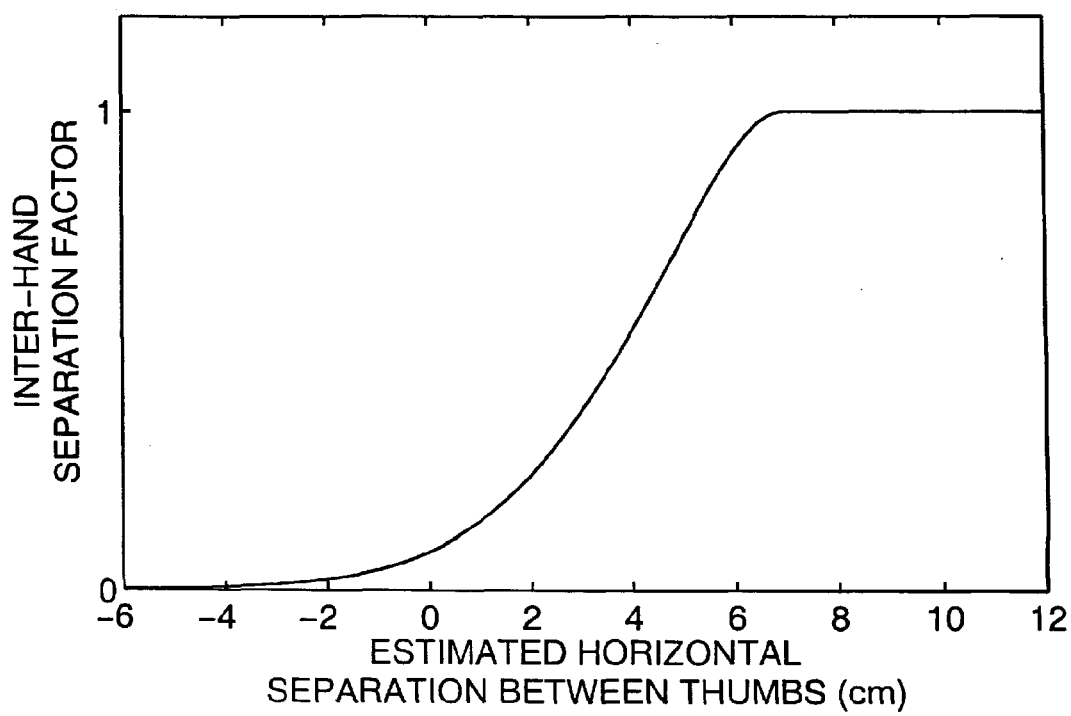
FIG. 33 is a plot of the inter-hand separation factor versus the estimated distance between the right thumb and left thumb.

FIG. 33 is an approximate plot of the inter-hand separation factor. This factor increases the total costs of partitions in which the estimated or actual horizontal positions of the thumbs from each hand approach or overlap. It is measured by finding the minimum of the horizontal offsets of right hand contacts with respect to their corresponding default finger positions. Similarly the maximum of the horizontal offsets of the left hand contacts with respect to their corresponding default finger positions is found. If the difference between these hand offset extremes is small enough to suggest the thumbs are overlapping the same columnar region of the surface while either touching the surface or floating above it, the separation factor becomes very small. Such overlap corresponds to a negative thumb separation in the plot. To encourage assignment of contacts which are within a couple centimeters of one another to the same cluster, the separation factor gradually begins to drop starting with positive separations of a few centimeters or less. The inter-hand separation factor is not applicable to partitions in which all surface contacts are assigned to the same hand, and takes on the default value of one in this case.

Alternative embodiments of this hand identification process can include additional constraint factors and remain well within the scope of this invention. For example, a velocity coherence factor could be computed to favor partitions in which all fingers within a cluster slide at approximately the same speed and direction, though each cluster as a whole has a different average speed and direction.

Sometimes irreversible decisions made by the chord motion recognizer or typing recognized on the basis of existing hand identifications prevent late changes in the identifications of hand contacts even when new proximity image information suggests existing identifications are wrong. This might be the case for a chord slide which generates input events that can not be undone, yet well into the slide new image information indicates some fingers in the chord should have been attributed to the opposite hand. In this case the user can be warned to stop the slide and check for possible input errors but in the meantime it is best to retain the existing identifications even if wrong, rather than switch to correct assignments which could have further unpredictable effects when added to the erroneous input events. Therefore once a chord slide has generated input events, the identifications of their existing paths may be locked so the hand identification algorithm can only swap identifications of subsequent new contacts.

This hand identification process can be modified for differently configured multi-touch surfaces and remain well within the scope of this invention. For surfaces which are so narrow that thumbs invade one another's space or so tall that one hand can lie above another, the contours need not be straight vertical lines. Additional contours could weave around candidate overlapping thumbs, or they could be perpendicular to the vector between the estimated hand positions. If the surface was large enough for more than one user, additional attractor rings would have to be provided for each additional hand, and multiple partitioning contours would be necessary per hypothesis to partition the surface into more than two portions. On a surface large enough for only one hand it might still be necessary to determine which hand was touching the surface. Then instead of hypothesizing different contours, the hand identification module would evaluate the hypotheses that either the left hand attractor ring or the right hand attractor ring was centered on the surface. If the surface was mounted on a pedestal to allow access from all sides, the hand identification module would also hypothesize various rotations of each attractor ring.

The attractor-based finger identification system 248 will successfully identify the individual hand contacts which comprise the pen grip hand configuration (FIG. 15). However, additional steps are needed to distinguish the unique finger arrangement within the pen grip from the normal arrangement within the closed hand configuration (FIG. 14). In this pen grip arrangement the outer fingers curl under toward the palms so their knuckles touch the surface and the index finger juts out ahead of them. The pen grip detection module 17 employs a fuzzy pattern recognition process similar to the thumb verification process to detect this unique arrangement.

An additional problem with handwriting recognition via the pen grip hand configuration is that the inner gripping fingers and sometimes the whole hand will be picked up between strokes, causing the distinguishing finger arrangement to temporarily disappear. Therefore the pen grip recognition process must have hysteresis to stay in handwriting mode between gripping finger lifts. In the preferred embodiment, hysteresis is obtained by temporal filtering of the combined fuzzy decision factors and by using the estimated finger positions in measurements of finger arrangement while the actual fingers are lifted off the surface. The estimated finger positions provide effective hysteresis because they temporarily retain the unique jutting arrangement before decaying back toward the normal arched fingertip positions a few seconds after liftoff.

Figure 28:
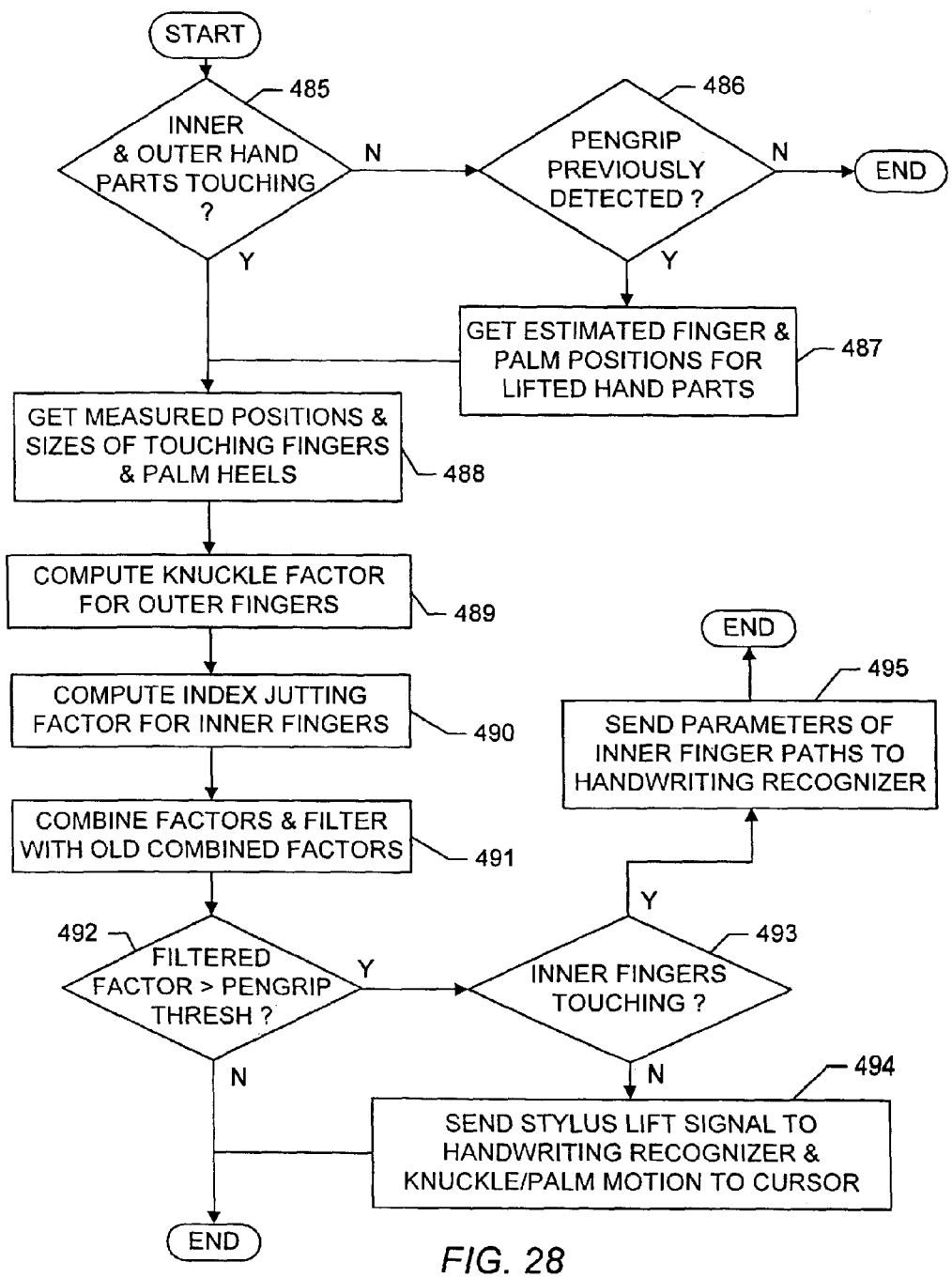
FIG. 28 is a flow chart of the pen grip detection process.

FIG. 28 shows the steps within the pen grip detection module 17. Decision diamond 485 determines whether all pen grip hand parts are touching the surface. If not decision diamond 486 causes the estimated finger and palm positions to be retrieved for any lifted parts in step 487 only if pen grip or handwriting mode is already active. Otherwise the process exits for lack of enough surface contacts. Thus the estimated finger positions cannot be used to start handwriting mode, but they can continue it. Step 488 retrieves the measured positions and sizes of fingers and palm heels which are touching the surface.

Step 489 computes a knuckle factor from the outer finger sizes and their vertical distance from the palm heels which peaks as the outer finger contacts become larger than normal fingertips and close to the palm heels. Step 490 computes a jutting factor from the difference between the vertical coordinates of the inner and outer fingers which peaks as the index fingertip juts further out in front of the knuckles. Step 491 combines the knuckle and jutting factors in a fuzzy logic expression and averages the result with previous results via an autoregressive or moving average filter. Decision diamond 492 continues or starts pen grip mode if the filtered expression result is above a threshold which may itself be variable to provide additional hysteresis. While in pen grip mode, typing 12 and chord motion recognition 18 are disabled for the pen gripping hand.

In pen grip mode, decision diamond 493 determines whether the inner gripping fingers are actually touching the surface. If so, step 495 generates inking events from the path parameters of the inner fingers and appends them to the outgoing event queue of the host communication interface. These inking events can either cause "digital ink" to be layed on the display 24 for drawing or signature capture purposes, or they can be intercepted by a handwriting recognition system and interpreted as gestures or language symbols. Handwriting recognition systems are well known in the art.

If the inner fingers are lifted, step 494 sends stylus raised events to the host communication interface to instruct the handwriting recognition system of a break between symbols. In some applications the user may need to indicate where the "digital ink" or interpreted symbols are to be inserted on the display by positioning a cursor. Though on a multi-touch surface a user could move the cursor by leaving the pen grip configuration and sliding a finger chord, it is preferable to allow cursor positioning without leaving the pen grip configuration. This can be supported by generating cursor positioning events from slides of the palm heels and outer knuckles. Since normal writing motions will also include slides of the palm heels and outer knuckles, palm motions should be ignored until the inner fingers have been lifted for a few hundred milliseconds.

Should the user actually pick up a conductive stylus and attempt to write with it, the hand configuration will change slightly because the inner gripping fingers will be directing the stylus from above the surface rather than touching the surface during strokes. Since the forearm tends to supinate more when actually holding a stylus, the inner palm heel may also stay off the surface while the hand rests on the sides of the pinky, ring finger and the outer palm heel. Though the outer palm heel may lie further outward than normal with respect to the pinky, the ring and pinky fingers will still appear as large knuckle contacts curled close to the outer palm. The tip of the stylus essentially takes the place of the index fingertip for identification purposes, remaining at or above the vertical level of the knuckles. Thus the pen grip detector can function in essentially the same way when the user writes with a stylus, except that the index fingertip path sent to the host communication interface will in actuality be caused by the stylus.

Technically, each hand has 24 degrees of freedom of movement in all finger joints combined, but as a practical matter, tendon linkage limitations make it difficult to move all of the joints independently. Measurements of finger contacts on a surface yield ten degrees of freedom in motion lateral to the surface, five degrees of freedom in individual fingertip pressure or proximity to the surface, and one degree of freedom of thumb orientation. However, many of these degrees of freedom have limited ranges and would require unreasonable twisting and dexterity from the average user to access independently.

The purpose of the motion component extraction module 16 is to extract from the 16 observable degrees of freedom enough degrees of freedom for common graphical manipulation tasks in two and three dimensions. In two dimensions the most common tasks are horizontal and vertical panning, rotating, and zooming or resizing. In three dimensions, two additional rotational degrees of freedom are available around the horizontal and vertical axes. The motion component extractor attempts to extract these 4-6 degrees of freedom from those basic hand motions which can be performed easily and at the same time without interfering with one another. When multiple degrees of freedom can be accessed at the same time they are said to be integral rather than separable, and integral input devices are usually faster because they allow diagonal motions rather than restricting motions to be along a single axis or degree of freedom at one time.

When only four degrees of freedom are needed, the basic motions can be whole hand translation, hand scaling by uniformly flexing or extending the fingers, and hand rotation either about the wrist as when unscrewing a jar lid or between the fingers as when unscrewing a nut. Not only are these hand motions easy to perform because they utilize motions which intuitively include the opposable thumb, they correspond cognitively to the graphical manipulation tasks of object rotation and sizing. Their only drawback is that the translational motions of all the fingers during these hand rotations and scalings do not cancel perfectly and can instead add up to a net translation in some direction in addition to the desired rotation or scaling. To allow all motions to be performed simultaneously so that the degrees of freedom are integral yet to prevent unintended translations from imperfectly performed scalings and rotations, the motion extractor preferentially weights the fingers whose translations cancel best and non-linearly scales velocity components depending on their speeds relative to one another.

Figure 34:
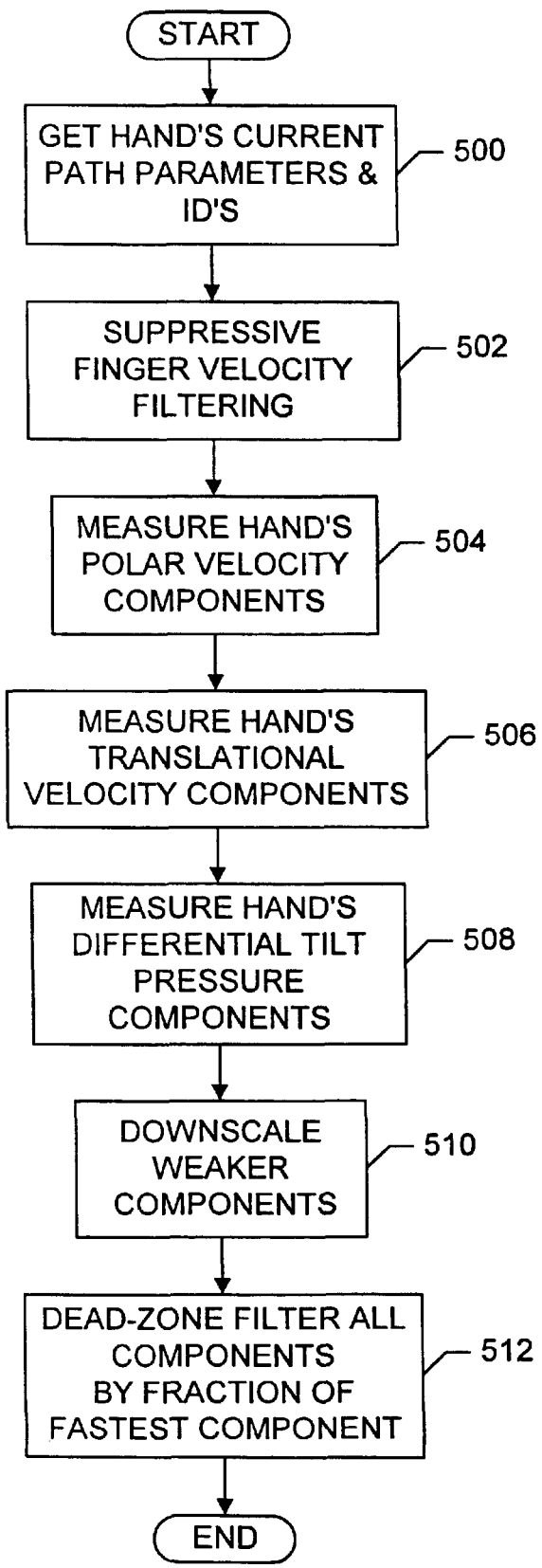
FIG. 34 is a flow chart of hand motion component extraction.

The processes within the motion component extractor 16 are shown in FIG. 34. Step 500 first fetches the identified contact paths 250 for the given hand. These paths contain the lateral velocities and proximities to be used in the motion calculations, and the identifications are needed so that motion of certain fingers or palm heels which would degrade particular motion component calculations can be deemphasized.

The next step 502 applies additional filtering to the lateral contact velocities when finger proximity is changing rapidly. This is necessary because during finger liftoff and touch down on the surface, the front part of the fingertip often touches down before and lifts off after the back of the fingertip, causing a net downward or upward lateral translation in the finger centroid. Such proximity-dependent translations can be put to good use when slowly rolling the fingertip for fine positioning control, but they can also annoy the user if they cause the cursor to jump away from a selected position during finger liftoff. This is prevented by temporarily downscaling a finger's lateral velocity in proportion to large changes in the finger's proximity. Since other fingers within a hand tend to shift slightly as one finger lifts off, additional downscaling of each finger velocity is done in response to the maximum percent change in proximity among contacting fingers. Alternatively, more precise suppression can be obtained by subtracting from the lateral finger speed an amount proportional to the instantaneous change in finger contact height. This assumes that the perturbation in lateral finger velocity caused by finger liftoff is proportional to the change in contact height due to the back of the fingertip lifting off first or touching down last.

Figure 35:
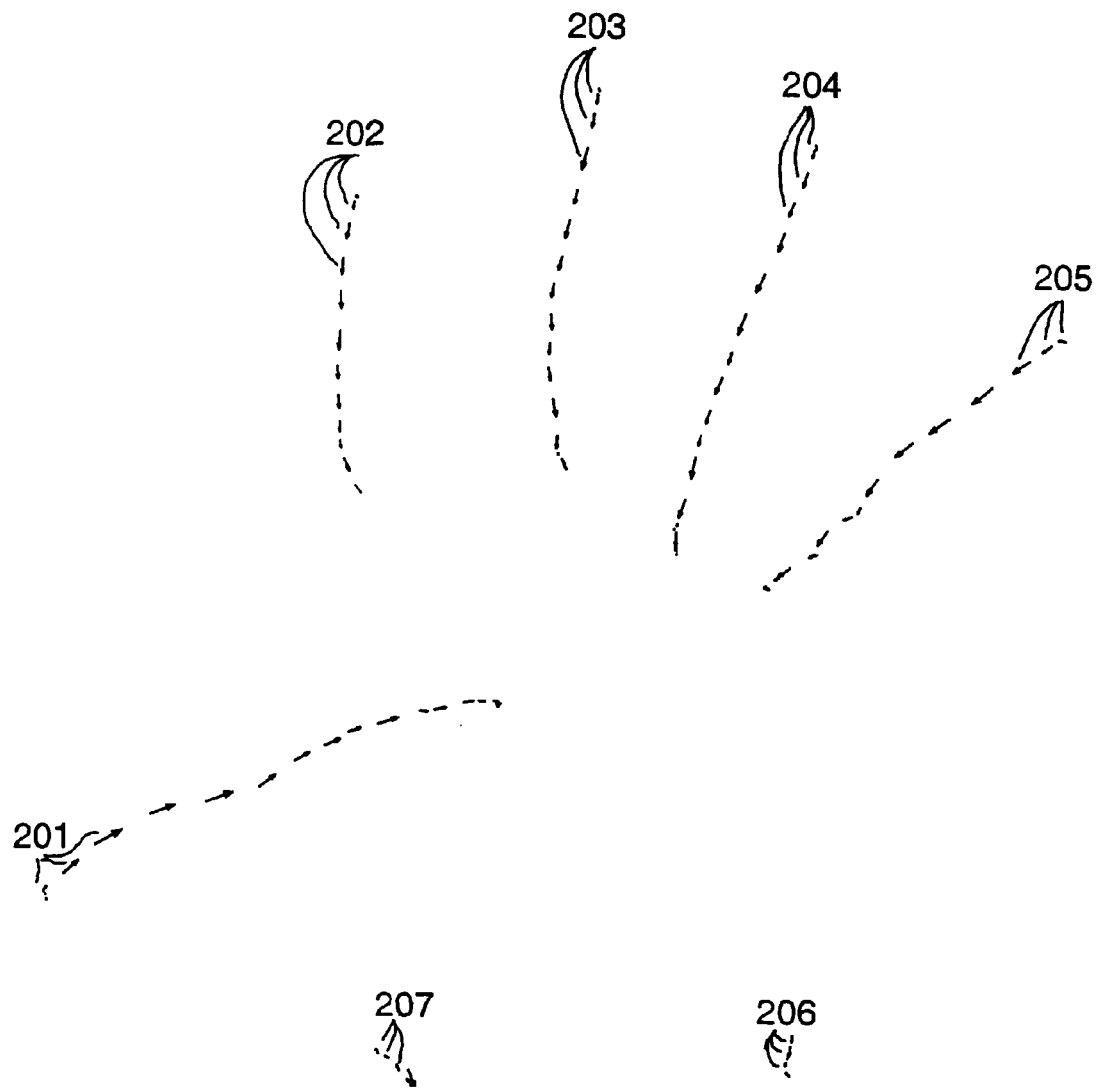
FIG. 35 is a diagram of typical finger trajectories when hand is contracting.
Figure 36:
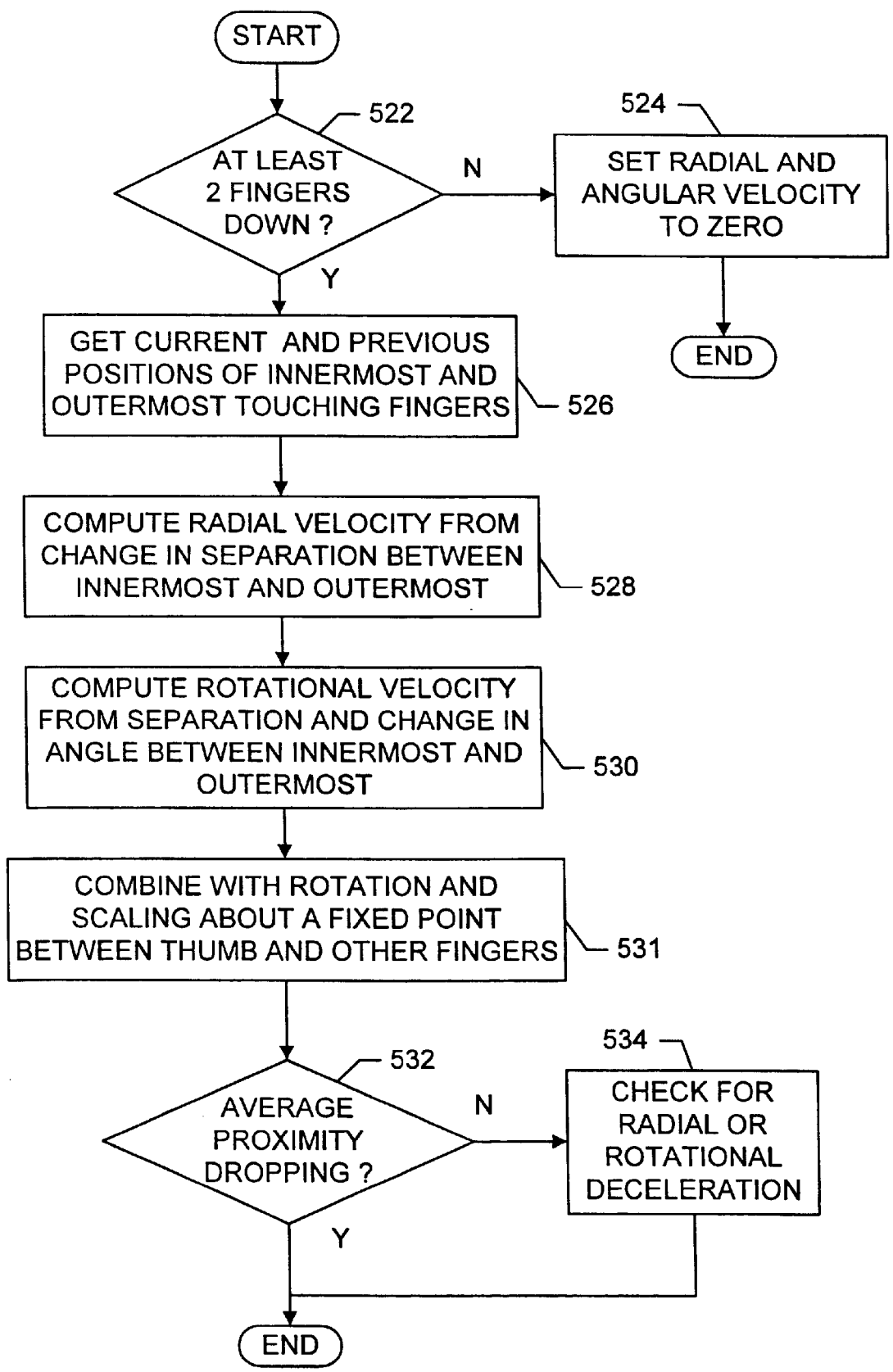
FIG. 36 is a flow chart of radial and angular hand velocity extraction.

Process 504, whose detailed steps are shown in FIG. 36, measures the polar velocity components from radial (scaling) and rotational motion. Unless rotation is extracted from thumb orientation changes, at least two contacting fingers are necessary to compute a radial or angular velocity of the hand. Since thumb motion is much more independent of the other fingers than they are of one another, scalings and rotations are easier for the user to perform if one of these fingers is the opposable thumb, but the measurement method will work without the thumb. If decision diamond 522 determines that less than two fingers are touching the surface, step 524 sets the radial and rotational velocities of the hand to zero. FIG. 35 shows trajectories of each finger during a contractive hand scaling. The thumb 201 and pinky 205 travel in nearly opposite directions at roughly the same speed, so that the sum of their motions cancels for zero net translation, but the difference in their motions is maximized for a large net scaling. The central fingers 202-204 also move toward a central point but the palm heels remain stationary, failing to complement the flexing of the central fingers. Therefore the difference between motion of a central finger and any other finger is usually less than the difference between the pinky and thumb motions, and the sum of central finger velocities during a hand scaling adds up to a net vertical translation. Similar phenomena occur during hand rotations, except that if the rotation is centered at the wrist with forearm fixed rather than centered at the forepalms, a net horizontal translation will appear in the sum of motions from any combination of fingers.

Since the differences in finger motion are usually greatest between thumb and pinky, step 526 only retrieves the current and previous positions of the innermost and outermost touching fingers for the hand scaling and rotation measurements.

Step 528 then computes the hand scaling velocity $H_{xx}$ from the change in distance between the innermost finger FI and outermost finger FO with approximately the following equation:

$$Hvs[n] = \frac{d(FI[n], FO[n]) - d(fi[n-1], FO[n-1])}{\Delta t} \quad (66)$$

where d(FI[n],FO[n]) is the squared Euclidean distance between the fingers:

$$d(FI[n], FO[n]) = \sqrt{(FI_x[n] - FO_x[n])^2 + (FI_y[n] - FO_y[n])^2} \quad (67)$$

If one of the innermost or outermost fingers was not touching during the previous proximity image, the change in separation is assumed to be zero. Similarly, step 530 computes the hand rotational velocity $H_{xx}$ from the change in angle between the innermost and outermost finger with approximately the following equation:

$$H_{vr}[n] = \left(\frac{\angle(FI[n], (FO[n])) - \angle(FI[n-1], FO[n-1])}{\Delta t}\right) \times$$

$$\left(\frac{d(FI[n], FO[n])}{\pi}\right) \quad (68)$$

The change in angle is multiplied by the current separation to convert it to the same units as the translation and scaling components. These equations capture any rotation and scaling components of hand motion even if the hand is also translating as a whole, thus making the rotation and scaling degrees of freedom integral with translation.

Another reason the computations above are restricted to the thumb and pinky or innermost and outermost fingers is that users may want to make fine translating manipulations with the central fingers, i.e., index, middle, and ring, while the thumb and pinky remain stationary. If changes in distances or angles between the central fingers and the thumb were averaged with Equations 66-68, this would not be possible because central finger translations would cause the appearance of rotation or scaling with respect to the stationary thumb or pinky. However, Equations 56-60 applied in the thumb verification process are only sensitive to symmetric rotation and scaling about a fixed point between the fingers. They approach zero if any significant whole hand translation is occurring or the finger motions are not complementary. In case the user fails to properly move the outermost finger during a rotation or scaling gesture, step 531 uses equations of the approximate form of Equations 56-60 to compute rotation and scaling velocities between the thumb and any touching fingers other than the outermost. The resulting velocities are preferably combined with the results of Equations 66-68 via a maximum operation rather than an average in case translational motion causes the fixed point rotations or scalings to be zero. Finally, decision diamond 532 orders a check for radial or rotational deceleration 534 during motions prior to finger liftoff. The method for detecting radial or rotational deceleration is the same as that detailed in the description of translation extraction.

Figure 37:
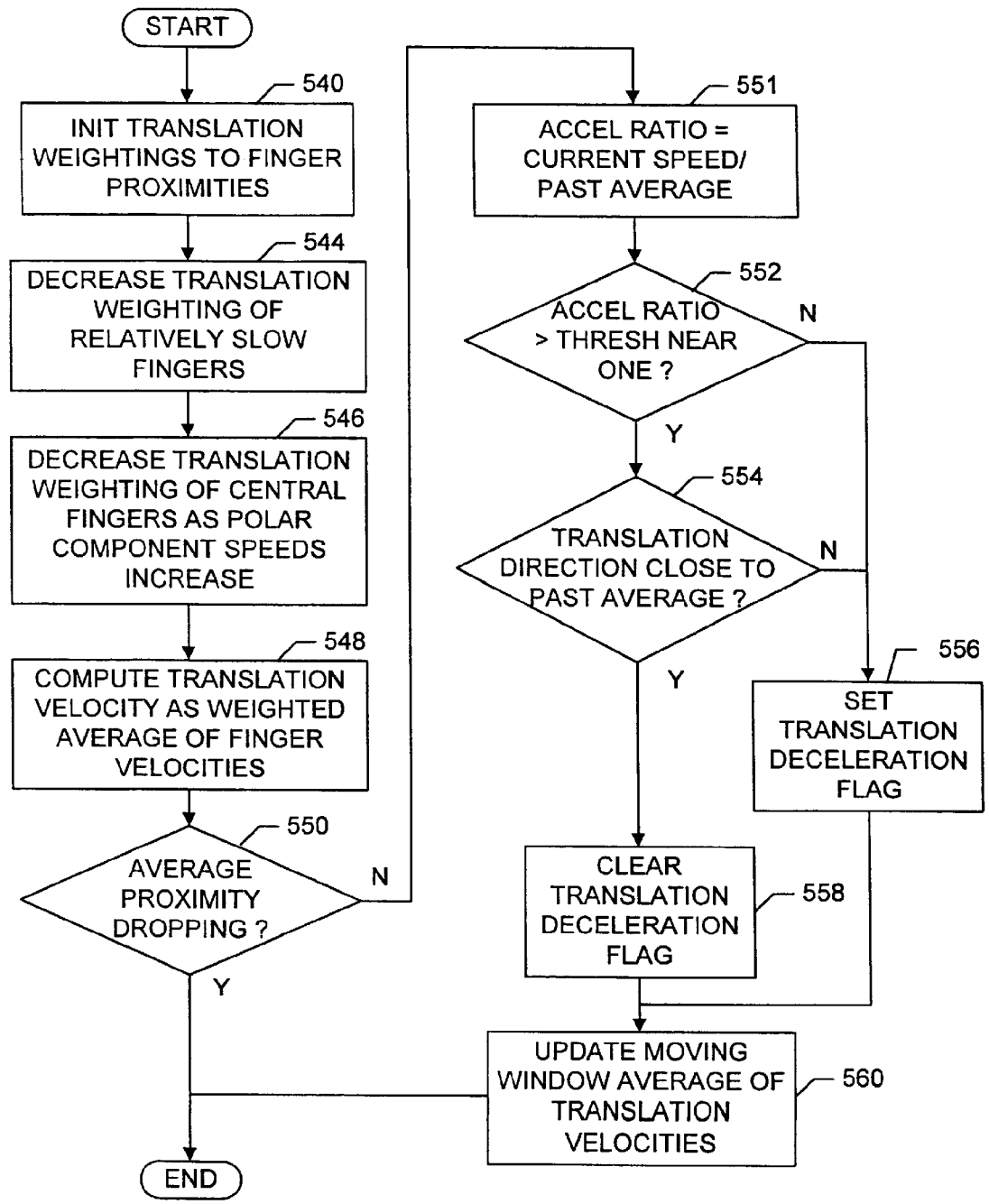
FIG. 37 is a flow chart showing extraction of translational hand velocity components.

FIG. 37 shows the details of hand translational velocity measurements referred to in process 506 of FIG. 34. The simplest way to compute a hand translation velocity would be to simply average the lateral velocities of each finger. However, the user expects the motion or control to display gain to be constant regardless of how many fingers are being moved, even if some are resting stationary. Furthermore, if the user is simultaneously scaling or rotating the hand, a simple average is sensitive to spurious net translations caused: by uncanceled central finger motions.

Therefore, in a preferred embodiment the translational component extractor carefully assigns weightings for each finger before computing the average translation. Step 540 initializes the translation weighting $Fi_{vw}$ of each finger to its total contact proximity, i.e., $Fi_{vw}[n]=Fi_z[n]$. This ensures that fingers not touching the surface do not dilute the average with their zero velocities and that fingers which only touch lightly have less influence since their position and velocity measurements may be less reliable. The next step 544 decreases the weightings of fingers which are relatively stationary so that the control to display gain of intentionally moving fingers is not diluted. This can be done by finding the fastest moving finger, recording its speed as a maximum finger speed and scaling each finger's translation weighting in proportion to its speed divided by the maximum of the finger speeds, as shown approximately in the formula below:

$$Fi_{vw}[n] := Fi_{vw}[n] \times \left(\frac{Fi_{speed}[n]}{\max_j Fi_{speed}[n]}\right)^{ptw} \quad (69)$$

where the power ptw adjusts the strength of the speed dependence. Note that step 544 can be skipped for applications such as computer-aided-design in which users desire both a normal cursor motion gain mode and a low gain mode. Lower cursor motion gain is useful for fine, short range positioning, and would be accessed by moving only one or two fingers while keeping the rest stationary.

Step 546 decreases the translation weightings for the central fingers during hand scalings and rotations, though it does not prevent the central fingers from making fine translational manipulations while the thumb and pinky are stationary. The formulas below accomplish this seamlessly by downscaling the central translation weightings as the magnitudes of the rotation and scaling velocities become significant compared to $K_{polarthresh}$:

$$Fi_{vwx}[n] \approx \frac{Fi_{vw}[n] \times K_{polarthresh}}{K_{polarthresh} + |H_{vr}[n]|} \quad (70)$$

$$Fi_{vwy}[n] \approx \frac{Fi_{vw}[n] \times K_{polarthresh}}{K_{polarthresh} + |H_{vr}[n]| + |H_{vs}[n]|} \quad (71)$$

where these equations are applied only to the central fingers whose identities i are between the innermost and outermost. Note that since hand scaling does not cause much horizontal translation bias, the horizontal translation weighting $Fi_{vwx}[n]$ need not be affected by hand scaling velocity $H_{vs}[n]$, as indicated by the lack of a hand scaling term in Equation 70. The translation weightings of the innermost and outermost fingers are unchanged by the polar component speeds, i.e., $FI_{vwx}[n]=FI_{vwx}[n]=FI_{vw}[n]$ and $FO_{vwx}[n]=FO_{vwx}[n]=FO_{vw}[n]$. Step 548 finally computes the hand translation velocity vector $(H_{vx}[n],H_{vy}[n])$ from the weighted average of the finger velocities:

$$H_{vx}[n] = \frac{\sum_{i=1}^{5} Fi_{vwx} Fi_{vx}}{\sum_{i=1}^{5} Fi_{vwx}} \quad (72)$$

$$H_{vy}[n] = \frac{\sum_{i=1}^{5} Fi_{vwy} Fi_{vy}}{\sum_{i=1}^{5} Fi_{vwy}} \quad (73)$$

The last part of the translation calculations is to test for the lateral deceleration of the fingers before liftoff, which reliably indicates whether the user wishes cursor motion to stop at liftoff. If deceleration is not detected prior to liftoff, the user may intend cursor motion to continue after liftoff, or the user may intend a special "one-shot" command to be invoked. Decision diamond 550 only invokes the deceleration tests while finger proximities are not dropping too quickly, to prevent the perturbations in finger centroids which can accompany finger liftoff from interfering with the deceleration measurements. Step 551 computes the percentage acceleration or ratio of current translation speed $|H_{vx}[n],H_{vy}[n]|$ to a past average translation speed preferably computed by a moving window average or autoregressive filter. Decision diamond 552 causes the translation deceleration flag to be set 556 if the acceleration ratio is less than a threshold. If this threshold is set greater than one, the user will have to be accelerating the fingers just prior to liftoff for cursor motion to continue. If the threshold is set just below one, cursor motion will reliably be continued as long as the user maintains a constant lateral speed prior to liftoff, but if the user begins to slow the cursor on approach to a target area of the display the deceleration flag will be set. Decision diamond 554 can also cause the deceleration flag to be set if the current translation direction is substantially different from an average of past directions. Such change in direction indicates the hand motion trajectory is curving, in which case cursor motion should not be continued after liftoff because accurately determining the direction to the user's intended target becomes very difficult. If neither deceleration nor curved trajectories are detected, step 558 clears the translation deceleration flag. This will enable cursor motion continuation should the fingers subsequently begin liftoff. Note that decision diamond 550 prevents the state of the translation deceleration flags from changing during liftoff so that the decision after liftoff to continue cursor motion depends on the state of the deceleration flag before liftoff began. The final step 560 updates the autoregressive or moving window average of the hand translation velocity vector, which can become the velocity of continued cursor motion after liftoff. Actual generation of the continued cursor motion signals occurs in the chord motion recognizer 18 as will be discussed with FIG. 40.

Note that this cursor motion continuation method has several advantages over motion continuation methods in related art. Since the decision to continue motion depends on a percentage acceleration which inherently normalizes to any speed range, the user can intentionally invoke motion continuation from a wide range of speeds including very low speeds. Thus the user can directly invoke slow motion continuation to auto scroll a document at readable speeds. This is not true of Watanabe's method in U.S. Pat. No. 4,734,685, which only continues motion when the user's motion exceeds a high speed threshold, nor of Logan et al.'s method in U.S. Pat. No. 5,327,161, which if enabled for low finger speeds will undesirably continue motion when a user decelerates on approach to a large target but fails to stop completely before lifting off. Percentage acceleration also captures user intent more clearly than position of a finger in a border area. Position of a finger in a border area as used in U.S. Pat. No. 5,543,591 to Gillespie et al. is ambiguous because the cursor can reach its desired target on the display just as the finger enters the border, yet the touchpad device will continue cursor motion past the target because it thinks the finger has run out of space to move. In the present invention, on the other hand, the acceleration ratio will remain near one if the fingers can slide off the edge of the sensing array without hitting a physical barrier, sensibly invoking motion continuation. But if the fingers decelerate before crossing or stop on the edge of the sensing array, the cursor will stop as desired.

Figure 38:
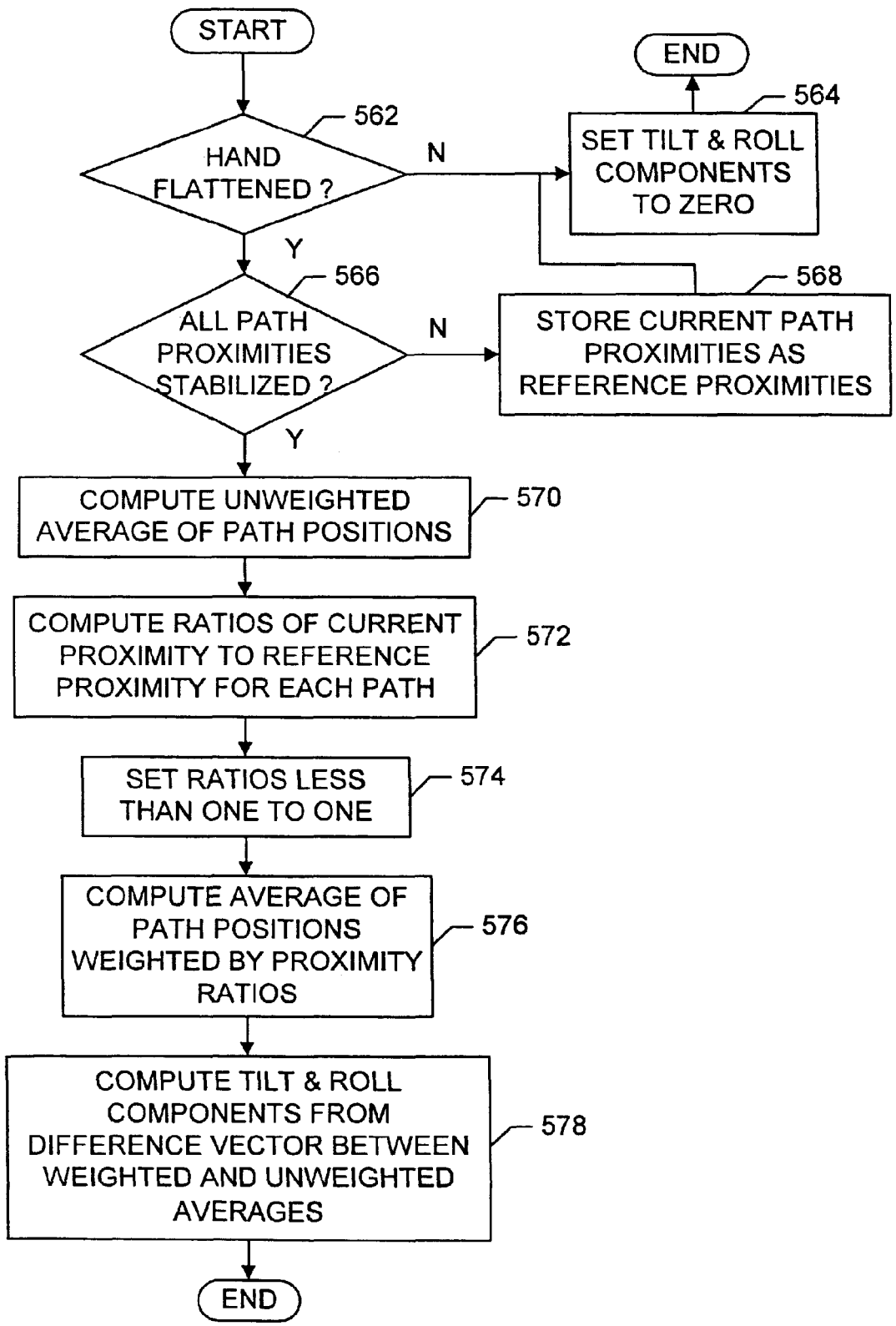
FIG. 38 is a flow chart of differential hand pressure extraction.

The details of the differential hand pressure extraction process 508 are shown in FIG. 38. Fingertip proximity, quickly saturates when pressure is applied through the bony tip normal to a hard surface. Unless the surface itself is highly compliant, the best dynamic range of fingertip pressure is obtained with the fingers outstretched and hand nearly flattened so that the compressible soft pulp underneath the fingertips rests on the surface. Decision diamond 562 therefore causes the tilt and roll hand pressure components to be set to zero in step 564 and pressure extraction to abort unless the hand is nearly flattened. Inherent in the test for hand flattening 562 is a finger count to ensure that most of the five fingers and both palm heels are touching the surface to maximize the precision of the hand pressure measurements, though technically only three non-collinear hand contacts arranged like a tripod are necessary to establish tilt and roll pressures. Decision diamond 562 can also require the user to explicitly enable three-dimensional manipulation with an intuitive gesture such as placing all five fingers on the surface briefly tapping the palm heels on the surface, and finally resting the palm heels on the surface. Decision diamond 566 causes step 568 to capture and store reference proximities for each contact path when the proximity of all contacts have stabilized at the end of this initiation sequence. The tilt and roll pressure components are again zeroed 564 for the sensor array scan cycle during which this calibration is performed.

However, during subsequent scan cycles the user can tilt the hand forward applying more pressure to the fingertips or backward applying more pressure to the palm heels or the user can roll the hand outward onto the pinky and outer palm heel or inward applying more pressure to the thumb, index finger and inner palm heel. Step 5170 will proceed to calculate an unweighted average of the current contact positions. Step 572 computes for each hand part still touching the surface the ratio of current proximity to the reference proximity previously stored. To make these ratios less sensitive to accidental lifting of hand parts, step 574 clips them to be greater or equal to one so only increases in proximity and pressure register in, the tilt and roll measurements. Another average contact path position is computed in step 576, but this one is weighted by the above computed proximity ratios for each path. The difference between these weighted and unweighted contact position averages taken in step 578 produces a vector whose direction can indicate the direction of roll or tilt and whose magnitude can control the rate of roll or tilt about x and y axes.

Since the weighted and unweighted position averages are only influenced by positions of currently contacting fingers and increases in contact pressure or proximity, the method is insensitive to finger liftoffs. Computation of reference-normalized proximity ratios in step 572 rather than absolute changes in proximity prevents the large palm heel contacts from having undue influence on the weighted average position.

Since only the current contact positions are used in the average position computations, the roll and tilt vector is independent of lateral motions such as hand translation or rotation as long as the lateral motions do not disturb finger pressure, thus once again achieving integrality. However, hand scaling and differential hand pressure are difficult to use at the same time because flexing the fingers generally causes significant decreases in fingertip contact area and thus interferes with inference of fingertip pressure changes. When this becomes a serious problem, a total hand pressure component can be used as a sixth degree of freedom in place of the hand scaling component. This total pressure component causes cursor velocity along a z-axis in proportion to deviations of the average of the contact proximity ratios from one. Alternative embodiments may include further enhancements such as adapting the reference proximities to slow variations in resting hand pressure and applying a dead zone filter to ignore pressure difference vectors with small magnitudes.

Despite the care taken to measure the polar velocity, translation velocity, and hand pressure components in such a way that the resultant vectors are independent of one another, uneven finger motion during hand scaling, rotation, or translation can still cause minor perturbations in measurements of one degree of freedom while primarily attempting to move in another. Non-linear filtering applied in steps 510 and 512 of FIG. 34 removes the remaining motion leakage between dominant components and nearly stationary components. In steps 510 each component velocity is downscaled by the ratio of its average speed to the maximum of all the component speeds, the dominant component speed:

$$H_{vx}[n] := H_{vx}[n] \times \left(\frac{H_{xyspeed}[n]}{dominantspeed}\right)^{pds} \quad (74)$$

$$H_{vy}[n] := H_{vy}[n] \times \left(\frac{H_{xyspeed}[n]}{dominantspeed}\right)^{pds} \quad (75)$$

$$H_{vs}[n] := H_{vs}[n] \times \left(\frac{H_{sspeed}[n]}{dominantspeed}\right)^{pds} \quad (76)$$

$$H_{vr}[n] := H_{vr}[n] \times \left(\frac{H_{rspeed}[n]}{dominantspeed}\right)^{pds} \quad (77)$$

where $H_{xyspeed}[n]$, $H_{sspeed}[n]$, and $H_{rspeed}[n]$ are autoregressive averages over time of the translation speed, scaling speed, and rotational speed, where:

dominant_speed=max($H_{xyspeed}[n]$,$H_{sspeed}[n]$, $H_{rspeed}[n]$) (78)

where pds controls the strength of the filter. As pdy is adjusted towards infinity the dominant component is picked out and all components less than the dominant tend toward zero producing the orthogonal cursor effect well-known in drawing applications. As pds is adjusted towards zero the filters have no effect. Preferably, pds is set in between so that components significantly slower than the dominant are slowed further, but components close to the dominant in speed are barely affected, preserving the possibility of diagonal motion in multiple degrees of freedom at once. The autoregressive averaging helps to pick out the component or components which are dominant over the long term and suppress the others even while the dominant components are slowing to a stop.

Step 512 takes a second pass with a related filter known as a dead-zone filter. A dead-zone filter produces zero output velocity for input velocities less than a speed threshold but produces output speeds in proportion to the difference between the input speed and the threshold for input velocities that exceed the threshold. Preferably the speed threshold or width of the dead zone is set to a fraction of the maximum of current component speeds. All velocity components are filtered using this same dead zone width. The final extracted component velocities are forwarded to the chord motion recognizer module 18 which will determine what if any input events should be generated from the motions.

Figure 39A:
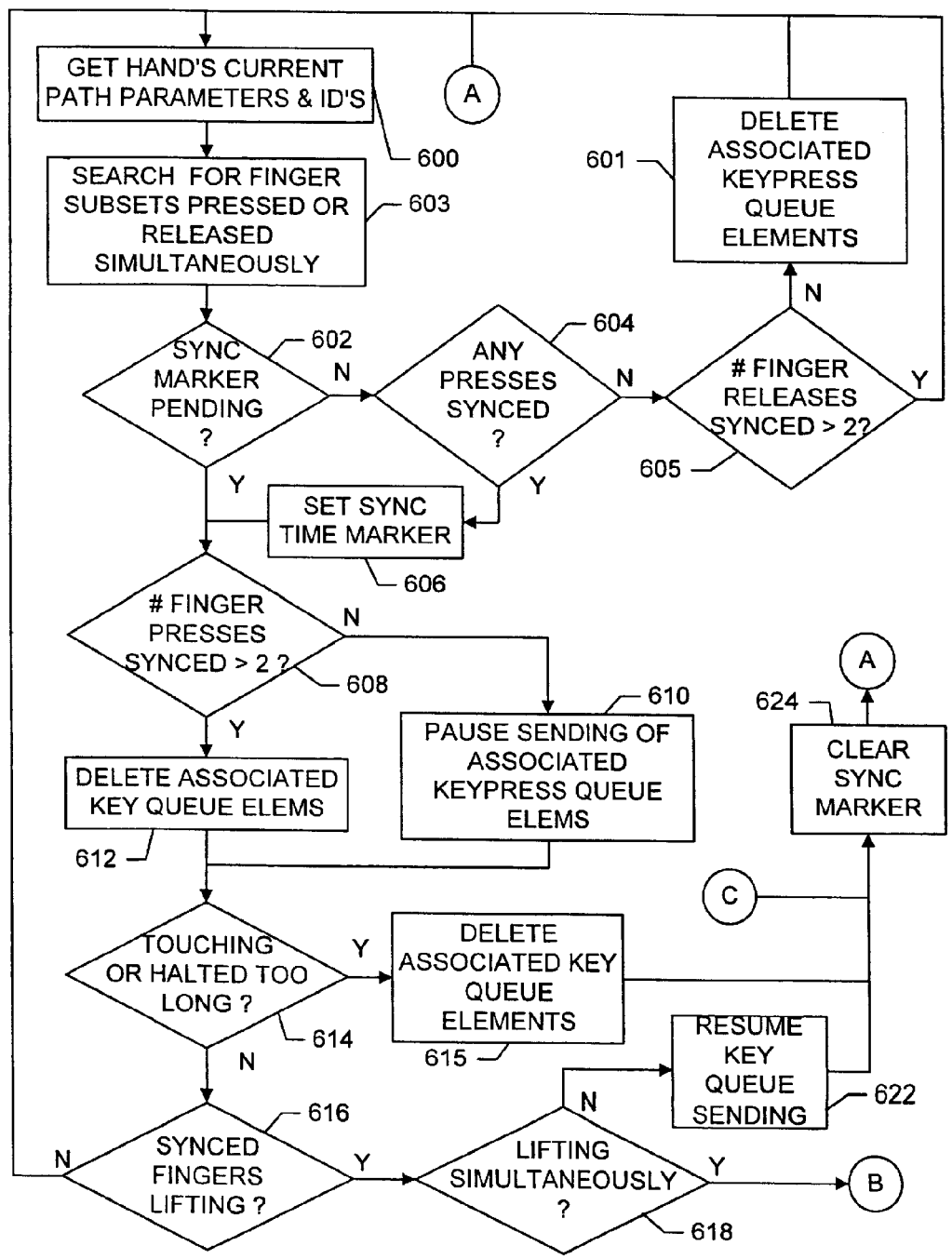
FIG. 39A is a flow chart of the finger synchronization detection loop.

FIG. 39A shows the details of the finger synchronization detector module 14. The synchronization detection process described below is repeated for each hand independently. Step 600 fetches proximity markers and identifications for the hand's current paths. The identifications will be necessary to ignore palm paths and identify combinations of synchronized fingers, while the proximity markers record the time at which each contact path first exceeds a press proximity threshold and the time at which each contact path drops below a release proximity threshold prior to total liftoff. Setting these proximity thresholds somewhat higher than the minimum proximity considered significant by the segmentation search process 264, produces more precise finger press and release times.

Step 603 searches for subsets of fingers which touch down at about the same time and for subsets of fingers which lift off at about the same time. This can be done by recording each finger path along with its press time in a temporally ordered list as it crosses the press proximity threshold. Since the primary function of the palms is to support the forearms while the hands are resting, palm activity is ignored by the typing 12 and chord motion recognizers 18 except during differential hand pressure extraction and palm heel presses can be excluded from this list and most other synchronization tests. To check for synchronization between the two most recent finger presses, the press times of the two most recent entries in the list are compared. If the difference between their press times is less than a temporal threshold, the two finger presses are considered synchronized. If not, the most recent finger press is considered asynchronous. Synchronization among three or more fingers up to five is found by comparing press times of the three, four, or five most recent list entries. If the press time of the most recent entry is within a temporal threshold of the nth most recent entry, synchronization among the n most recent finger presses is indicated. To accommodate imprecision in touchdown across the hand, the magnitude of the temporal threshold should increase slightly in proportion to the number of fingers being tested for synchronization. The largest set of recent finger presses found to be synchronized is recorded as the synchronized subset, and the combination of finger identities comprising this subset is stored conveniently as a finger identity bitfield. The term subset is used because the synchronized press subset may not include all fingers currently touching the surface, as happens when a finger touches down much earlier than the other fingers yet remains touching as they simultaneously touch down. An ordered list of finger release times is similarly maintained and searched separately. Alternative embodiments may require that a finger still be touching the surface to be included in the synchronized press subset.

Decision diamond 602 checks whether a synchronization marker is pending from a previous image scan cycle. If not, decision diamond 604 checks whether the search 603 found a newly synchronized press subset in the current proximity image. If so, step 606 sets the temporal synchronization marker to the oldest press within the new synchronized subset. Additional finger presses may be added to the subset during future scan cycles without affecting the value of this temporal synchronization marker. If there is currently no finger press synchronization, decision diamond 605 determines whether three or more fingers have just been released simultaneously. Simultaneous release of three or more fingers should not occur while typing with a set of fingers but does occur when lifting fingers off the surface from rest. Therefore simultaneous release of three or more fingers reliably indicates that the released fingers are not intended as keypresses and should be deleted from the keypress queue 605, regardless of whether these same fingers touched down synchronously. Release synchronization of two fingers is not by itself a reliable indicator of typing intent and has no effect on the keypress queue. The keypress queue is described later with FIGS. 42-43B.

Once a press synchronization marker for the hand is pending, further processing checks the number of finger presses which are synchronized and waits for release of the synchronized fingers. If decision diamond 608 finds three or more fingers in the synchronized press subset the user cannot possibly be typing with these fingers. Therefore step 612 immediately deletes the three or more synchronized presses from the keypress queue. This way they cannot cause key symbol transmission to the host, and transmission of key symbols from subsequent asynchronous presses is not blocked waiting for the synchronized fingers to be released.

However, when the synchronization only involves two finger presses 608, it is difficult to know whether the user intended to tap a finger pair chord or intended to type two adjacent keys and accidentally let the key presses occur simultaneously. Since such accidental simultaneous presses are usually followed by asynchronous releases of the two fingers, but finger pair chords are usually released synchronously, the decision whether the presses are asynchronous key taps or chord taps must be delayed until finger release can be checked for synchronization. In the meantime, step 610 places a hold on the keypress queue to prevent transmission of key symbols from the possible finger chord or any subsequent finger presses. To prevent long backups in key transmission, decision diamond 614 will eventually release the queue hold by having step 615 delete the synchronized presses from the keypress queue if both fingers remain touching a long time. Though this aborts the hypothesis that the presses were intended as key taps, the presses are also less likely to be key taps if the fingers are not lifted soon after touchdown.

If the synchronized fingers are not lifting, decision diamond 616 leaves the synchronization marker pending so synchronization checks can be continued with updated path parameters 600 after the next scan cycle. If the synchronized fingers are lifting, but decision diamond 618 finds with the help of the synchronization release search 603 that they are doing so asynchronously 618, step 622 releases any holds on the keypress queue assuming any synchronized finger pair was intended to be two keypresses. Though the synchronized finger presses are not deleted from the keypress queue at this point, they may have already been deleted in step 612 if the pressed subset contained more than two. Also, step 624 clears the temporal synchronization marker, indicating that no further synchronization tests need be done for this subset.

Figure 39B:
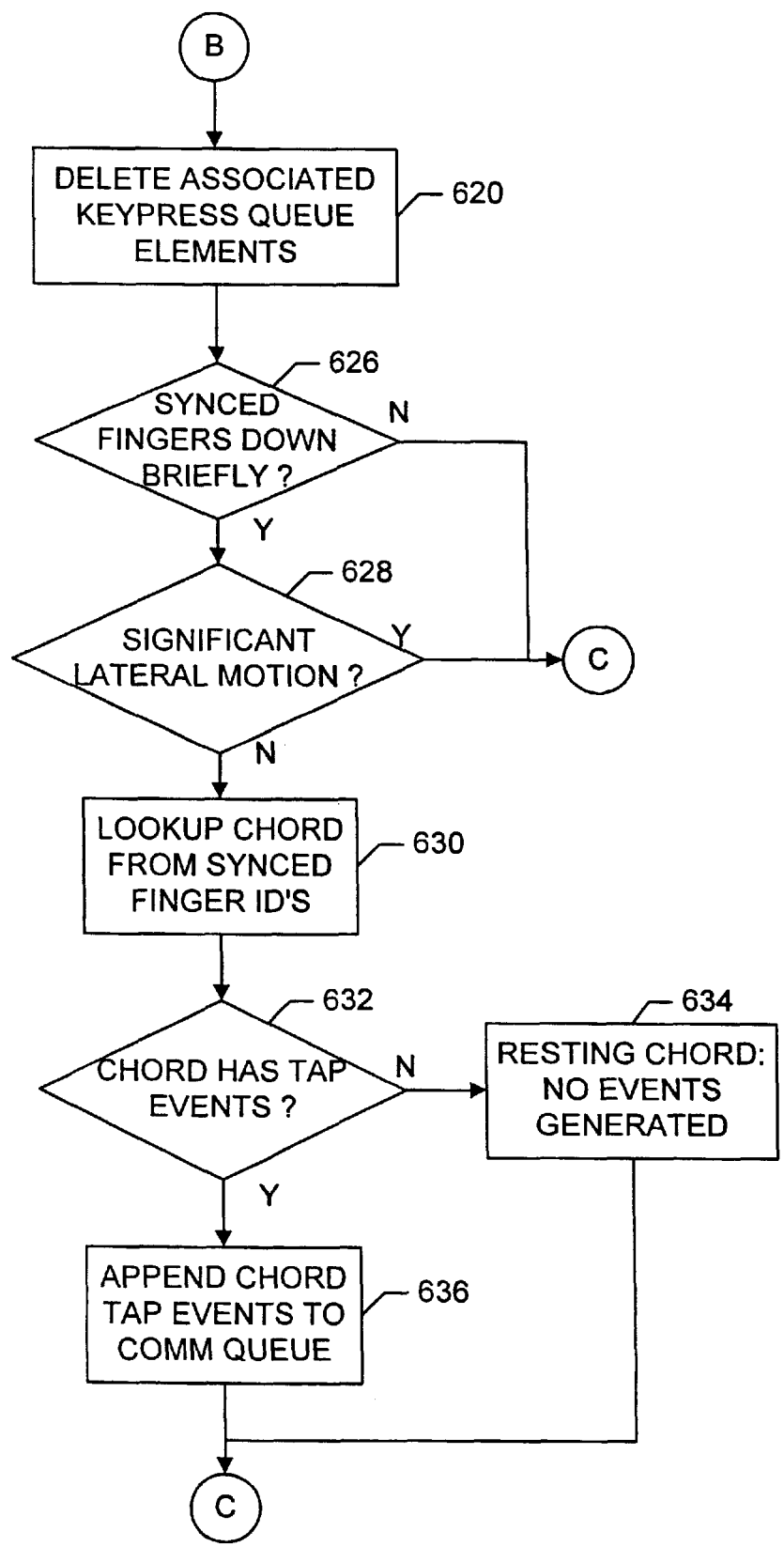
FIG. 39B is a flow chart of chord tap detection.

Continuing to FIG. 39B, if the fingers synchronized during touchdown also lift simultaneously, step 618 removes them and any holds from the keypress queue in case they were a pair awaiting a positive release synchronization test. Further tests ensue to determine whether the synchronized fingers meet additional chord tap conditions. As with single finger taps, the synchronized fingers cannot be held on the surface more than about half a second if they are to qualify, as a chord tap. Decision diamond 626 tests this by thresholding the time between the release of the last remaining synchronized finger and the temporal press synchronization marker. A chord tap should also exhibit a limited amount of lateral finger motion, measured either as an average of peak finger speeds or distance traveled since touchdown in decision diamond 628. If the quick release and limited lateral motion conditions are not met, step 624 clears the synchronization marker with the conclusion that the synchronized fingers were either just resting fingers or part of a chord slide.

If the chord tap conditions are met, step 630 looks up, using the synchronized subset bitfield, any input events such as mouse clicks or keyboard commands assigned to the combination of fingers in the chord tap. Some chords such as those including all four fingertips may be reserved as resting chords 634, in which case decision diamond 632 will find they have no associated input events. If the chord does have tap input events, step 636 appends these to the main outgoing event queue of the host communication interface 20. Finally step 624 clears the synchronization marker in readiness for future finger synchronizations on the given hand.

As a further precaution against accidental generation of chord taps while typing, it is also useful for decision diamond 632 to ignore through step 634 the first chord tap which comes soon after a valid keypress without a chord slide in between. Usually after typing the user will need to reposition the mouse cursor before clicking, requiring an intervening chord slide. If the mouse cursor happens to already be in place after typing, the user may have to tap the finger chord a second time for the click to be sent, but this is less risky than having an accidental chord tap cause an unintended mouse button click in the middle of a typing session.

Figure 40A:
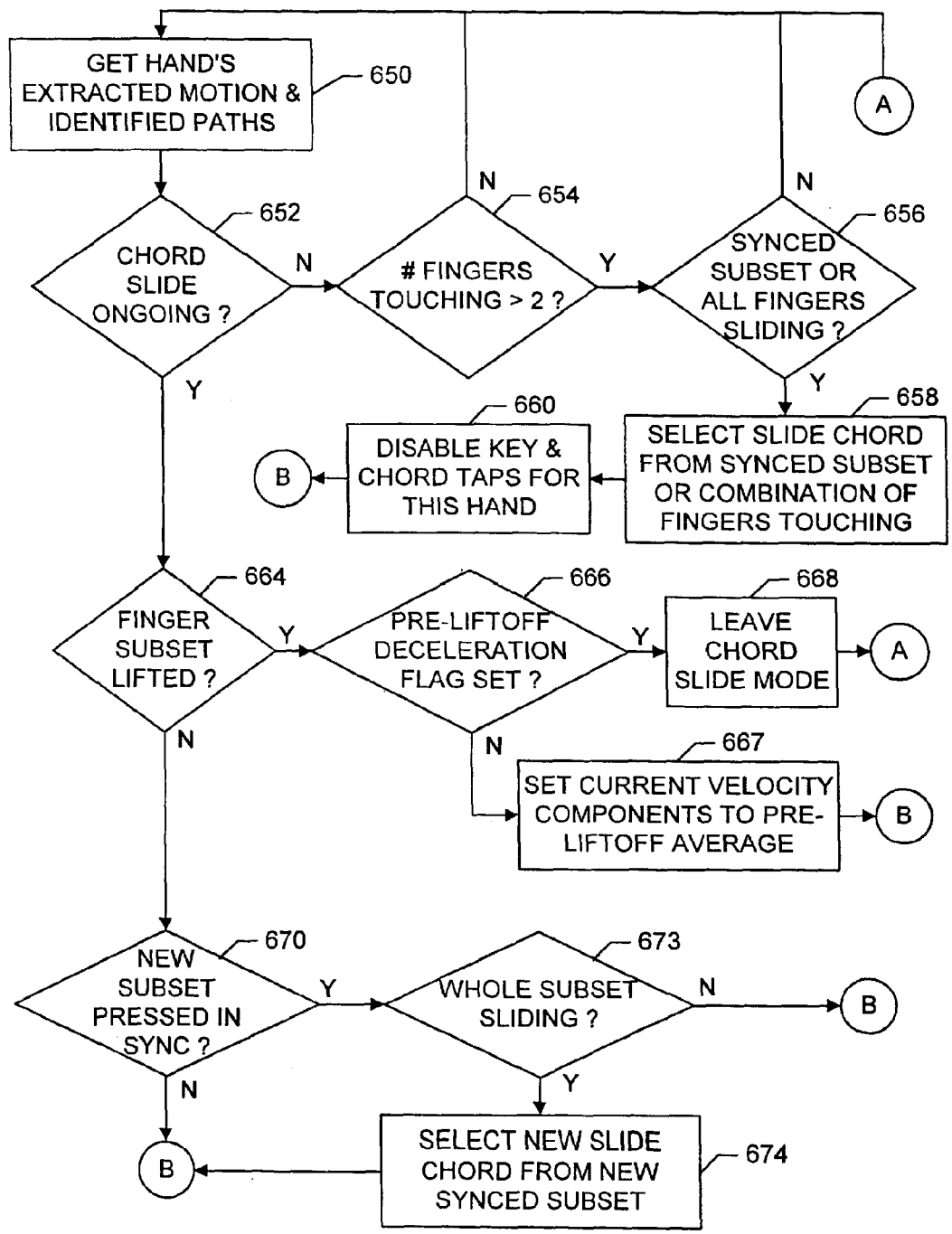
FIG. 40A is a flow chart of the chord motion recognition loop.
Figure 40B:
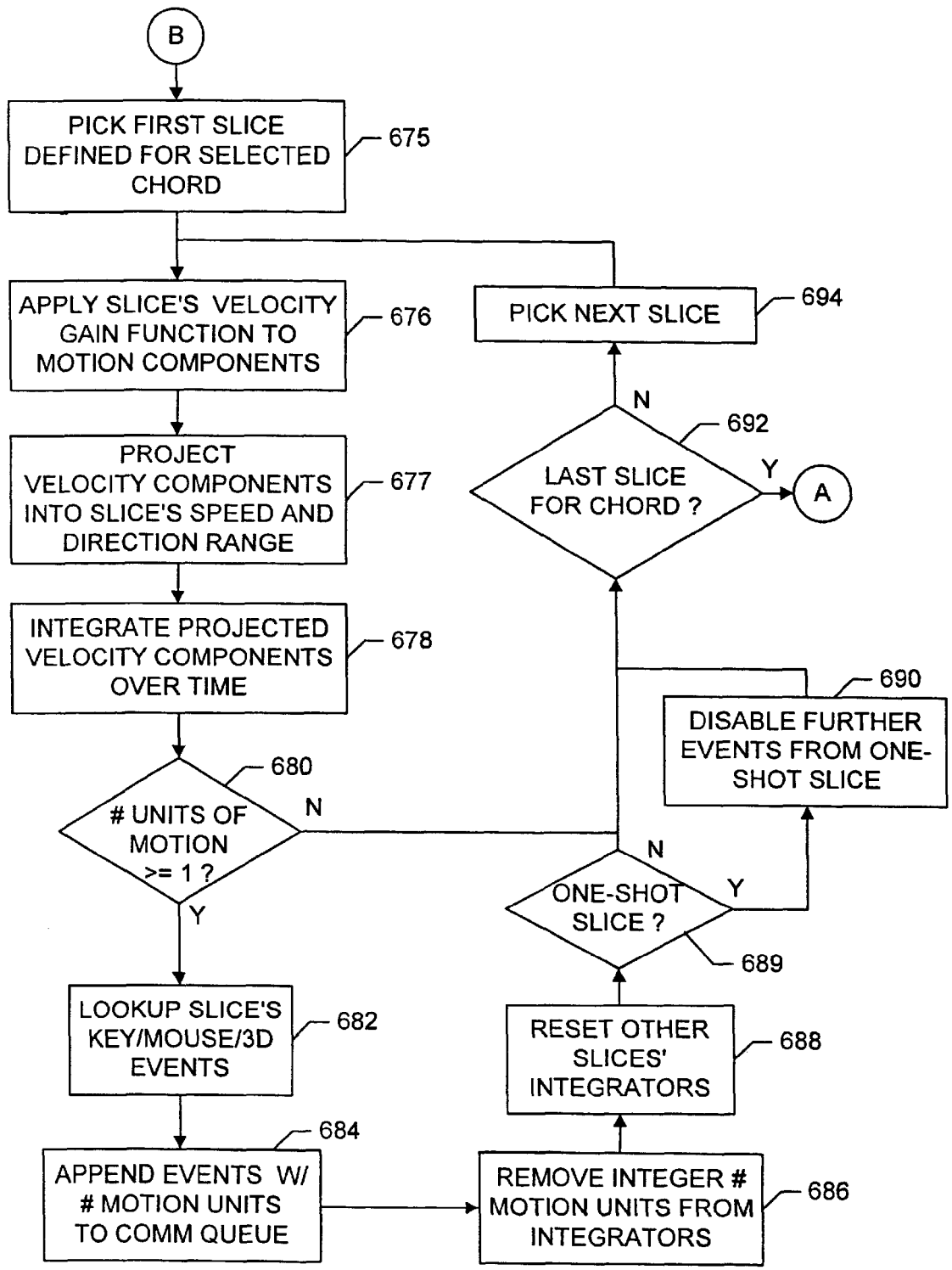
FIG. 40B is a flow chart of chord motion event generation.

FIG. 40A shows the detailed steps of the chord motion recognizer module 18. The chord motion recognition process described below is repeated for each hand independently. Step 650 retrieves the parameters of the hand's identified paths 250 and the hand's extracted motion components from the motion extraction module 16. If a slide of a finger chord has not already started, decision diamond 652 orders slide initiation tests 654 and 656. To distinguish slides from glancing finger taps during typing, decision diamond 654 requires at least two fingers from a hand to be touching the surface for slide mode to start. There may be some exceptions to this rule, such as allowing a single finger to resume a previous slide within a second or so after the previous slide chord lifts off the surface.

In a preferred embodiment, the user can start a slide and specify its chord in either of two ways. In the first way, the user starts with the hand floating above the surface, places some fingers on the surface possibly asynchronously, and begins moving all of these fingers laterally. Decision diamond 656 initiates the slide mode only when significant motion is detected in all the touching fingers. Step 658 selects the chord from the combination of fingers touching when significant motion is detected, regardless of touchdown synchronization. In this case coherent initiation of motion in all the touching fingers is sufficient to distinguish the slide from resting fingers, so synchronization of touchdown is not necessary. Also, novice users may erroneously try to start a slide by placing and sliding only one finger on the surface, forgetting that multiple fingers are necessary. Tolerance of asynchronous touchdown allows them to seamlessly correct this by subsequently placing and sliding the rest of the fingers desired for the chord. The slide chord will then initiate without forcing the user to pick up all fingers and start over with synchronized finger touchdowns.

In the second way, the user starts with multiple fingers resting on the surface, lifts a subset of these fingers, touches a subset back down on the surface synchronously to select the chord, and begins moving the subset laterally to initiate the slide. Decision diamond 656 actually initiates the slide mode when it detects significant motion in all the fingers of the synchronized subset. Whether the fingers which remained resting on the surface during this sequence begin to move does not matter since in this case the selected chord is determined in step 658 by the combination of fingers in the synchronized press subset, not from the set of all touching fingers. This second way has the advantage that the user does not have to lift the whole hand from the surface before starting the slide, but can instead leave most of the weight of the hands resting on the surface and only lift and press the two or three fingers necessary to identify the most common finger chords.

To provide greater tolerance for accidental shifts in resting finger positions, decision diamond 656 requires both that all relevant fingers are moving at significant speed and that they are moving about the same speed. This is checked either by thresholding the geometric mean of the finger speeds or by thresholding the fastest finger's speed and verifying that the slowest finger's speed is at least a minimum fraction of the fastest finger's speed. Once a chord slide is initiated, step 660 disables recognition of key or chord taps by the hand at least until either the touching fingers or the synced subset lifts off.

Once the slide initiates, the chord motion recognizer could simply begin sending raw component velocities paired with the selected combination of finger identities to the host. However, in the interest of backward compatibility with the mouse and key event formats of conventional input devices, the motion event generation steps in FIG. 40B convert motion in any of the extracted degrees of freedom into standard mouse and key command events which depend on the identity of the selected chord. To support such motion conversion, step 658 finds a chord activity structure in a lookup table using a bitfield of the identities of either the touching fingers or the fingers in the synchronized, subset. Different finger identity combinations can refer to the same chord activity structure. In the preferred embodiment, all finger combinations with the same number of non-thumb fingertips refer to the same chord activity structure, so slide chord activities are distinguished by whether the thumb is touching and how many non-thumb fingers are touching. Basing chord action on the number of fingertips rather than their combination still provides up to seven chords per hand yet makes chords easier for the user to memorize and perform. The user has the freedom to choose and vary which fingertips are used in chords requiring only one; two or three fingertips. Given this freedom, users naturally tend to pick combinations in which all touching fingertips are adjacent rather than combinations in which a finger such as the ring finger is lifted but the surrounding fingers such as the middle and pinky must touch. One chord typing study found that users can tap these finger chords in which all pressed fingertips are adjacent twice as fast as other chords.

The events in each chord activity structure are organized into slices. Each slice contains events to be generated in response to motion in a particular range of speeds and directions within the extracted degrees of freedom. For example, a mouse cursor slice could be allocated any translational speed and direction. However, text cursor manipulation requires four slices, one for each arrow key, and each arrow's slice integrates motion in a narrow direction range of translation. Each slice can also include motion sensitivity and so-called cursor acceleration parameters for each degree of freedom. These will be used to discretize motion into the units such as arrow key clicks or mouse clicks expected by existing host computer systems.

Step 675 of chord motion conversion simply picks the first slice in the given chord activity structure for processing. Step 676 scales the current values of the extracted velocity components by the slice's motion sensitivity and acceleration parameters. Step 677 geometrically projects or clips the scaled velocity components into the slice's defined speed and direction range. For the example mouse cursor slice, this might only involve clipping the rotation and scaling components to zero. But for an arrow key slice, the translation velocity vector is projected onto the unit vector pointing in the same direction as the arrow. Step 678 integrates each scaled and projected component velocity over time in the slice's accumulators until decision diamond 680 determines at least one unit of motion has been accumulated. Step 682 looks up the slice's preferred mouse, key, or three-dimensional input event format, attaches the number of accumulated motion units to the event; and step 684 dispatches the event to the outgoing queue of the host communication interface 20. Step 686 subtracts the sent motion events from the accumulators, and step 688 optionally clears the accumulators of other slices. If the slice is intended to generate a single key command per hand motion, decision diamond 689 will determine that it is a one-shot slice so that step 690 can disable further event generation from it until a slice with a different direction intervenes. If the given slice is the last slice, decision diamond 692 returns to step 650 to await the next scan of the sensor array. Otherwise step 694 continues to integrate and convert the current motion for other slices.

Returning to FIG. 40A, for some applications it may be desirable to change the selected chord whenever an additional finger touches down or one of the fingers in the chord lifts off. However, in the preferred embodiment, the selected chord cannot be changed after slide initiation by asynchronous finger touch activity. This gives the user freedom to rest or lift addition fingers as may be necessary to get the best precision in a desired degree of freedom. For example, even though the finger pair chord does not include the thumb, the thumb can be set down shortly after slide initiation to access the full dynamic range of the rotation and scaling degrees of freedom. In fact, all remaining lifted fingers can always be set down after initiation of any chord to allow manipulation by the whole hand. Likewise, all fingers but one can be lifted, yet translation will continue.

Though asynchronous finger touch activity is ignored, synchronized lifting and pressing of multiple fingers subsequent to slide initiation can create a new synchronized subset and change the selected chord. Preferably this is only allowed while the hand has paused but its fingers are still resting on the surface. Decision diamond 670 will detect the new subset and commence motion testing in decision diamond 673 which is analogous to decision diamond 656. If significant motion is found in all fingers of the newly synchronized subset, step 674 will select the new subset as the slide chord and lookup a new chord activity structure in analogy to step 658. Thus finger synchronization again allows the user to switch to a different activity without forcing the user to lift the whole hand from the surface. Integration of velocity components resumes but the events generated from the new chord activity structure will presumably be different.

It is advantageous to provide visual or auditory feedback to the user about which chord activity structure has been selected. This can be accomplished visually by placing a row of five light emitting diodes across the top of the multi-touch surface, with one row per hand to be used on the surface. When entering slide mode, step 658 would turn on a combination of these lights corresponding to the combination of fingers in the selected chord. Step 674 would change the combination of active lights to match the new chord activity structure should the user select a new, chord, and step 668 would turn them off. Similar lights could be emulated on the host computer display 24. The lights could also be flashed to indicate the finger combination detected during chord taps in step 636. The implementation for auditory feedback would be similar, except light combinations would be replaced with tone or tone burst combinations.

The accumulation and event generation process repeats for all array scan cycles until decision diamond 664 detects liftoff by all the fingers from the initiating combination. Decision diamond 666 then checks the pre-liftoff deceleration flag of the dominant motion, component. The state of this flag is determined by step 556 or 558 of translation extraction (FIG. 37) if translation is dominant, or by corresponding flags in step 534 of polar extraction. If there has been significant deceleration, step 668 simply exits the chord slide mode, setting the selected chord to null. If the flag indicates no significant finger deceleration prior to liftoff, decision diamond 666 enables motion continuation mode for the selected chord. While in this mode, step 667 applies the pre-liftoff weighted average (560) of dominant component velocity to the motion accumulators (678) in place of the current velocities, which are presumably zero since no fingers touch the surface. Motion continuation mode does not stop until any of the remaining fingers not in the synchronized subset are lifted or more fingers newly touch down. This causes decision diamond 664 to become false and normal slide activity with the currently selected chord to resume. Though the cursor or scrolling velocity does not decay during motion continuation mode, the host computer can send a signal instructing motion continuation mode to be canceled if the cursor reaches the edge of the screen or end of a document. Similarly, if any fingers remain on the surface during motion continuation, their translations can adjust the cursor or scrolling velocity.

In the preferred embodiment, the chord motion recognizers for each hand function independently and the input events for each chord can be configured independently. This allows the system to allocate tasks between hands in many different ways and to support a variety of bimanual manipulations. For example, mouse cursor motion can be allocated to the fingertip pair chord on both hands and mouse button drag to a triple fingertip chord on both hands. This way the mouse pointer can be moved and drug with either hand on either half of the surface. Primary mouse clicks would be generated by a tap of a fingertip pair on either half of the surface, and double-clicks could be ergonomically generated by a single tap of three fingertips on the surface. Window scrolling could be allocated to slides of four fingers on either hand.

Alternatively, mouse cursor manipulations could be allocated as discussed above to the right hand and right half of the surface, while corresponding text cursor manipulations are allocated to chords on the left hand. For instance, left fingertip pair movement would generate arrow key commands corresponding to the direction of motion, and three fingertips would generate shift arrow combinations for selection of text.

For host computer systems supporting manipulations in three or more degrees of freedom, a left hand chord could be selected to pan, zoom, and rotate the display background while a corresponding chord in the right hand could translate, resize and rotate a foreground object. These chords would not have to include the thumb since the thumb can touch down anytime after initiating chord motion without changing the selected chord. The user then need add the thumb to the surface when attempting rotation or scaling.

Finger chords which initially include the thumb can be reserved for one-shot command gestures, which only generate input events once for each slide of a chord rather than repeating transmission each time an additional unit of motion is detected. For example, the common editing commands cut, copy and paste can be intuitively allocated to a pinch hand scaling, chord tap, and anti-pinch hand scaling of the thumb and an opposing fingertip.

Figure 41:
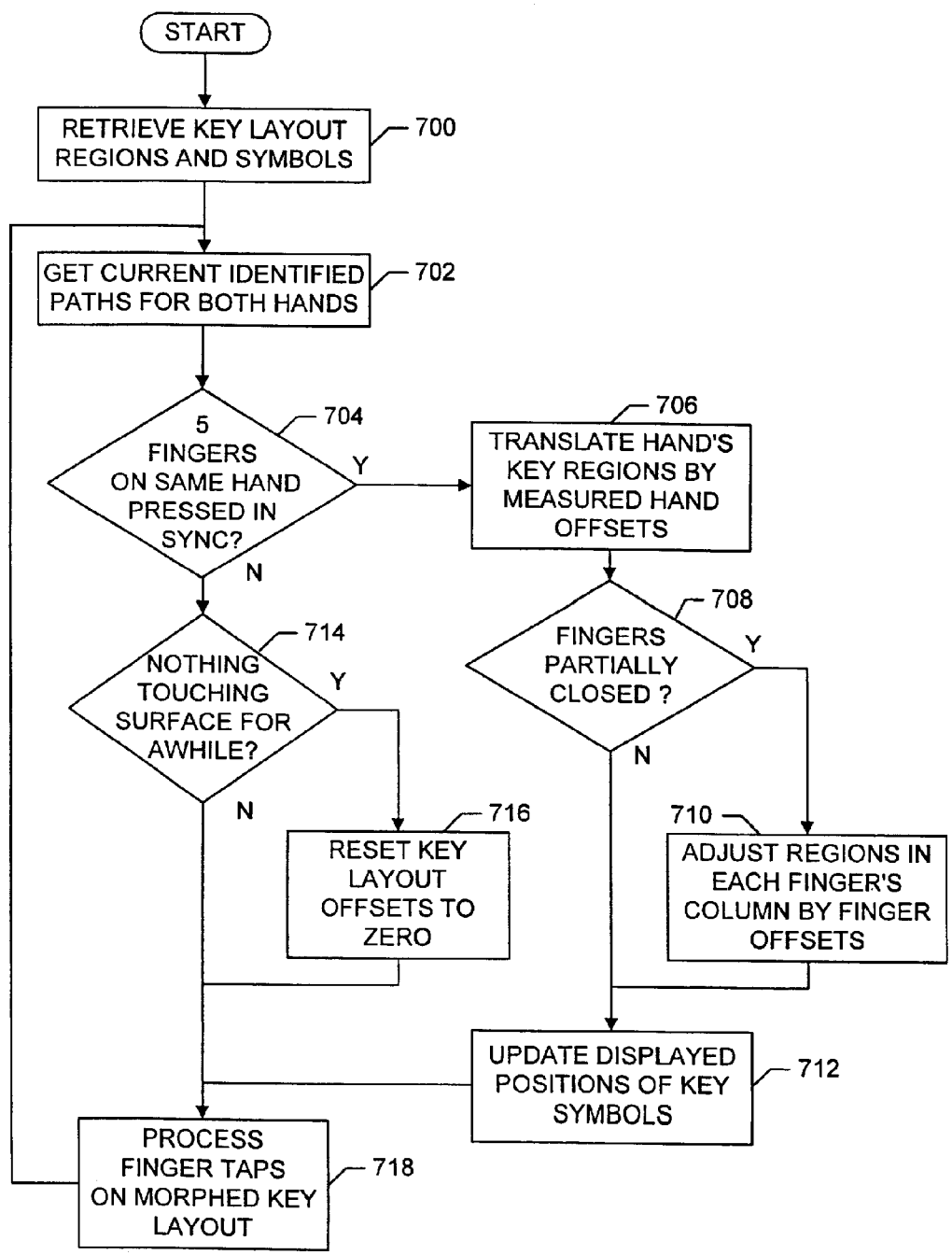
FIG. 41 is a flow chart of key layout morphing.

FIG. 41 shows the steps within the key layout definition and morphing process, which is part of the typing recognition module 12. Step 700 retrieves at system startup a key layout which has been pre-specified by the user or manufacturer. The key layout consists of a set of key region data structures. Each region has associated with it the symbol or commands which should be sent to the host computer when the region is pressed and coordinates representing the location of the center of the region on the surface. In the preferred embodiment, arrangement of those key regions containing alphanumeric and punctuation symbols roughly corresponds to either the QWERTY or the Dvorak key layouts common on mechanical keyboards.

In some embodiments of the multi-touch surface apparatus it is advantageous to be able to snap or morph the key layout to the resting positions of the hands. This is especially helpful for multi-touch surfaces which are several times larger than the standard keyboard or key layout, such as one covering an entire desk. Fixing the key layout in one small fixed area of such a surface would be inconvenient and discourage use of the whole available surface area. To provide feedback to the user about changes in the position of the key layout, the position of the key symbols in these embodiments of the multi-touch surface would not be printed permanently on the surface. Instead, the position of the key symbols would be reprogrammably displayed on the surface by light emitting polymers, liquid crystal, or other dynamic visual display means embedded in the multi-touch surface apparatus along with the proximity sensor arrays.

Given such an apparatus, step 702 retrieves the current paths from both hands and awaits what will be known as a layout homing gesture. If decision diamond 704 decides with the help of, a hand's synchronization detector that all five of the hand's fingers have just been placed on the surface synchronously, step 706 will attempt to snap the key layout to the hand such that the hand's home row keys lie under the synchronized fingertips, wherever the hand is on the surface. Step 706 retrieves the measured hand offsets from the hand position estimator and translates all key regions which are normally typed by the given hand in proportion to the measured hand offsets. Note the currently measured rather than filtered estimates of offsets can be used because when all five fingers are down there is no danger of finger misidentification corrupting the measured offsets. This procedure assumes that the untranslated locations of the home row keys are the same as the default finger locations for the hand.

Decision diamond 708 checks whether the fingers appear to be in a neutral, partially closed posture, rather closed than outstretched or pinched together. If the posture is close to neutral, step 710 may further offset the keys normally typed by each finger, which for the most part are the keys in the same column of the finger by the measured finger offsets. Temporal filtering of these finger offsets over several layout homing gestures will tend to scale the spacing between columns of keys to the user's hand size. Spacing between rows is scaled down in proportion to the scaling between columns.

With the key layout for the hand's keys morphed to fit the size and current position of the resting hand, step 712 updates the displayed position of the symbols on the surface, so that the user will see that the key layout has snapped to the position of his hand. From this stage the user can begin to type and the typing recognizer 718 will use the morphed key region locations to decide what key regions are being pressed. The layout will remain morphed this way until either the user performs another homing gesture to move it somewhere else on the surface, or until the user takes both hands off the surface for a while. Decision diamond 714 will eventually time out so that step 716 can reset the layout to its default position in readiness for another user or usage session.

For smaller multi-touch surfaces in which the key layout is permanently printed on the surface, it is advantageous to give the user tactile feedback about the positions of key regions. However, any tactile indicators placed on the surface must be carefully designed so as not to impede smooth sliding across the surface. For example, shallow depressions made in the surface near the center of each key mimicking the shallow depressions common on mechanical keyboard keycaps would cause a vibratory washboard effect as the hand slides across the surface. To minimize such washboard effects, in the preferred embodiment the multi-touch surface provides for the fingertips of each hand a single, continuous depression running from the default index fingertip location to the default pinky fingertip location. This corresponds on the QWERTY key layout to shallow, slightly arched channels along home row from the "J" key to the ";" key for the right hand, and from the "A" key to the "F" key for the left hand. Similarly, the thumbs can each be provided with a single oval-shaped depression at their default locations, slanted slightly from vertical to match the default thumb orientation. These would preferably correspond to "Space" and "BackSpace" key regions for the right and left thumbs, respectively. Such minimal depressions can tactilely guide users' hands back to home row of the key layout without requiring users to look down at the surface and without seriously disrupting finger chord slides and manipulations on the surface.

The positions of key regions off home row can be marked by other types of tactile indicators. Simply roughening the surface at key regions does not work well. Though humans easily differentiate textures when sliding fingers over them, most textures cannot be noticed during quick taps on a textured region. Only relatively abrupt edges or protrusions can be sensed by the users' fingertips under typing conditions. Therefore, a small raised dot like a Braille dot is formed on top of the surface at the center of each key region. The user receives feedback on the accuracy of their typing strokes from where on the fingertip a dot is felt. This feedback can be used to correct finger aim during future keypresses. Since single finger slides are ignored by the chord motion recognizer, the user can also slide a finger around the surface in tactile search of a particular key region's dot and then tap the key region when the dot is found, all without looking at the surface. Each dot should be just: large enough to be felt during tapping but not so large as to impede chord slides across the surface. Even if the dots are not large enough to impede sliding, they can still corrupt proximity and fingertip centroid measurements by raising the fingertip flesh near the dot off the surface thus locally separating the flesh from the underlying proximity sensing electrode. Therefore, in the preferred embodiment, the portion of each dot above the surface dielectric is made of a conductive material. This improves capacitive coupling between the raised fingertip flesh and the underlying electrodes.

Figure 42:
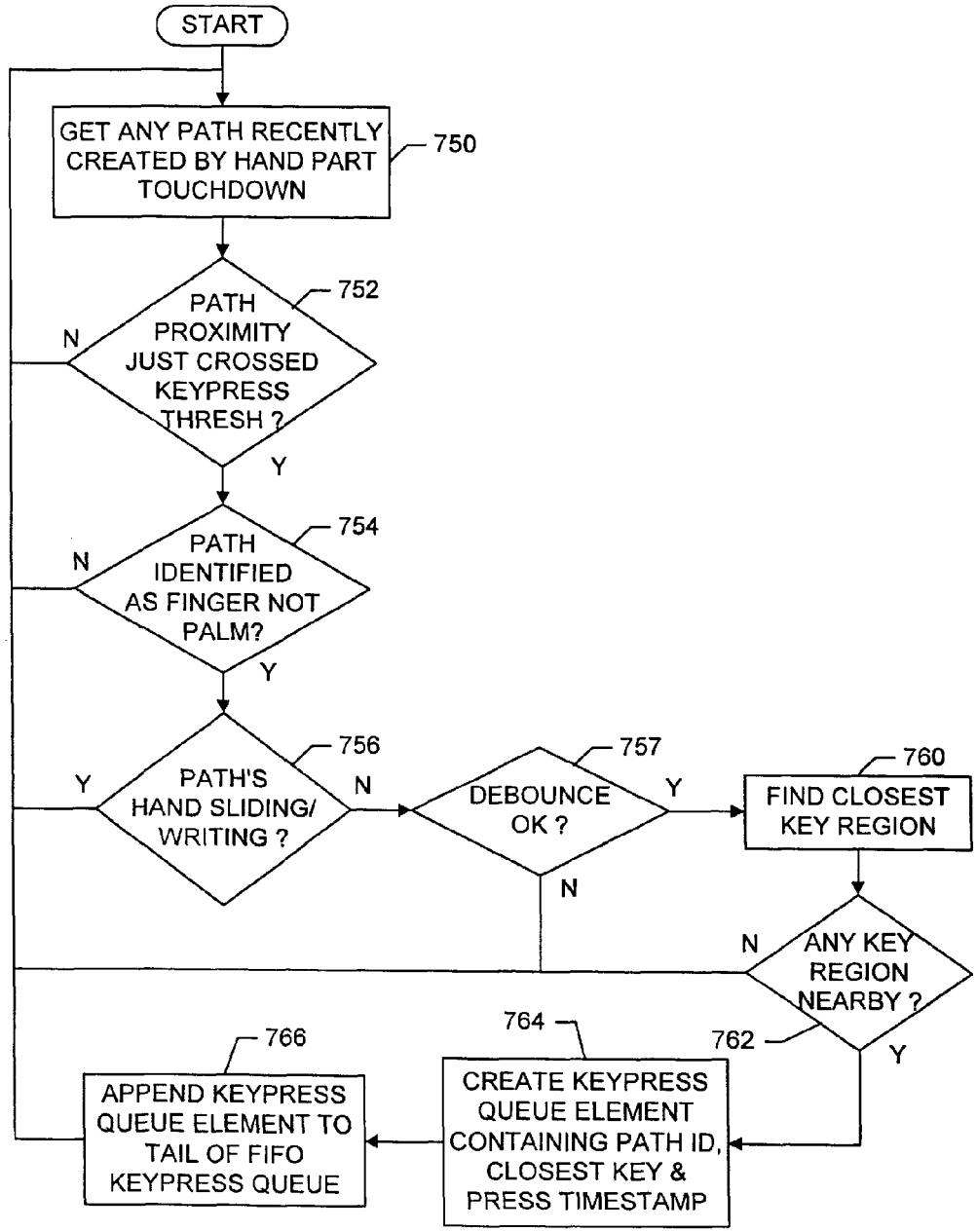
FIG. 42 is a flow chart of the keypress detection loop.

FIG. 42 shows the steps within the keypress detection loop. Step 750 retrieves from the current identified path data 250 any paths which were recently created due to hand part touchdown or the surface. Decision diamond 752 checks whether the path proximity reached a keypress proximity thresh for the first time during the current sensor array scan. If the proximity has not reached the threshold yet or has already exceeded it previously, control returns to step 750 to try keypress detection on the next recent path. If the path just crossed the keypress proximity threshold decision diamond 754 checks whether the contact path has been identified as a finger rather than a palm. To give the users the freedom rest the palms anywhere on the surface, palm presses should not normally cause keypresses, and are therefore ignored. Assuming the path is a finger, decision diamond 756 checks whether the hand the identified finger comes from is currently performing a chord slide gesture or writing via the pen grip hand configuration. Asynchronous finger presses are ignored once these activities have started, as also indicated in step 660 of FIG. 40A. Assuming such hand activities are not ongoing, decision diamond 757 proceeds with debounce tests which check that the finger has touched the surface for at least two sensor array scan cycles and that it had been off the surface for several scan cycles before touching down. The path tracking module (FIG. 22) facilitates such liftoff debouncing by reactivating in step 334 a finger's old path if the finger lifts off and quickly touches back down over the same spot. Upon reactivation the time stamp of the last liftoff by the old path must be preserved for comparison with the time stamp of the new touchdown.

If all of these tests are passed, step 758 looks up the current path position ($P_x[n], P_y[n]$), and step 760 finds the key region whose reference position is closest to the fingertip centroid. Decision diamond 762 checks that the nearest region is within a reasonable distance of the finger, and if not causes the finger press to be ignored. Assuming a key region is close to the finger, step 764 creates a keypress element data structure containing the path, index identifier and finger identity, the closest key region, and a time stamp indicating when the finger crossed the keypress proximity threshold. Step 766 then appends this element data structure to the tail of a FIFO keypress queue. This accomplished, processing returns to step 750 to process or wait for touchdowns by other fingers.

The keypress queue effectively orders finger touchdowns by when they pass the keypress transmitted to the host. However, an element's key symbol is not assured transmission of the host once in the keypress queue. Any of a number of conditions such as being part of a synchronized subset of pressing fingers can cause it to be deleted from the queue before being transmitted to the host. In this sense the keypress queue should be considered a keypress candidate queue. Unlike the ordered lists of finger touchdowns and releases maintained for each hand separately in the synchronization detector, the keypress queue includes and orders the finger touchdowns from both hands.

Figure 43A:
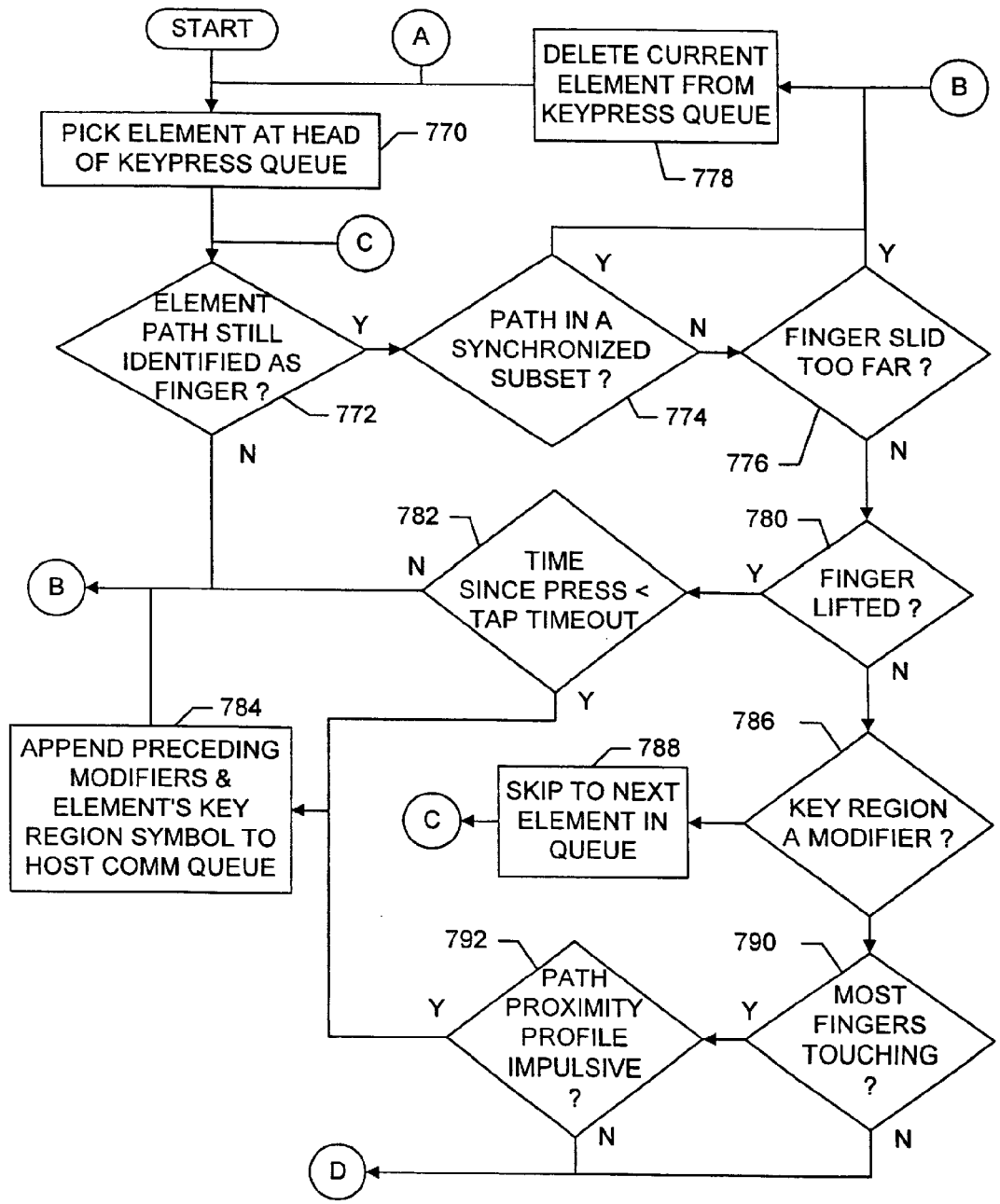
FIG. 43A is a flow chart of the keypress acceptance and transmission loop.
Figure 43B:
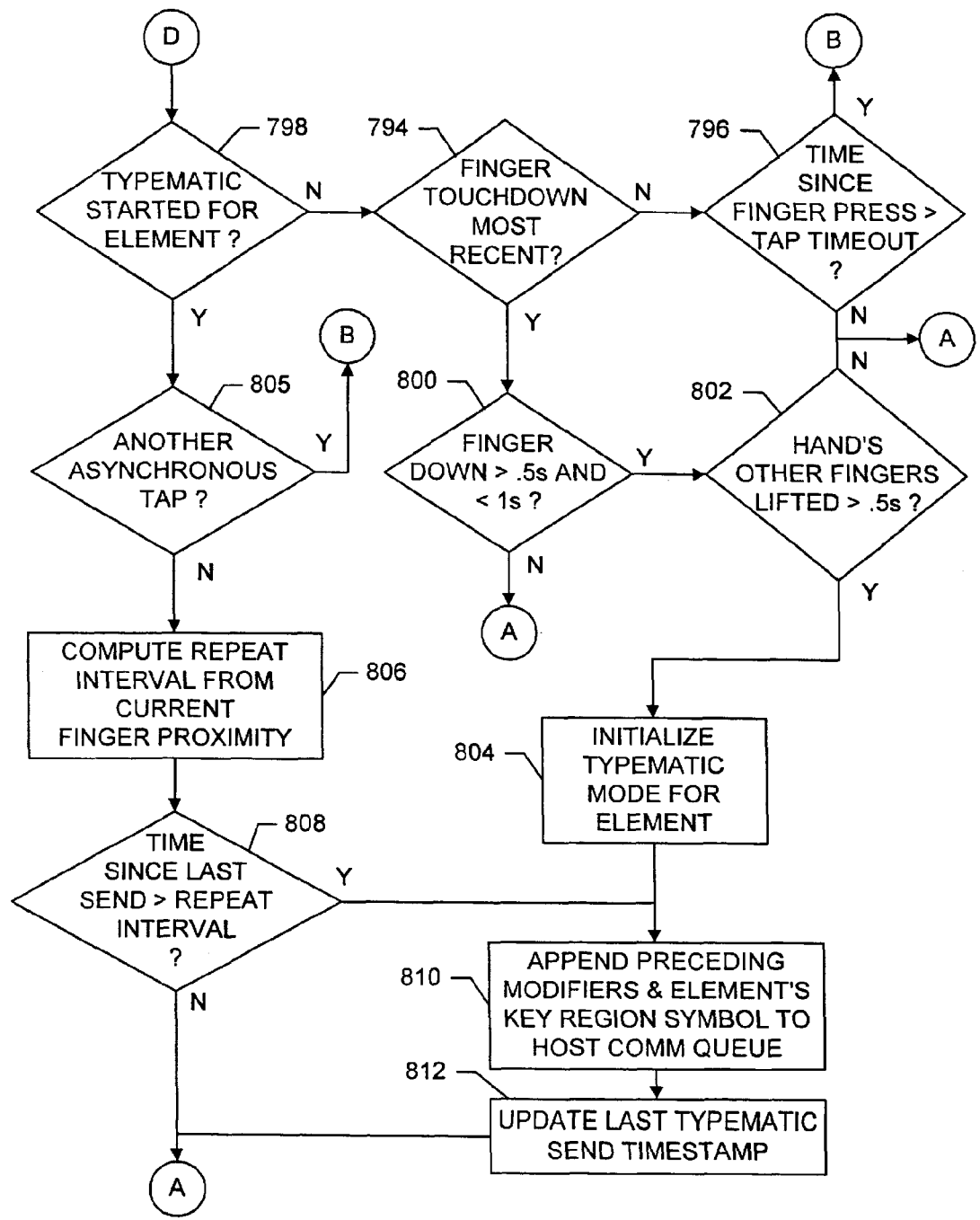
FIG. 43B is a flow chart of typematic emulation.

FIG. 43A shows the steps within the keypress acceptance and transmission loop. Step 770 picks the element at the head of the keypress queue, which represents the oldest finger touchdown which has neither been deleted from the queue as an invalid keypress candidate nor transmitted its associated key symbol. Decision diamond 772 checks whether the path is still identified as a finger. While waiting in the queue path proximity could have increased so much that the identification system decides the path is actually from a palm heel, in which case step 778 deletes the keypress element without transmitting to the host and step 770 advances processing to the next element. Decision diamond 774 also invalidates the element if its press happened synchronously with other fingers of the same hand. Thus decision diamond 774 follows through on deletion command steps 601, 612, 615, 620 of the synchronization detection process (FIG. 39). Decision diamond 776 invalidates the keypress if too much lateral finger motion has occurred since touchdown, even if that lateral finger motion has not yet caused a chord slide to start. Because users may be touch typing on the surface, several millimeters of lateral motion are allowed to accommodate glancing fingertip motions which often occur when quickly reaching for keys. This is much more glancing tap motion than is tolerated by touchpads which employ a single finger slide for mouse cursor manipulation and a single finger tap for key or mouse button click emulation.

Decision diamond 780 checks whether the finger whose touchdown created the keypress element has since lifted off the surface. If so, decision diamond 782 checks whether it was lifted off soon enough to qualify as a normal key tap. If so, step 784 transmits the associated key symbol to the host and step 778 deletes it from the head of the queue. Note that a keypress is always deleted from the queue upon liftoff, but even though it may have stayed on the surface for a time exceeding the tap timeout, it may have still caused transmission as a modifier key, as an impulsive press with hand resting, or as a typematic press, as described below.

When a keypress is transmitted to the host it is advantageous for a sound generation device on the multi-touch surface apparatus or host computer to emit an audible click or beep as feedback to the user. Generation of audible click and beep feedback in response to keypresses is well known in commercial touchscreens, kiosks, appliance control panels and mechanical keyboards in which the keyswitch action is nearly silent and does not have a make force threshold which feels distinctive to the user. Feedback can also be provided as a light on the multi-touch surface apparatus which flashes each time a keypress is sent. Keypresses accompanied by modifier keypresses should cause longer flashes or tones to acknowledge that the key symbol includes modifiers.

If the finger has not yet lifted, decision diamond 786 checks whether its associated key region is a modifier such as <shift>, <ctrl>, or <alt>. If so, step 788 advances to the next element in the queue without deleting the head. Processing will continue at step 772 to see if the next element is a valid key tap. If the next element successfully reaches the transmission stage, step 784 will scan back toward the head of the queue for any modifier regions which are still pressed. Then step 784 can send the next element's key symbol along with the modifying symbols of any preceding modifier regions.

Decision diamond 782 requires that users touch the finger on the surface and lift back off within a few hundred milliseconds for a key to be sent. This liftoff timing requirement substitutes for the force activation threshold of mechanical keyswitches. Like the force threshold of mechanical keyswitches, the timing constraint provides a way for the user to rest the finger on the key surface without invoking a keypress. The synchronization detector 14 provides another way forefingers to rest on the surface without generating key symbols: they must touch down at the same time as at least one other finger. However, sometimes users will start resting by simultaneously placing the central fingertips on the surface, but then they follow asynchronously with the pinky a second later and the thumb a second after that. These latter presses are essentially asynchronous and will not be invalidated by the synchronization detector, but as long as they are not lifted within a couple hundred milliseconds, decision diamond 782 will delete them without transmission. But, while decision diamond 782 provides tolerance of asynchronous finger resting, its requirement that fingers quickly lift off, i.e., crisply tap, the surface to cause key generation makes it very difficult to keep most of the fingers resting on the surface to support the hands while tapping long sequences of symbols. This causes users to raise their hands off the surface and float them above the surface during fast typing sequences. This is acceptable typing posture except that the users arms will eventually tire if the user fails to rest the hands back on the surface between sequences.

To provide an alternative typing posture which does not encourage suspension of the hands above the surface, decision diamond 790 enables a second key acceptance mode which does not require quick finger liftoff after each press. Instead, the user must start with all five fingers of a hand resting on the surface. Then each time a finger is asynchronously raised off the surface and pressed on a key region, that key region will be transmitted regardless of subsequent liftoff timing. If the surface is hard such that fingertip proximity quickly saturates as force is applied, decision diamond 792 checks the impulsivity of the proximity profile for how quickly the finger proximity peaks. If the proximity profile increases to its peak very slowly over time, no key will be generated. This allows the user to gently set down a raised finger without generating a key in case the user lifts the finger with the intention of generating a key but then changes his mind. If the touch surface is compressible, decision diamond 792 can more directly infer finger force from the ratio of measured fingertip proximity to ellipse axis lengths. Then it can threshold the inferred force to distinguish deliberate key presses from gentle finger rests. Since when intending to generate a key the user will normally press down on the new key region quickly after lifting off the old key region, the impulsivity and force thresholds should increase with the time since the finger lifted off the surface.

Emulating typematic on a multi-touch surface presents special problems if finger resting force cannot be distinguished reliably from sustained holding force on a key region. In this case, the special touch timing sequence detected by the steps of FIG. 43B supports reliable typematic emulation. Assuming decision diamond 798 finds that typematic has not started yet, decision diamond 794 checks whether the keypress queue element being processed represents the most recent finger touchdown on the surface. If any finger touchdowns have followed the touchdown represented by this element, typematic can never start from this queue element. Instead, decision diamond 796 checks whether the element's finger has been touching longer than the normal tap timeout. If the finger has been touching too long, step 778 should delete its keypress element because decision diamond 786 has determined it is not a modifier and decision diamond 794 has determined it can never start typematic. If decision diamond 794 determines that the keypress element does not represent the most recent touchdown, yet decision diamond 796 indicates the element has not exceeded the tap timeout, processing returns to step 770 to await either liftoff or timeout in a future sensor array scan. This allows finger taps to overlap in the sense that a new key region can be pressed by a finger before another finger lifts off the previous key region. However, either the press times or release times of such a pair of overlapping finger taps must be asynchronous to prevent the pair from being considered a chord tap.

Assuming the finger touchdown is the most recent, decision diamond 800 checks whether the finger has been touching for a typematic hold setup interval of between about half a second and a second. If not, processing returns to 770 to await either finger liftoff or the hold setup condition to be met during future scans of the sensor array. When the hold setup condition is met, decision diamond 802 checks whether all other fingers on the hand of the given finger keypress lifted off the surface more than a half second ago. If they did, step 804 will initialize typematic for the given keypress element. The combination of decision diamonds 800 and 802 allow the user to have other fingers of the hand to be resting on the surface when a finger intended for typematic touches down. But typematic will not start unless the other fingers lift off the surface within half a second of the desired typematic finger's touchdown, and typematic will also not start until the typematic finger has a continued to touch the surface for at least half a second after the others lifted off the surface. If these stringent conditions are not met, the keypress element will not start typematic and will eventually be deleted through either tap timeout 782 when the finger lifts off or through tap timeout 796) if another touches down after it.

Step 804 simply sets a flag which will indicate to decision diamond 798 during future scan cycles that typematic has already started for the element. Upon typematic initialization, step 810 sends out the key symbol for the first time to the host interface communication queue, along with any modifier symbols being held down by the opposite hand. Step 812 records the time the key symbol is sent for future reference by decision diamond 808. Processing then returns to step 770 to await the next proximity image scan.

Until the finger lifts off or another taps asynchronously, processing will pass through decision diamond 798 to check whether the key symbol should be sent again. Step 806 computes the symbol repeat interval dynamically to be inversely proportional to finger proximity. Thus the key will repeat faster as the finger is pressed on the surface harder or a larger part of the fingertip touches the surface. This also reduces the chance that the user will cause more repeats than intended since as finger proximity begins to drop during liftoff the repeat interval becomes much longer. Decision diamond 808 checks whether the dynamic repeat interval since the last typematic symbol send has elapsed, and if necessary sends the symbol again in 810 and updates the typematic send time stamp 812.

It is desirable to let the users rest the other fingers back onto the surface after typematic has initiated 804 and while typematic continues, but the user must do so without tapping. Decision diamond 805 causes typematic to be canceled and the typematic element deleted 778 if the user asynchronously taps another finger on the surface as if trying to hit another key. If this does not occur, decision diamond 182 will eventually cause deletion of the typematic element when its finger lifts off.

The typing recognition process described above thus allows the multi-touch surface to ergonomically emulate both the typing and hand resting capabilities of a standard mechanical keyboard. Crisp taps or impulsive presses on the surface generate key symbols as soon as the finger is released or decision diamond 792 verifies the impulse has peaked, ensuring prompt feedback to the user. Fingers intended to rest on the surface generate no keys as long as they are members of a synchronized finger press or release subset or are placed on the surface gently and remain there along with other fingers for a second or two. Once resting, fingers can be lifted and tapped or impulsively pressed on the surface to generate key symbols without having to lift other resting fingers. Typematic is initiated ether by impulsively pressing and maintaining distinguishable force on a key, or by holding a finger on a key while other fingers on the hand are lifted. Glancing motions of single fingers as they tap key regions are easily tolerated since most cursor manipulation must be initiated by synchronized slides of two or more fingers.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of input of a computing system including a touch sensing surface, the method comprising:
    detecting a plurality of contacts, including a first contact, a second contact, and a third contact, touching down on or near the surface, the detecting including determining a touchdown time of each of the contacts;
    evaluating the touchdown times based on a predetermined temporal threshold, the evaluating including determining that the difference between the touchdown times of the first and second contacts is less than the predetermined temporal threshold and determining that the difference between the touchdown times of the first and third contacts is greater than the predetermined temporal threshold;
    determining, based on the evaluation of the touchdown times, a synchronized set of the contacts concurrently touching the touch sensing surface, wherein the synchronized set includes the first and second contacts and excludes the third contact; and
    generating a first input of the computing system based on the synchronized set.

2. The method of claim 1 wherein the contacts comprise a plurality of fingers and a portion of a hand other than a finger.

3. The method of claim 1 wherein evaluating the touchdown times comprises determining the difference between the touchdown times of the first and second contacts at time t0; and determining the difference between the touchdown times of the first and third contacts at time t1.

4. The method of claim 1, wherein the touchdown time of the second contact is between the touchdown times of the first and third contacts.

5. The method of claim 4, wherein a magnitude of the temporal threshold is based on a number of touchdowns between the touchdowns of the contacts being evaluated, such that the magnitude of the temporal threshold of the determining of the difference between the touchdown times of the first and second contacts is different than the magnitude of the temporal threshold of the determining of the difference between the touchdown times of the first and third contacts.

6. The method of claim 5, wherein the magnitude of the temporal threshold increases as the number of touchdowns between the touchdowns of the contacts being examined increases.

7. The method of claim 1, wherein the plurality of contacts includes a fourth contact, the touchdown time of the fourth contact being between the touchdown times of the first and second contacts, evaluating the touchdown times further includes determining that the difference between the touchdown times of the first and fourth contacts is less than the predetermined temporal threshold, and the synchronized set further includes the fourth contact.

8. A sensing apparatus comprising:
    a touch sensing surface;
    a contact identification unit that detects a plurality of contacts, including a first contact, a second contact, and a third contact, touching down on or near the surface, the detecting including determining a touchdown time of each of the contacts;
    a synchronous contact unit that evaluates the touchdown times based on a predetermined temporal threshold, the evaluating including determining that the difference between the touchdown times of the first and second contacts is less than the predetermined temporal threshold, determining that the difference between the touchdown times of the first and third contacts is greater than the predetermined temporal threshold, determining, based on the evaluation of the touchdown times, a synchronized set of the contacts concurrently touching the touch sensing surface, wherein the synchronized set includes the first and second contacts and excludes the third contact; and a result production unit that determines an input of a computing system based on the synchronized set.

9. The apparatus of claim 8 wherein the contacts comprise a plurality of fingers and a portion of a hand other than a finger.

10. The apparatus of claim 8, wherein the touchdown time of the second contact is between the touchdown times of the first and third contacts.

11. The apparatus of claim 10, wherein a magnitude of the temporal threshold is based on a number of touchdowns between the touchdowns of the contacts being evaluated, such that the magnitude of the temporal threshold of the determining of the difference between the touchdown times of the first and second contacts is different than the magnitude of the temporal threshold of the determining of the difference between the touchdown times of the first and third contacts.

12. The apparatus of claim 11, wherein the magnitude of the temporal threshold increases as the number of touchdowns between the touchdowns of the contacts being examined increases.

13. The apparatus of claim 8, wherein the plurality of contacts includes a fourth contact, the touchdown time of the fourth contact being between the touchdown times of the first and second contacts, evaluating the touchdown times further includes determining that the difference between the touchdown times of the first and fourth contacts is less than the predetermined temporal threshold, and the synchronized set further includes the fourth contact.

14. A non-transitory computer-readable storage medium storing computer-executable instructions executable to perform a method of input of a computing system including a touch sensing surface, the method comprising:

detecting a plurality of contacts, including a first contact, a second contact, and a third contact, touching down on or near the surface, the detecting including determining a touchdown time of each of the contacts;

evaluating the touchdown times based on a predetermined temporal threshold, the evaluating including determining that the difference between the touchdown times of the first and second contacts is less than the predetermined temporal threshold and determining that the difference between the touchdown times of the first and third contacts is greater than the predetermined temporal threshold;

determining, based on the evaluation of the touchdown times, a synchronized set of the contacts concurrently touching the touch sensing surface, wherein the synchronized set includes the first and second contacts and excludes the third contact; and generating a first input of the computing system based on the synchronized set.

15. The non-transitory computer-readable storage medium of claim 14, wherein the contacts comprise a plurality of fingers and a portion of a hand other than a finger.

16. The non-transitory computer-readable storage medium of claim 14, wherein evaluating the touchdown times comprises determining the difference between the touchdown times of the first and second contacts at time t0; and determining the difference between the touchdown times of the first and third contacts at time t1.

17. The non-transitory computer-readable storage medium of claim 14, wherein the touchdown time of the second contact is between the touchdown times of the first and third contacts.

18. The non-transitory computer-readable storage medium of claim 17, wherein a magnitude of the temporal threshold is based on a number of touchdowns between the touchdowns of the contacts being evaluated, such that the magnitude of the temporal threshold of the determining of the difference between the touchdown times of the first and second contacts is different than the magnitude of the temporal threshold of the determining of the difference between the touchdown times of the first and third contacts.

19. The non-transitory computer-readable storage medium of claim 18, wherein the magnitude of the temporal threshold increases as the number of touchdowns between the touchdowns of the contacts being examined increases.

20. The non-transitory computer-readable storage medium of claim 14, wherein the plurality of contacts includes a fourth contact, the touchdown time of the fourth contact being between the touchdown times of the first and second contacts, evaluating the touchdown times further includes determining that the difference between the touchdown times of the first and fourth contacts is less than the predetermined temporal threshold, and the synchronized set further includes the fourth contact.

\* \* \* \* \*